United States Patent
Hou et al.

(10) Patent No.: US 7,856,330 B2
(45) Date of Patent: *Dec. 21, 2010

(54) MEASURING APPARATUS, TESTING APPARATUS, AND ELECTRONIC DEVICE

(75) Inventors: Harry Hou, Santa Clara, CA (US); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 1011 days.

This patent is subject to a terminal disclaimer.

(21) Appl. No.: 11/623,101

(22) Filed: Jan. 15, 2007

(65) Prior Publication Data

US 2008/0040060 A1    Feb. 14, 2008

Related U.S. Application Data

(63) Continuation-in-part of application No. 11/362,536, filed on Feb. 27, 2006, now Pat. No. 7,398,169, and a continuation-in-part of application No. 11/550,811, filed on Oct. 19, 2006, now Pat. No. 7,421,355.

(51) Int. Cl.
*G06F 19/00* (2006.01)

(52) U.S. Cl. ............... 702/70; 702/66; 702/69; 702/82; 324/532; 324/736; 324/158.1

(58) Field of Classification Search ............ 702/69, 702/70, 71, 66, 82; 324/532, 736, 158.1
See application file for complete search history.

(56) References Cited

U.S. PATENT DOCUMENTS

| | | | |
|---|---|---|---|
| 5,260,670 A | 11/1993 | Ainsworth et al. | |
| 2003/0018442 A1 | 1/2003 | Yamaguchi et al. | |
| 2005/0149784 A1 | 7/2005 | Ishida et al. | |
| 2005/0179576 A1 | 8/2005 | Tarui et al. | |

FOREIGN PATENT DOCUMENTS

| | | |
|---|---|---|
| DE | 10083886 T1 | 4/2002 |
| DE | 10393446 T5 | 9/2005 |
| EP | 1 508 813 A1 | 2/2005 |
| JP | 10-288653 | 10/1998 |
| JP | 2001-289892 | 10/2001 |

(Continued)

OTHER PUBLICATIONS

*Jitter Measurements for CLK Generators or Synthesizers*, Maxim Integrated Products, Sep. 26, 2003, pp. 1-4.

(Continued)

*Primary Examiner*—Drew A Dunn
*Assistant Examiner*—Hien X Vo
(74) *Attorney, Agent, or Firm*—Sterne, Kessler, Goldstein & Fox P.L.L.C.

(57) ABSTRACT

A measuring apparatus measures a signal-under-test having a signal level that changes at predetermined bit time intervals. A strobe timing generator sequentially generates strobes at even time intervals. A level comparator detects a level of the signal at a timing at which each strobe is sequentially provided. A capture memory stores a signal level output from the comparator. A signal processor calculates a measurement of the signal based on a data series including data taken at even time intervals, each larger than a bit time interval of the signal.

54 Claims, 45 Drawing Sheets

FOREIGN PATENT DOCUMENTS

| | | |
|---|---|---|
| JP | 2003 179142 A | 6/2003 |
| JP | 2004-093345 | 3/2004 |
| JP | 2004-125552 | 4/2004 |
| JP | 2005-189093 | 7/2005 |
| WO | WO 00/46606 | 8/2000 |

OTHER PUBLICATIONS

Anderson, Christopher R. et al. "Performance Analysis of a Time-Interleaved Sampling Architecture for a Software Defined Ultra Wideband Receiver." Mobile and Portable Radio Research Group. Virginia Polytechnic Institute and State University. Proceeding of the SDR 05 Technical Conference and Product Exposition. Copyright © 2005 SDR Forum. 13 pages.

German Patent & Trademark Office. File No. 11 2007 000 506.8-35. Applicant Name: Advantest Corporation. Office Action dated Feb. 26, 2010. English Language Translation. 17 pages.

German Patent & Trademark Office. File No. 11 2007 000 506.8-35. Applicant Name: Advantest Corporation. Office Action dated Feb. 26, 2010. German Language. 13 pages.

German Patent & Trademark Office. File No. 11 2007 000 507.6-35. Applicant Name: Advantest Corporation. Office Action dated Mar. 3, 2010. English Language Translation. 15 pages.

German Patent & Trademark Office. File No. 11 2007 000 507.6-35. Applicant Name: Advantest Corporation. Office Action dated Mar. 3, 2010. German Language. 13 pages.

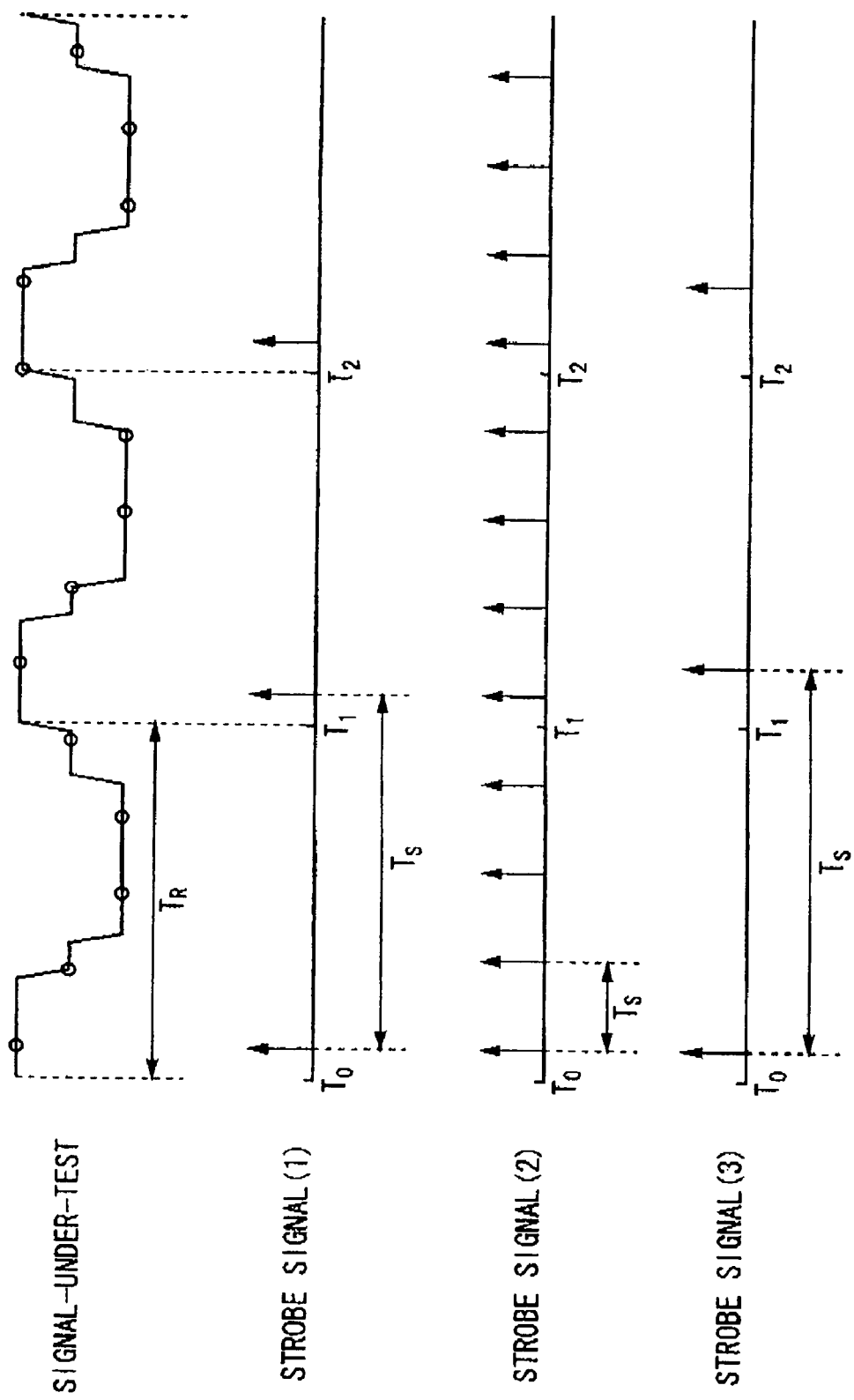

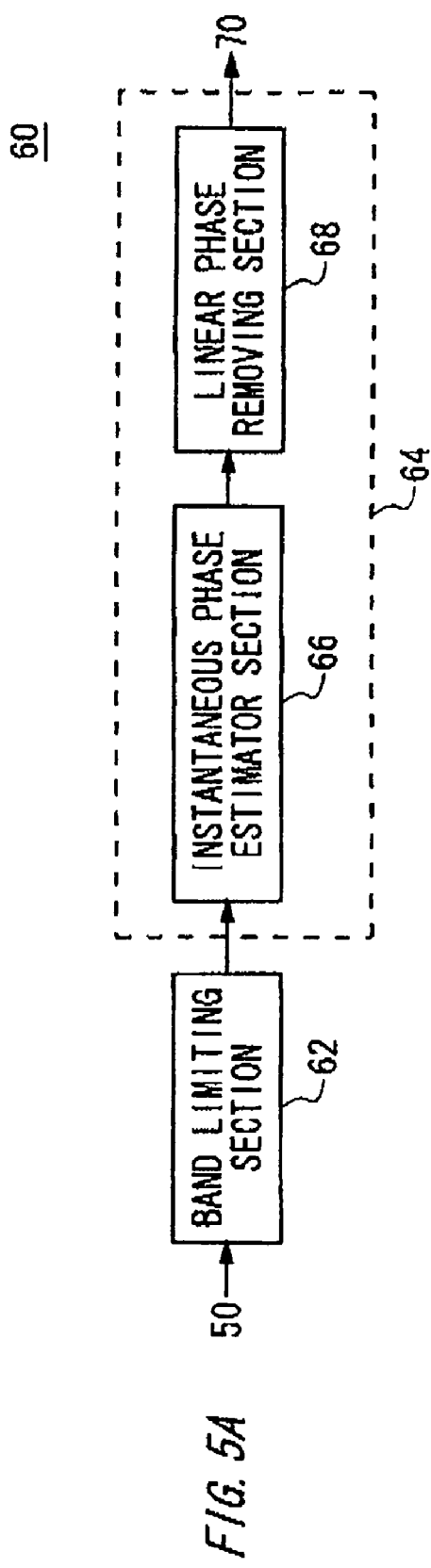
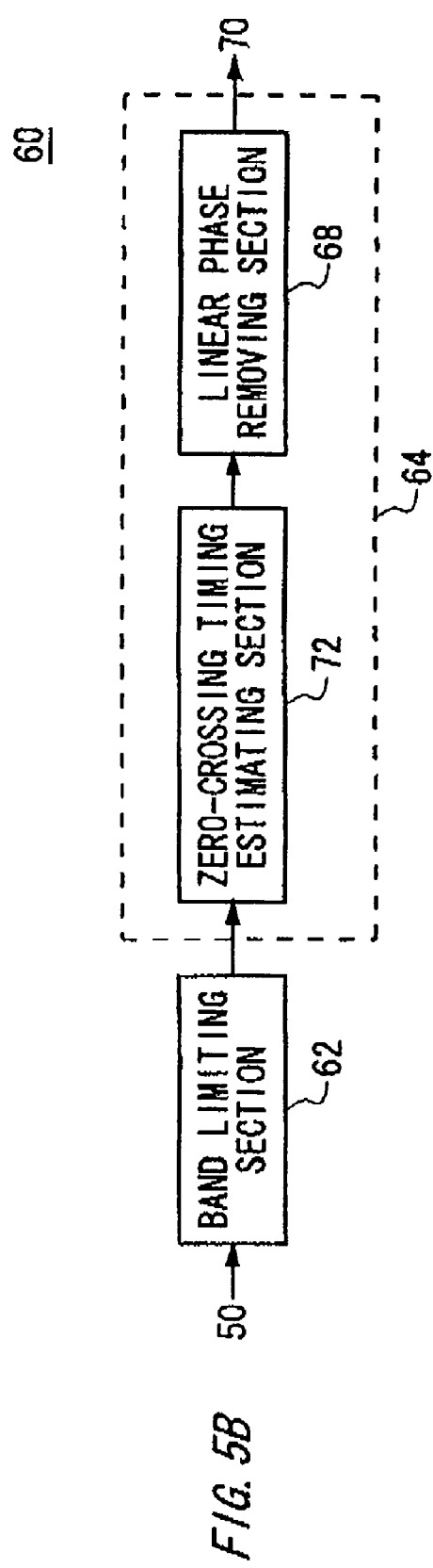

| Method | $\Delta\phi_{RMS}$ | | |
|---|---|---|---|
| | CONVENTIONAL METHOD | TEST APPARATUS100 | |
| | 8 bit | 1.6 bit | difference |
| Quiet | 63.6 ps | 65.8 ps | 3.3 % |
| Noisy | 61.4 ps | 63.8 ps | 3.9 % |
| Number of Events | 4526 | 4526 | 0 % |

FIG. 7

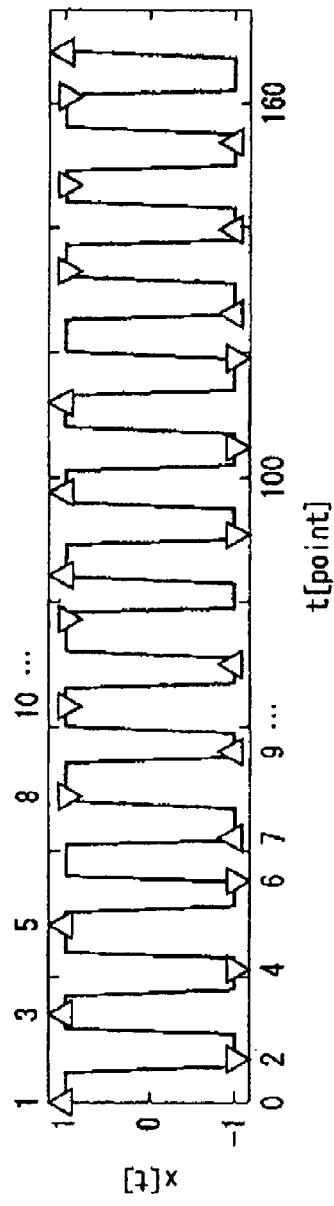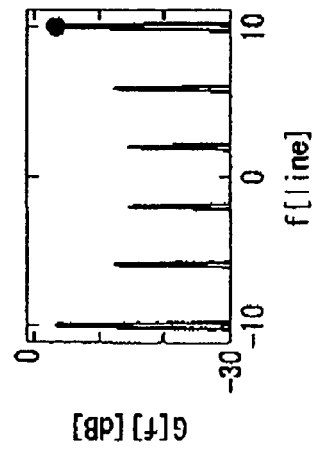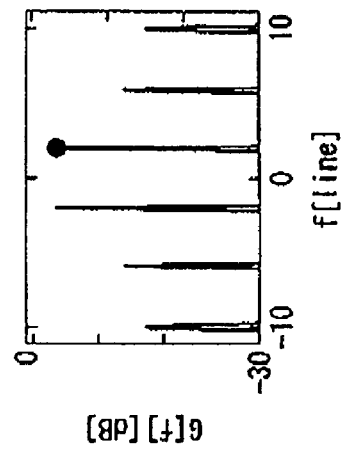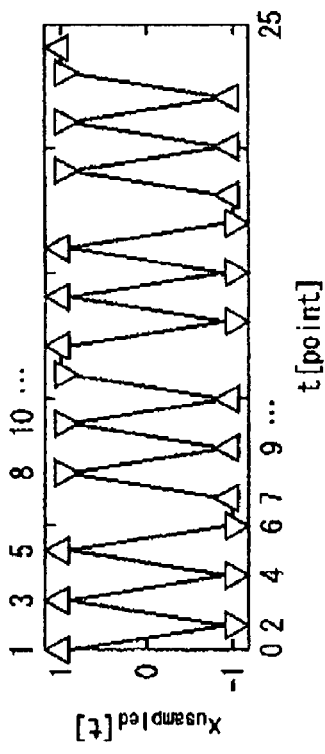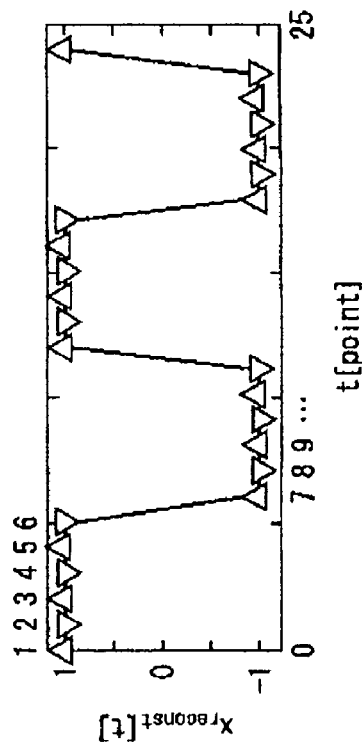
FIG. 33A
FIG. 33B
FIG. 33C

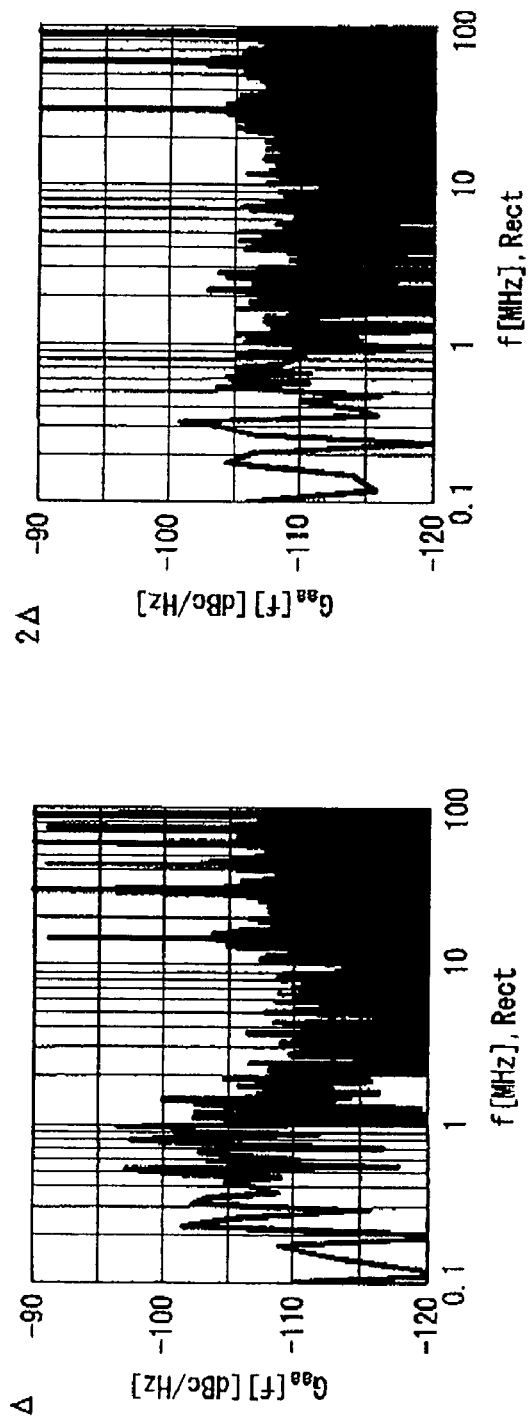
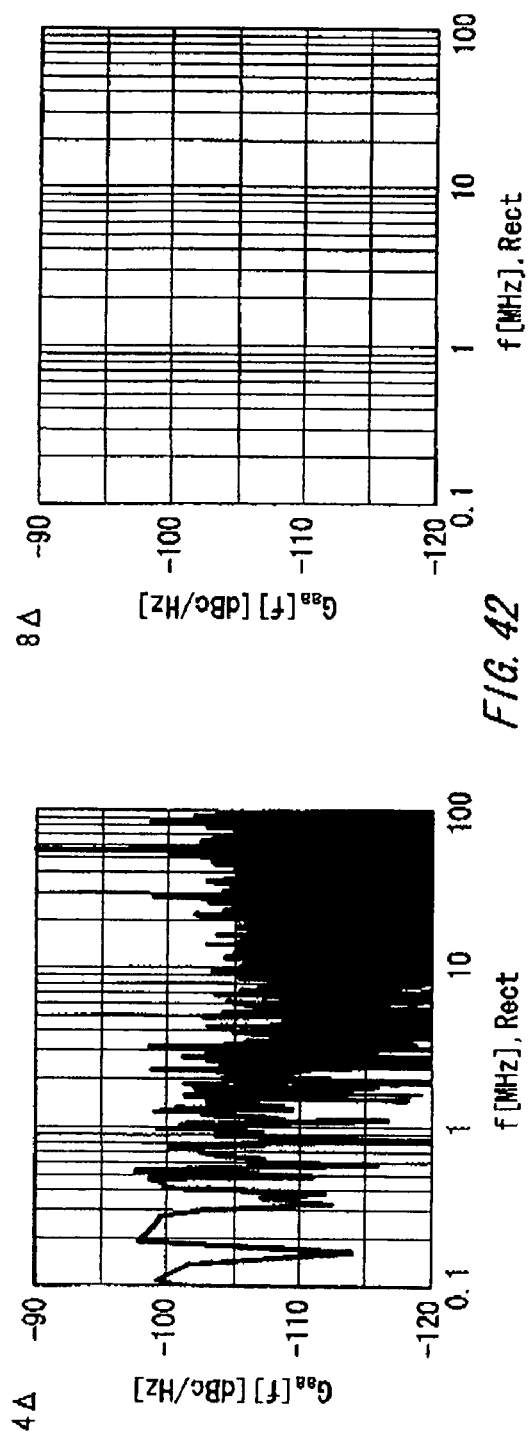
FIG. 42

MEASURING APPARATUS, TESTING APPARATUS, AND ELECTRONIC DEVICE

CROSS REFERENCE TO RELATED APPLICATION

This is a continuation in-part application of U.S. Ser. No. 11/362,536 filed on Feb. 27, 2006, now U.S. Pat. No. 7,398,169 and U.S. Ser. No. 11/550,811 filed on Oct. 19, 2006 now U.S. Pat. No. 7,421,355, the contents of which are incorporated herein by reference.

BACKGROUND

1. Field of the Invention

The present invention relates to a measuring apparatus that measuring a signal-under-test, a testing apparatus for testing a device under test and an electronic device. More specifically, the invention relates to a measuring apparatus, a testing apparatus and an electronic device for measuring jitter in a signal-under-test outputted out of the device under test.

2. Related Art

There has been known a test for measuring jitter in a signal-under-test outputted out of an electronic device such as a semiconductor circuit as an item for testing the electronic device. For example, jitter of such signal-under-test is measured by a time interval analyzer, an oscilloscope or the like by inputting the signal-under-test thereto. The time interval analyzer or the like allows such jitter to be calculated by measuring phase errors of edges in the signal-under-test for example.

Still more, there has been known a functional test for judging whether a pattern of a signal-under-test outputted out of an electronic device is corresponding to a pattern of an expected values as an item for testing the electronic device. In this test, a testing apparatus detects a data pattern of the signal-under-test by comparing a voltage values of the signal-under-test outputted out of the electronic device with threshold voltage when a predetermined test pattern is inputted to the electronic device. Then, it judges whether or not the data pattern coincides with the pattern of the expected values.

It has been thus necessary to prepare the apparatus for measuring jitter and the apparatus for testing functionality of the device in order to carry out the jitter test in addition to functional tests as described above. Therefore, it has been costly to carry out the jitter test.

Still more, the apparatus of functional test compares the voltage value of the signal-under-test with the threshold voltage at preset timing. Therefore, it can detect the edge position or timing, over which the data pattern of the signal-under-test transits bit by bit, by shifting the comparison timing. It is then conceivable to be able to measure jitter by utilizing this function, i.e. by using the apparatus for performing functional testing.

However, the conventional apparatus for functional testing sets and uses sampling timing s based on test rate synchronized with the operating period of the signal-under-test. Therefore, for each test rate it is necessary to set phase of the sampling timing in order to gradually shift the relative phase of the sampling timing with respect to the signal-under-test within each test rate. It has been thus necessary to carry out the cumbersome timing setting in order to carry out the jitter test, and it has taken a significantly long time for testing. Still more, its measuring accuracy is insufficient and is not suitable for tests because its timing is shifted in the relative phase fashion. An aspect of the present invention solves a problem for selecting sampling timings at which an output signal from the device under test is sampled by using the apparatus for functional testing in order to realize both efficient and accurate measurements of jitter in the signal-under-test.

Additionally, it has not been known that how to process the measurement data in order to efficiently and accurately obtain the jitter characteristic or another measure in the signal-under-test from the measurement data, which retain the same jitter information as that of the signal-under-test as the result of solving the above described problem. Thus, an aspect of the present invention provides solution to a problem that how to efficiently and accurately obtain the jitter characteristic of the signal-under-test from the measurement data of the signal-under-test.

When jitter is measured by using an oscilloscope or the like, the signal-under-test to be inputted therein contains amplitude noise component in addition to the timing noise component. Therefore, it has been difficult to accurately measure only the timing noise of the signal-under-test. An aspect of the present invention demonstrates that the timing noise of the signal-under-test can be accurately measured by eliminating an effect of the amplitude noise component in the signal-under-test by using a voltage comparator provided in the apparatus for functional testing. Additionally, an aspect of the present invention demonstrates that a state of the signal-under-test (i.e. a state indicating whether the logical value of the signal-under-test is an expected logical value or not) can be sampled by using the voltage comparator.

Moreover, an aspect of the present invention demonstrates that many kinds of various measurements can be performed by using the apparatus for functional testing, which has a number of measurement pins. For example, it demonstrates that a deterministic skew and random skew in a plurality of signal-under-tests can be efficiently and accurately measured.

Here, the related art have been disclosed, for example, as in
1) U.S. Patent Application Publication No. 2005/069031 and
2) U.S. Patent Application Publication No. 2005/0243950.

The document 1) discloses a technique for calculating the probability density function of jitter in the signal-under-test by means of undersampling.

However, the invention disclosed in the document 1) aims to detect only jitter for only one edge type, for example, described in paragraph 0131 as "jitter for only one EDGE type is measured and the other edge is ignored." Accordingly, it has a disadvantage that jitter for the other edge type can not be measured. Additionally, since a method of measuring cumulative distribution function is employed, it is necessary to perform a pattern-matching and also necessary to implement a state machine. For example, in order to detect 01 bit pattern (leading edge), it is necessary to implement the state machine being capable of comparing two bit patterns. Moreover, the invention disclosed in the document 1) can not measure jitter in the time domain and frequency domain.

For example, in order to measure jitter for the leading edge, it is necessary to check bits adjacent to each other to detect "01" pattern as described in paragraph 0131 of the document 1). Firstly, a beat frequency signal Q is fed into a shift register having 2J-bit width in a general purpose circuit shown in FIG. 9 of the document 1) in accordance with sampling frequency fs. At this time, when the bit pattern is "01", "1" is fed into the shift register as described in paragraph 0076 of the document 1).

Next, a state machine 110 shown in FIG. 9 and FIG. 8B of the document 1) continuously counts the bit number of "1" (corresponding to "01") which are continuously inputted (=state 2). When a predetermined number of "1" bits are continuously inputted, the carry Cout of a counter 132 is outputted to a counter 134 and a middle of rising edge state 3 is recognized. Further, when the counter 134 outputs the carry Cout to a counter 136, the discrete value of the counter 136 at a bin position in a cumulative distribution function CDF is increased. When the value of the counter 132 is equal to the value of the counter 136, the discrete value of a counter 138 at the bin position in the cumulative distribution function CDF is added by 1. Thus, the cumulative distribution function CDF is measured as described in paragraph 0102 of the document 1).

As described above, the invention disclosed in the document 1) is not suitable for a testing apparatus for testing an electronic device. That is, a method being capable of measuring jitter without limiting the edge type is desired for a testing apparatus (For example, jitter appears as a plurality of impulses being adjacent to each other in FIG. 34C of the present specification.

Moreover, it is desired that jitter can be measured in both the time domain and frequency domain in addition to the probability density function (PDF). Finally, in order to enable to perform a jitter test without changing the configuration of the current testing apparatus, it is necessary to measure by comparing a 1 bit of sample value with a 1 bit of expected value without using a pattern-matching which requires such as the state machine as mentioned above.

Moreover, it is described that jitter can be analyzed by using a memory and a computer for the testing apparatus in paragraph 0129. However, how to analyze jitter is not disclosed therein.

In the document 2), an analyzing method of the spectrum of an error signal by using a critical sampling in a bit error rate measurement system is disclosed. As shown in FIG. 2 of the document 2), for each bit time interval a single sample point is sampled. That is, 2 points per period is sampled, so that the sampling is referred to as the critical sampling.

According to the document 2), it insists on disclose and providing of the method for measuring the jitter spectrum. However, it has an essential defect that in order to calibrate the measurement value with the jitter value, it requires the phase modulation of clock signal using the calibration signal. This is because of critical sampling: It is impossible to measure the signal level accurately using critical sampling, especially the signal level of the clock, which is a critically important measure for estimating a jitter value being defined as the signal-to-noise (or jitter in this case) ratio.

By the way, an error signal is the result of comparing the expected data with the input logical data. Therefore, in order to efficiently observe the error signal by the technique disclosed in the document 2), the time offset of a sampling timing has to be adjusted such that the bit value transition can be critically sampled at the adjusted timing point.

Accordingly, it is an advantage of the invention to provide a measuring apparatus, a testing apparatus, and an electronic device which are capable of solving the above-mentioned problem. This advantage may be achieved through the combination of features described in independent claims of the invention Dependent claims thereof specify preferable embodiments of the invention.

SUMMARY

In order to solve the above-mentioned problems, a first aspect of the invention provides a measuring apparatus that measures a signal-under-test of which signal level is changed at a predetermined bit time interval. The measuring apparatus includes: a strobe timing generator that sequentially generates strobes arranged at substantially even time intervals; a level comparison section that detects the level of the signal-under-test at a timing at which each strobe is sequentially provided; a capture memory that stores therein the signal level outputted by the level comparison section; and a digital signal processing section that calculates a measurement result of the signal-under-test based on data series including data which have substantially even time intervals and each of which interval is larger than a bit time interval of the signal-under-test.

A second aspect of the present invention provides a measuring apparatus that measures a signal-under-test of which signal level is changed at a predetermined bit time interval. The measuring apparatus includes: a strobe timing generator that sequentially generates strobes which are arranged at substantially even time intervals and each of which interval is smaller than the bit time interval of the signal-under-test; a level comparison section that detects the level of the signal-under-test at a timing at which each strobe is sequentially provided; a capture memory that stores therein the signal level outputted by the level comparison section; and a digital signal processing section that calculates a measurement result of the signal-under-test based on data series stored in the capture memory.

A third aspect of the present invention provides a testing apparatus that tests a device under test. The testing apparatus includes: the measuring apparatus that measures a signal-under-test outputted by the device under test, which is described in the first aspect; and a judging section that judges the pass/fail result for the device under test based on the signal-under-test measured by the measuring apparatus.

A fourth aspect of the present invention provides a testing apparatus that tests a device under test. The testing apparatus includes: the measuring apparatus that measures a signal-under-test outputted by the device under test, which is described in the second aspect; and a judging section that judges the pass/fail result for the device under test based on the signal-under-test measured by the measuring apparatus.

A fifth aspect of the present invention provides an electronic device including an operating circuit that generates a signal-under-test and a measuring apparatus that measures the signal-under-test. The measuring apparatus includes: a strobe timing generator that sequentially generates strobes which are arranged at substantially even time intervals and each of which interval is larger than a bit time interval of the signal-under-test; a level comparison section that detects the level of the signal-under-test at a timing at which each strobe is sequentially provided; and a capture memory that stores therein the signal level outputted by the level comparison section.

A sixth aspect of the present invention provides an electronic device that outputs a signal-under-test. The electronic device includes an operating circuit that generates a signal-under-test and the measuring apparatus that measures the signal-under-test, which is described in the first aspect.

A seventh aspect of the present invention provides an electronic device that outputs a signal-under-test. The electronic device includes an operating circuit that generates a signal-under-test and the measuring apparatus that measures the signal-under-test, which is described in the second aspect.

An eighth aspect of the present invention provides a measuring apparatus that measures a signal-under-test of which signal level is changed at a predetermined bit time interval. The measuring apparatus includes: a strobe timing generator that sequentially generates strobes arranged at substantially even time intervals; a level comparison section that detects the level of the signal-under-test at a timing at which each strobe is sequentially provided; a logical comparison section that outputs a comparison result indicating whether each logical value detected by the level comparison section is corresponding to an expected logical value; a memory that stores therein the comparison result outputted by the logical comparison section; and a digital signal processing section that calculates a measurement result of the signal-under-test based on data series including data which have substantially even time intervals and each of which interval is larger than a bit time interval of the signal-under-test among the data stored in the memory.

A ninth aspect of the present invention provides an electronic device. The electronic device includes an operating circuit that generates a signal-under-test and the measuring apparatus that measures the signal-under-test, which is described in the eighth aspect.

A tenth aspect of the present invention provides a measuring apparatus that measures signal-under-test of which signal level is changed at a predetermined bit time interval. The measuring apparatus includes: a strobe timing generator that sequentially generates strobes arranged at substantially even time intervals; a level comparison section that detects the level of the signal-under-test at a timing at which each strobe is sequentially provided; a capture memory that stores therein the signal level outputted by the level comparison section; and a digital signal processing section that calculates a comparison result indicating whether each logical value of data series including data which have substantially even time intervals and each of which interval is larger than a bit time interval of the signal-under-test is corresponding to an expected logical value and calculates a measurement result of the signal-under-test based on the comparison result.

An tenth aspect of the present invention provides a testing apparatus that tests a device under test. The testing apparatus includes: the measuring apparatus that measures a signal-under-test outputted by the device under test, which is described in the ninth aspect; and a judging section that judges the pass/fail result for the device under test based on the signal-under-test measured by the measuring apparatus.

An eleventh aspect of the present invention provides an electronic device that outputs a signal-under-test. The electronic device includes an operating circuit that generates a signal-under-test and the measuring apparatus that measures the device under test, which is described in the ninth aspect.

It is noted that the summary of the invention described above does not necessarily describe all necessary features of the invention. The invention may also be a sub-combination of the features described above.

BRIEF DESCRIPTION OF TEE DRAWINGS

FIG. 2 is a chat showing exemplary strobe signals generated by a strobe timing generator.

FIGS. 5A and 5B are diagrams showing exemplary configurations of a digital signal processing section.

FIG. 7 is a table showing jitter values actually measured by the testing apparatus as compared to jitter values actually measured by a conventional jitter measuring method.

Figure 34A:
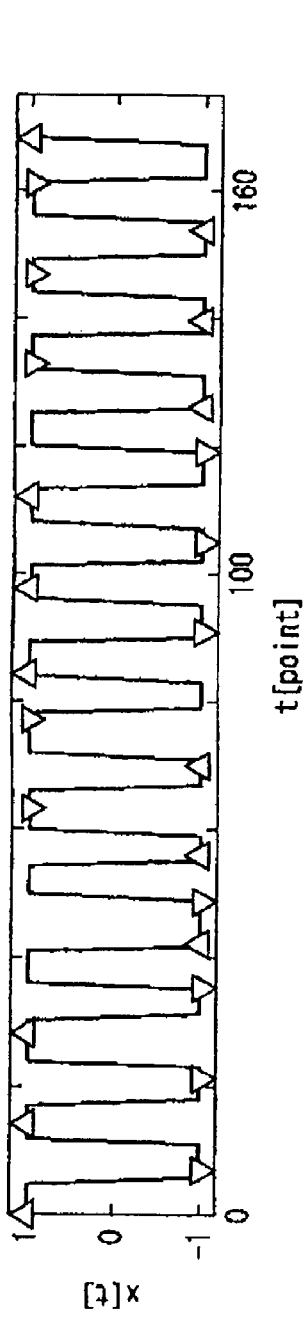
Figure 34B:
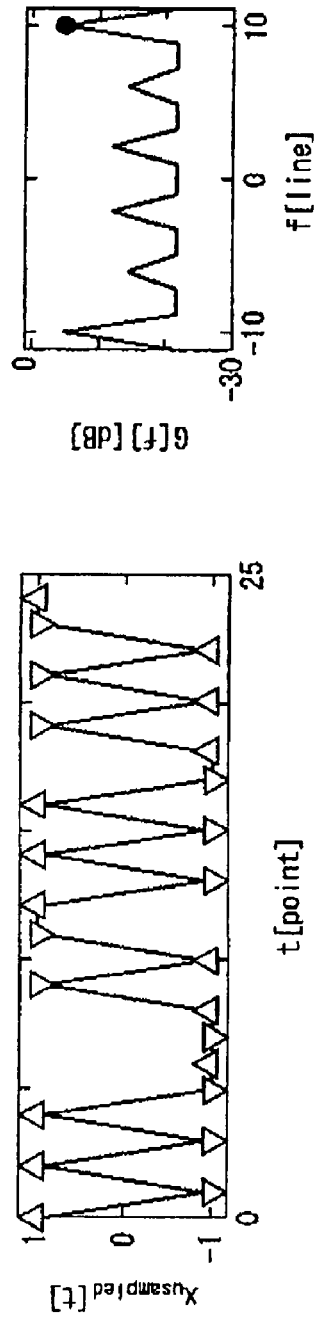
Figure 34C:
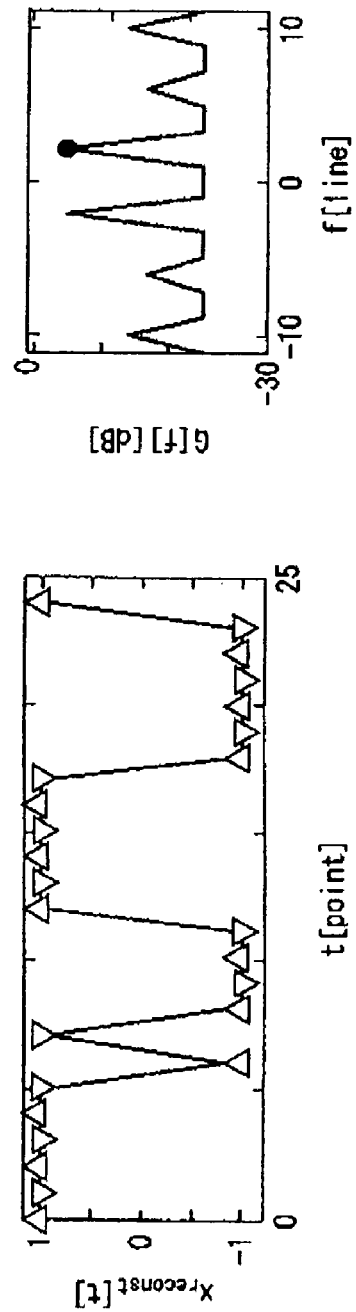
Figure 35:
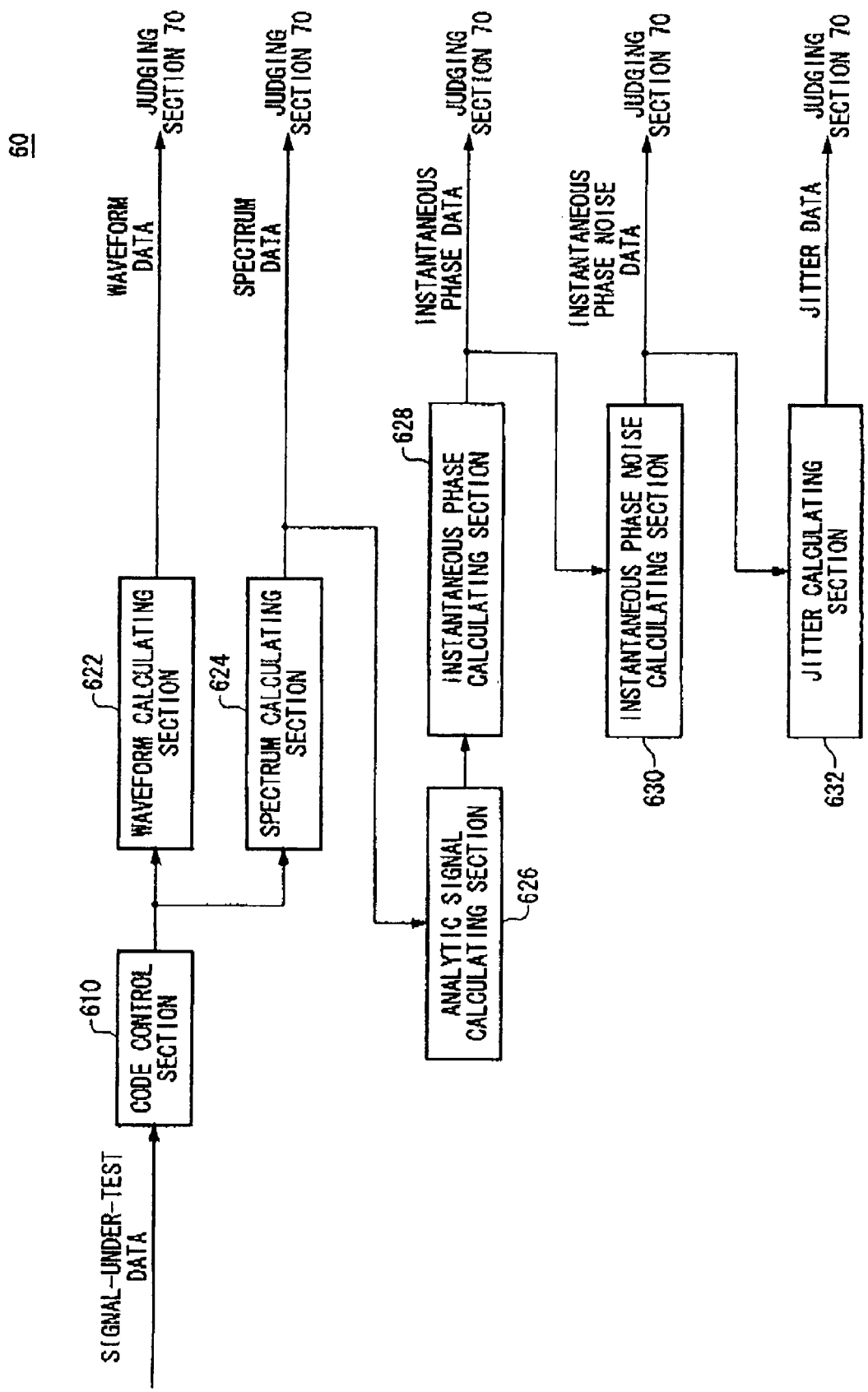
Figure 36:
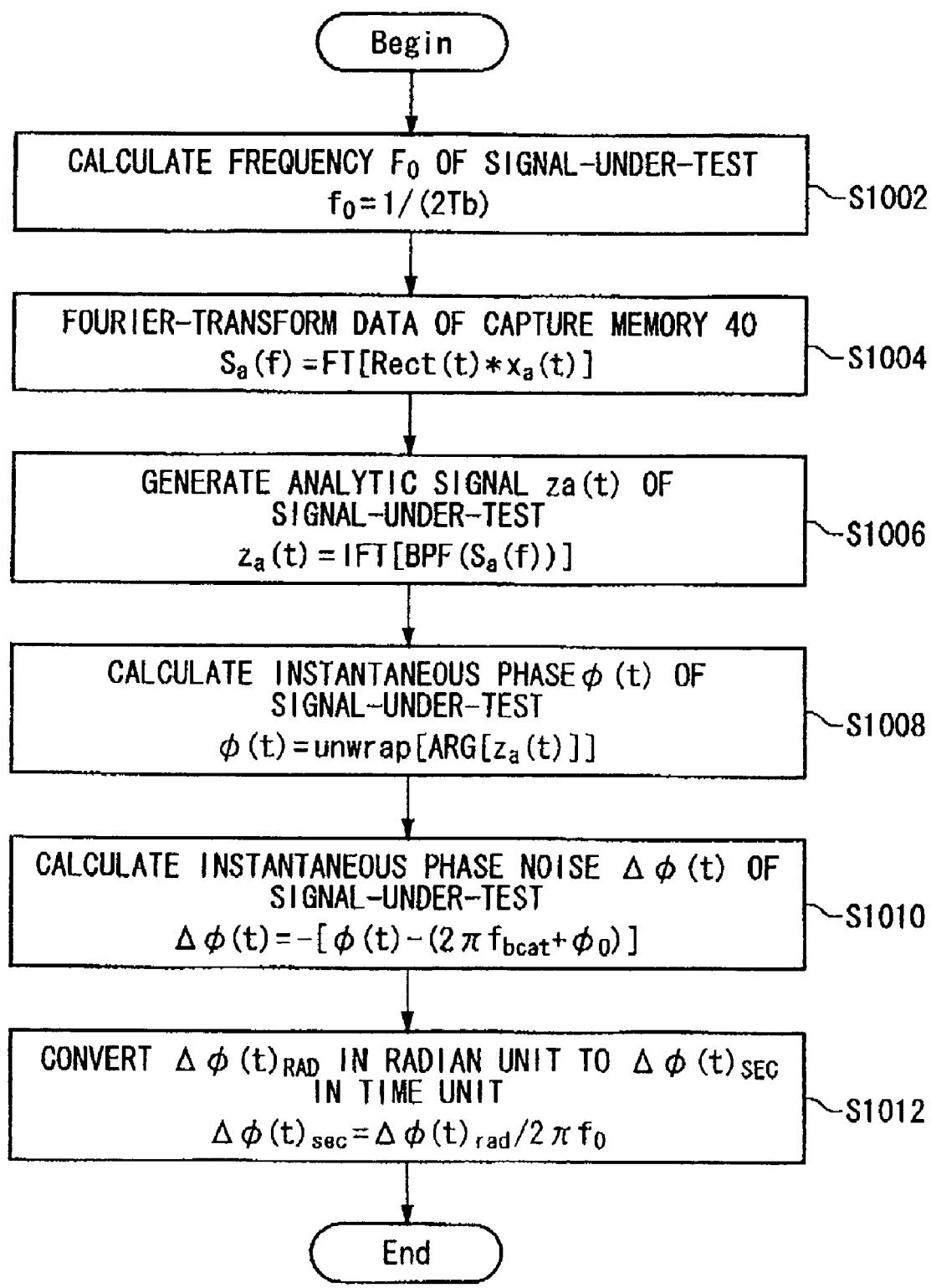
Figure 37:
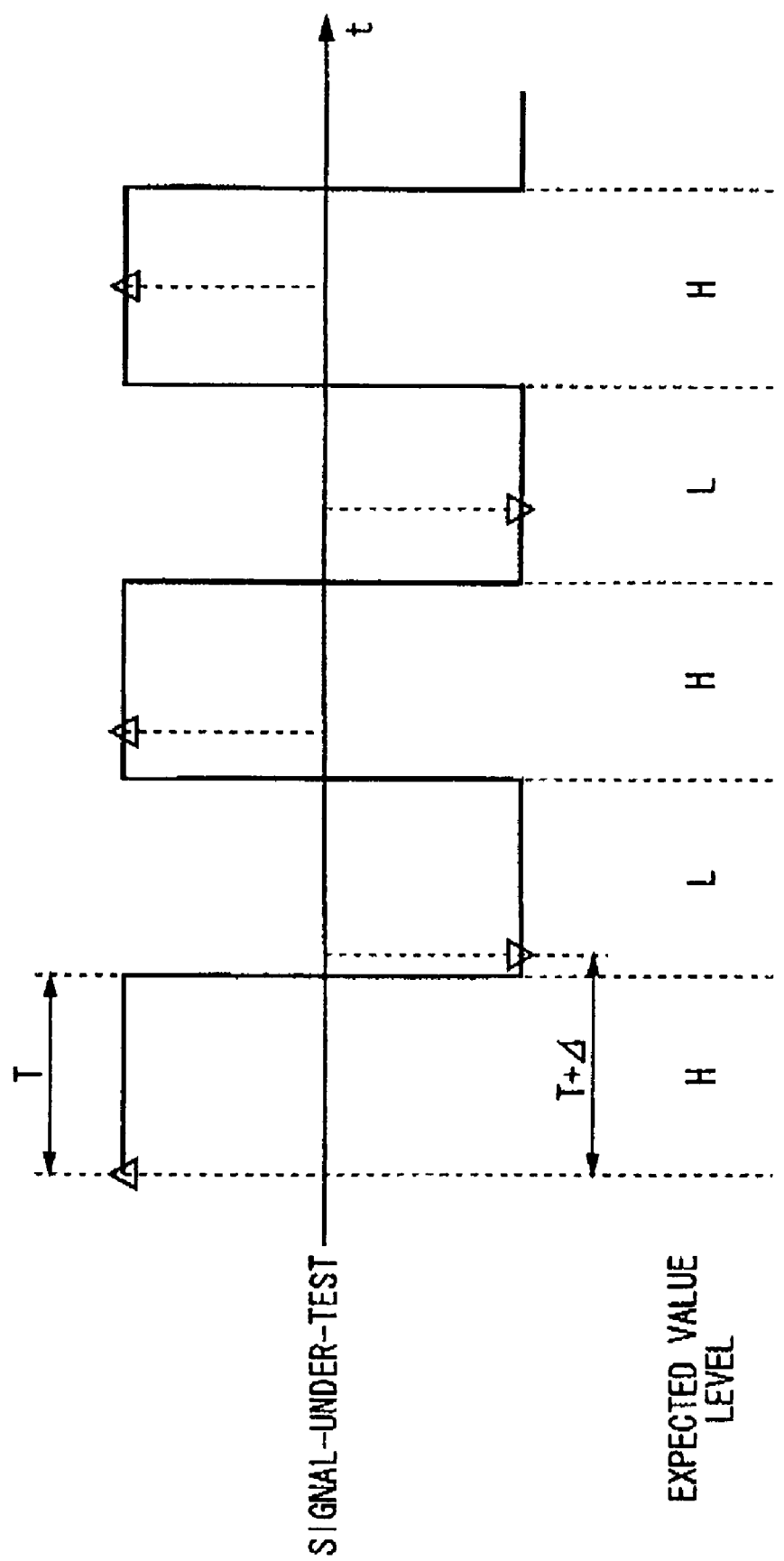
Figures 38A, 38B:
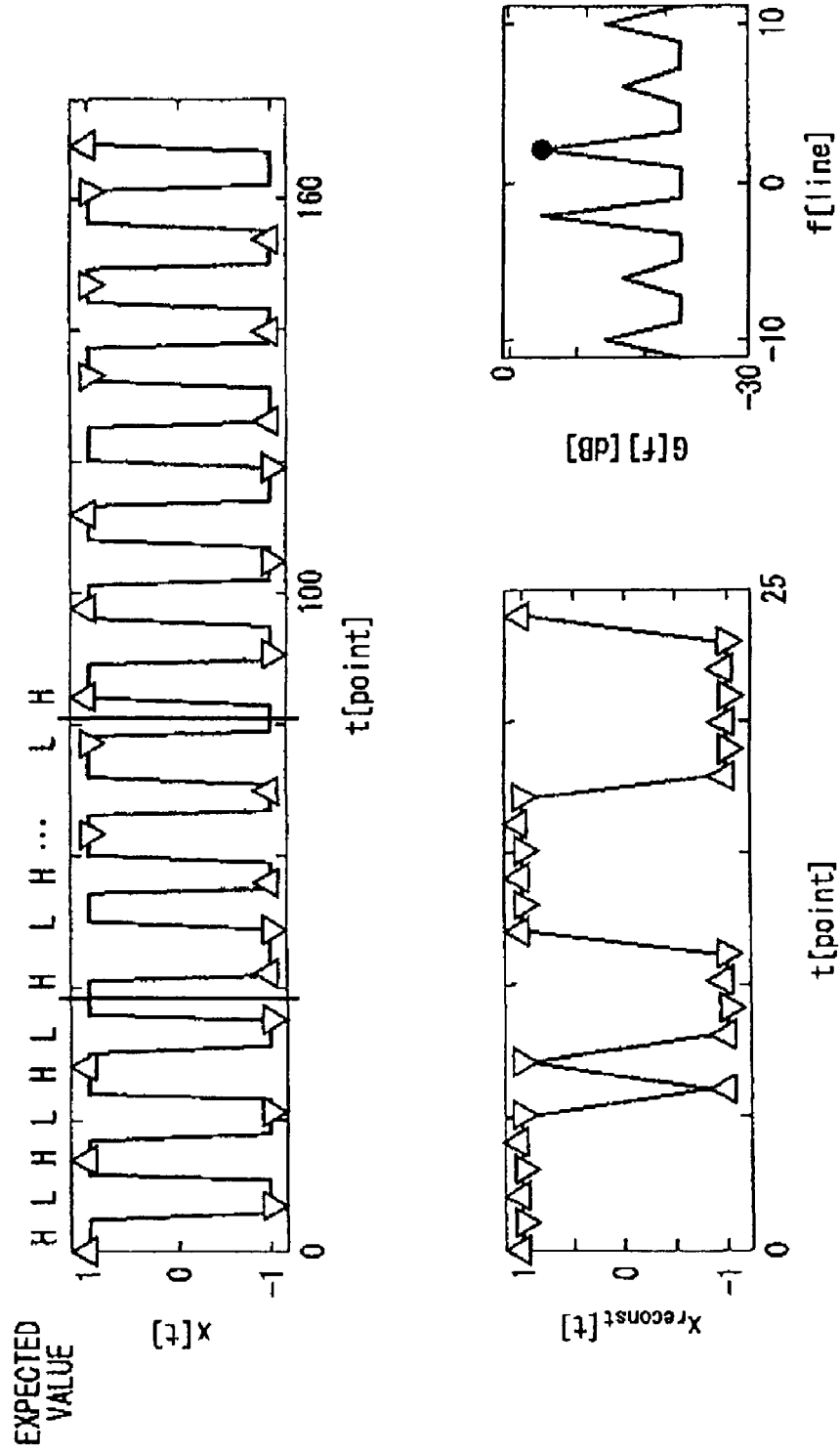
Figure 39:
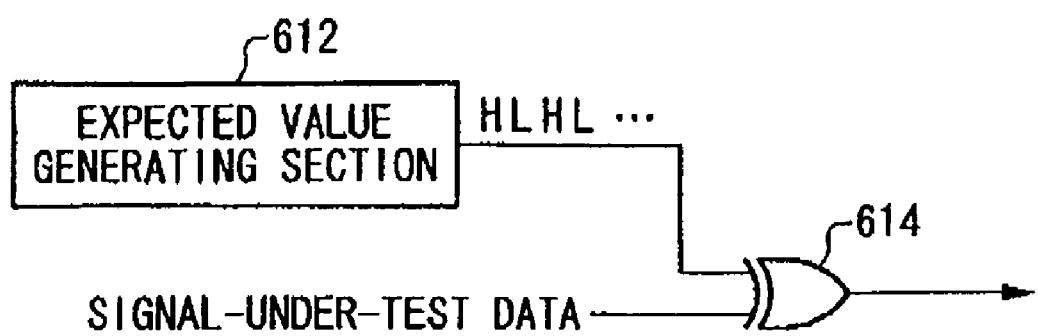
Figure 40:
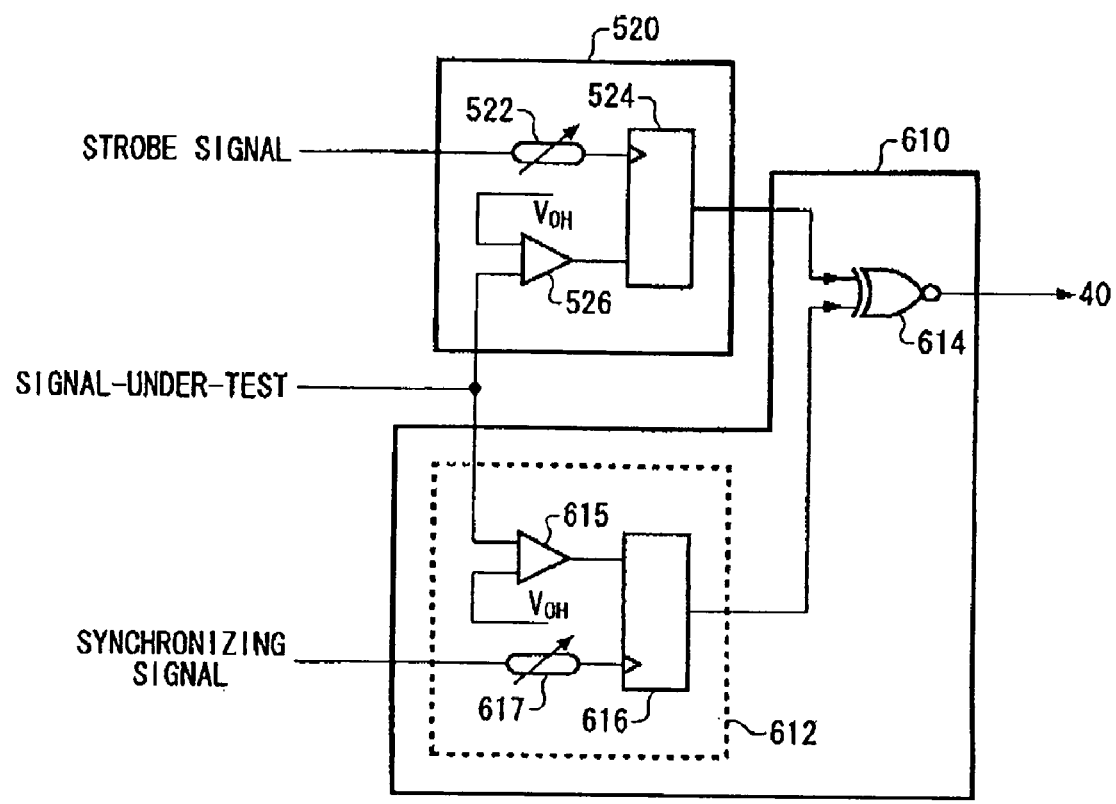
Figure 41:
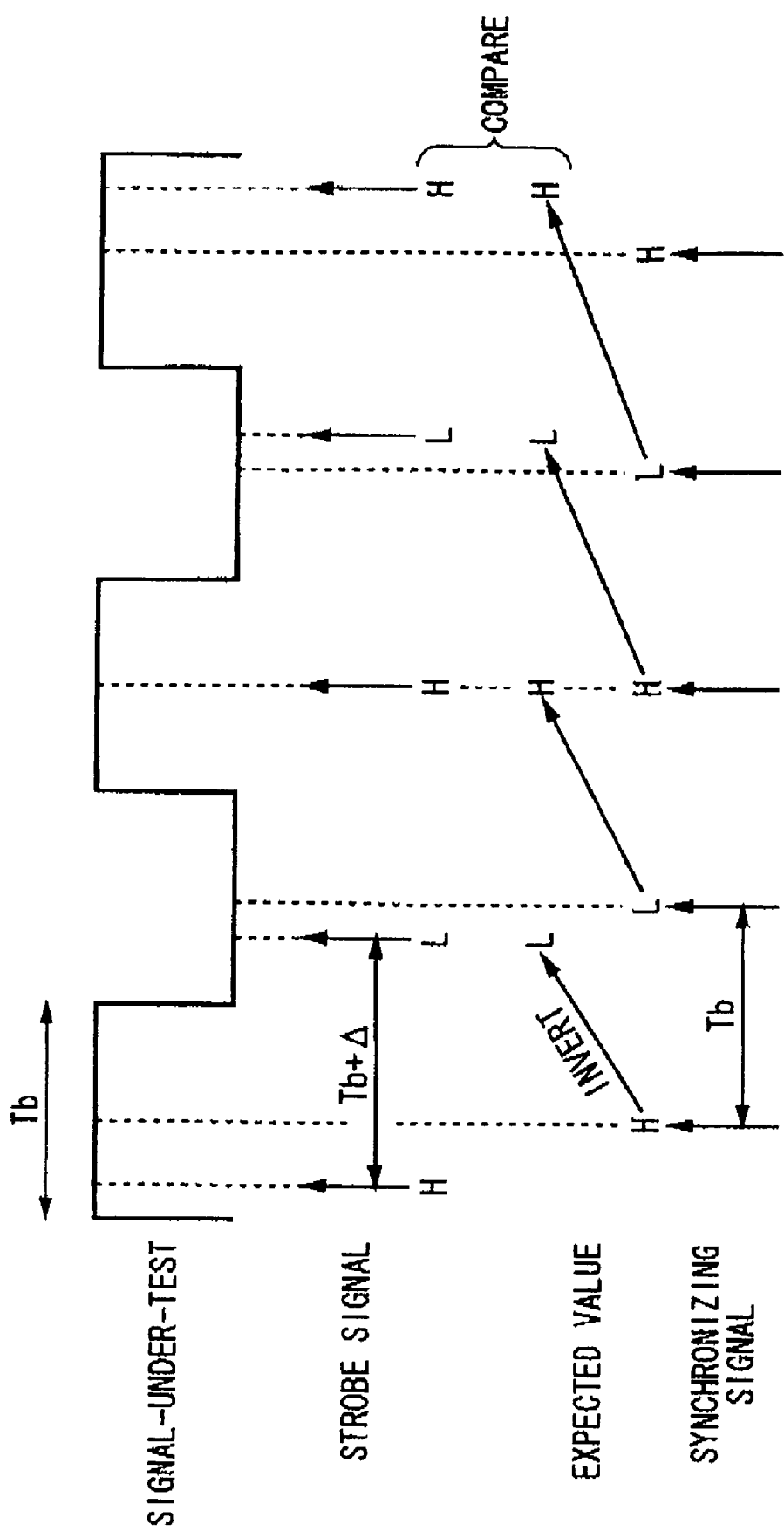
Figure 43A:
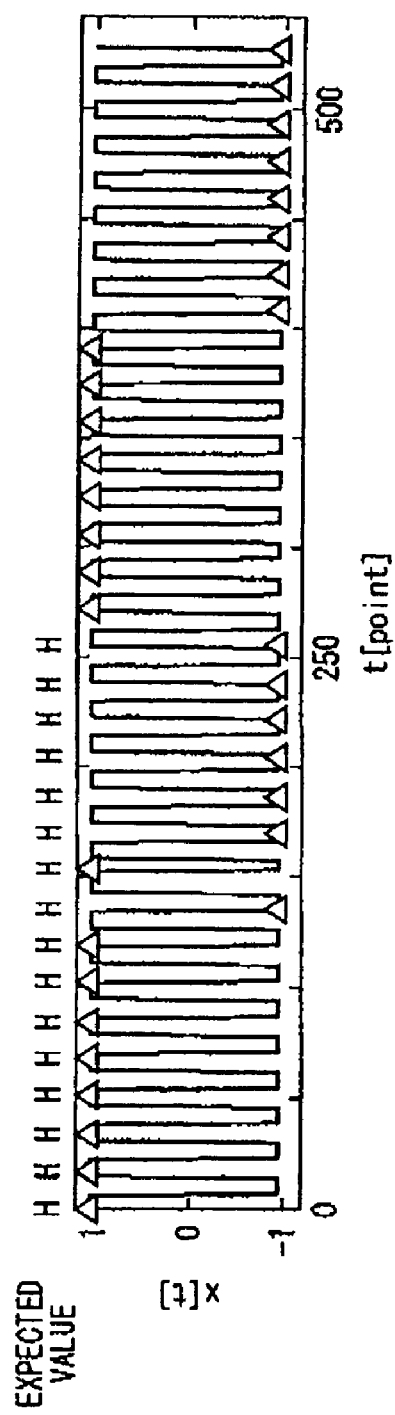
Figure 43B:
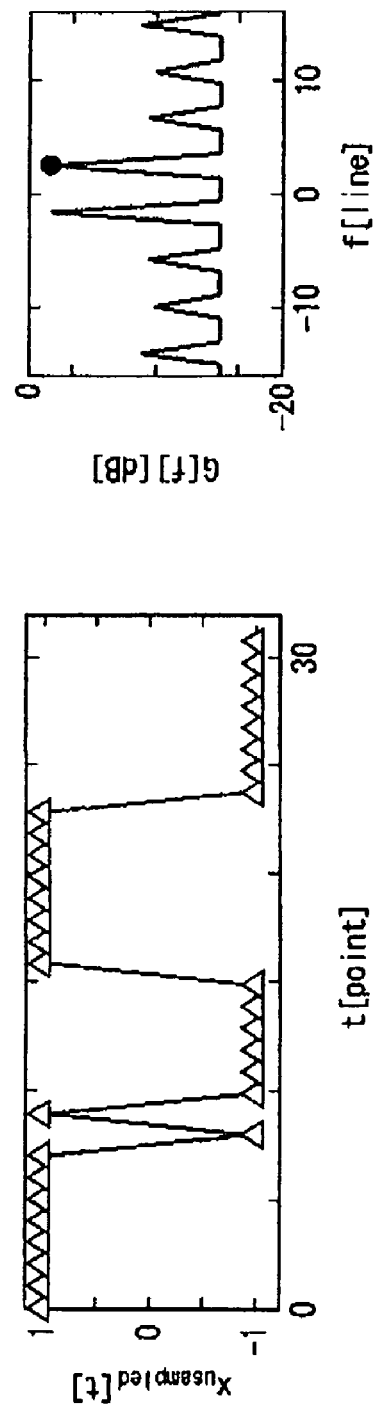
Figure 44:
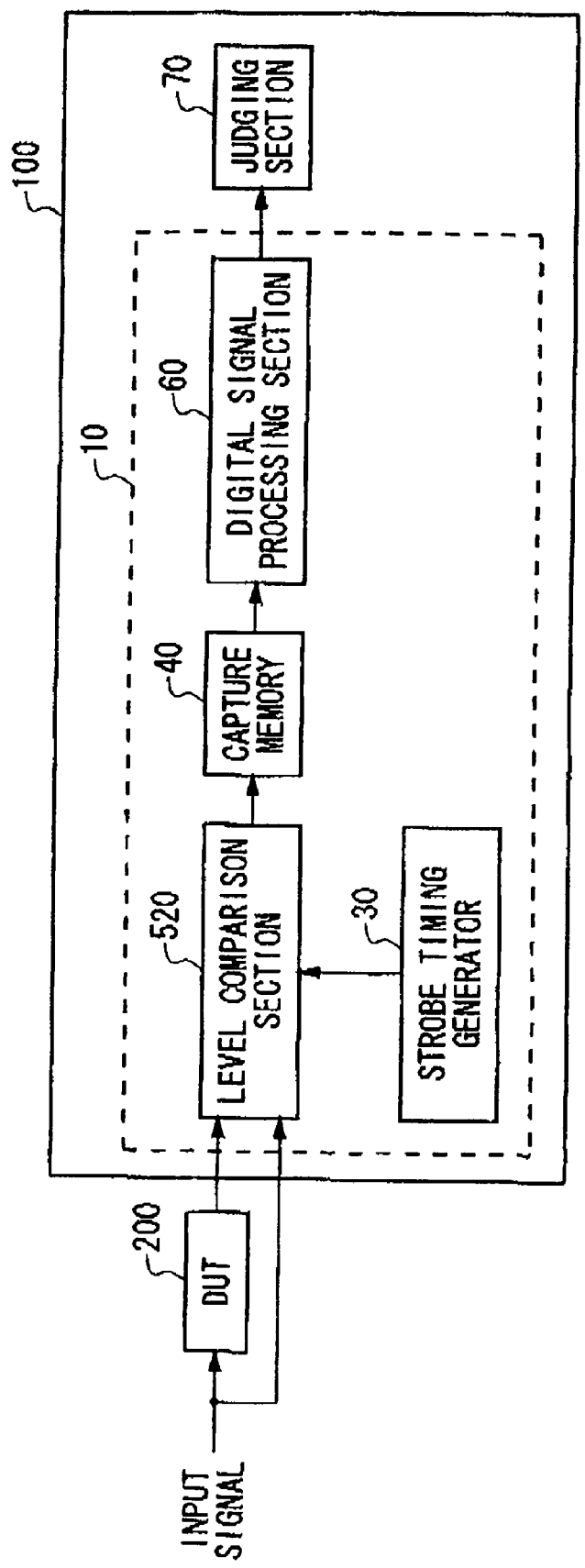

FIG. 33 shows an example of operation of the digital signal processing section 60: FIG. 33A shows an example of data series inputted to the digital signal processing section 60; FIGS. 33B and 33C show an example of data processing of the digital signal processing section 60, respectively, FIG. 34 is a diagram showing a case that a processing the same as the processing described in FIG. 33 is performed on the signal-under-test into which jitter is injected: FIG. 34A shows an example of data series inputted to the digital signal processing section 60 when the jitter is injected into the signal-under-test; and FIGS. 34B and 34C show an example of data processing by the digital signal processing section 60 when the jitter is injected into the signal-under-test;

FIG. 35 shows an example of configuration of the digital signal processing section 60;

FIG. 36 is a flowchart showing an operation from a the spectrum calculating section 624 to an instantaneous phase noise calculating section 630;

FIG. 37 shows an example of operation of the testing apparatus 100 when the testing apparatus 10 that measures the bit error rate of the signal-under-test;

FIG. 38 shows an example of series of comparison results obtained by the processing described in FIG. 37: FIG. 38A shows an example of data series of the signal-under-test; and FIG. 38B shows an example of series of comparison results;

FIG. 39 shows an example of configuration of a code control section 610 using the measuring apparatus 10 that measures the bit error rate of the signal-under-test;

FIG. 40 shows another configuration example of the level comparison section 520 and the code control section 610;

FIG. 41 is a timing chart showing an example of operation of the level comparison section 520 and the code control section 610;

FIG. 42 is an example of the spectrum of the signal-under-test measured by using the measuring apparatus 10 for the bit error rate;

FIG. 43 shows another example of operation of the testing apparatus 100 using the measuring apparatus 10 for the bit error rate of the signal-under-test: FIG. 43A shows an example of data series of the signal-under-test and expected values; and FIG. 43B shows an example of series of comparison results;

FIG. 44 shows another example of measuring apparatus 10; and

Figure 45:
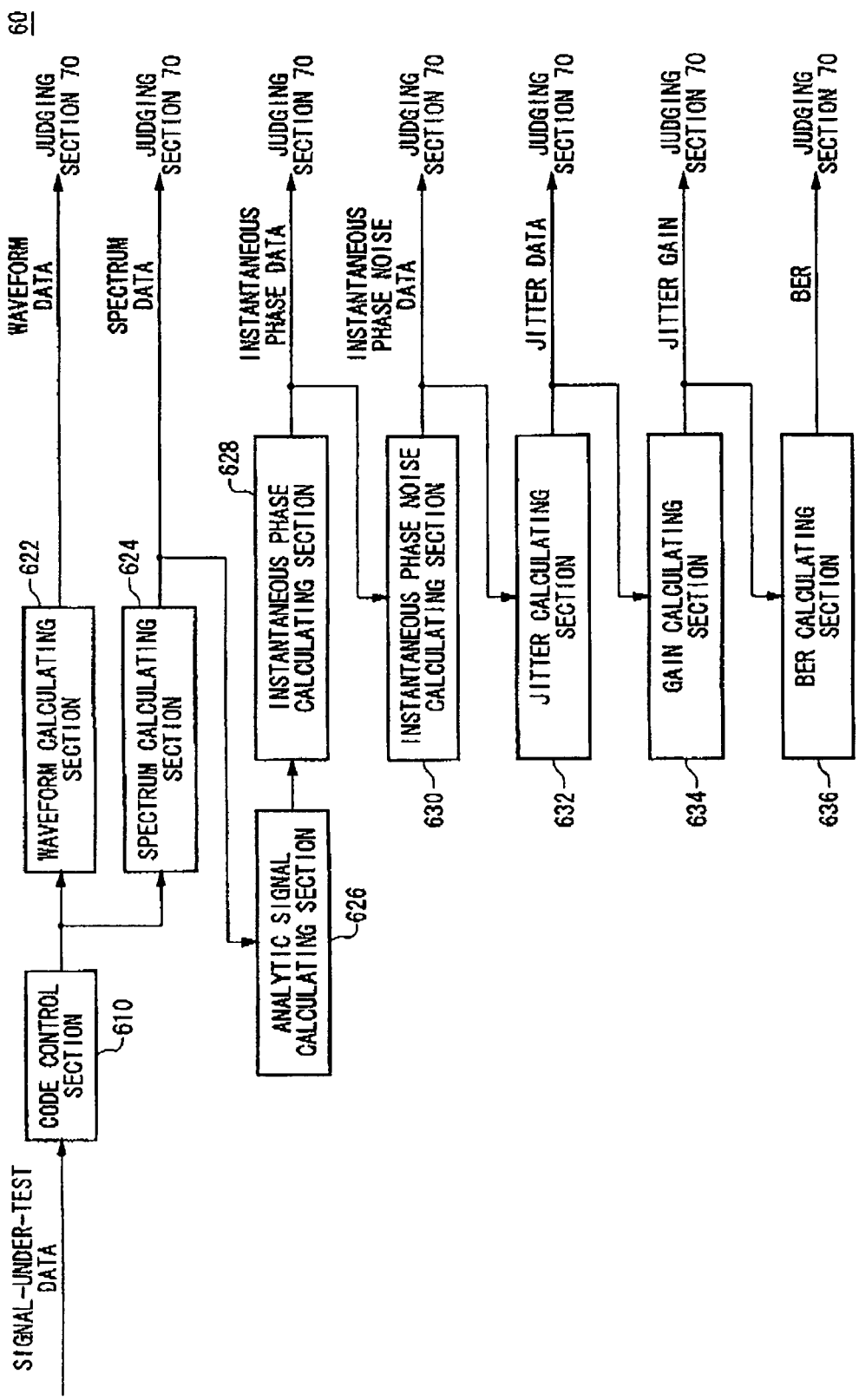

FIG. 45 shows another example of the digital signal processing section 60.

DESCRIPTION OF EXEMPLARY EMBODIMENTS

The invention will now be described based on preferred embodiments, which do not intend to limit the scope of the invention, but exemplify the invention. AU of the features and the combinations thereof described in the embodiments are not necessarily essential to the invention.

Figure 1:
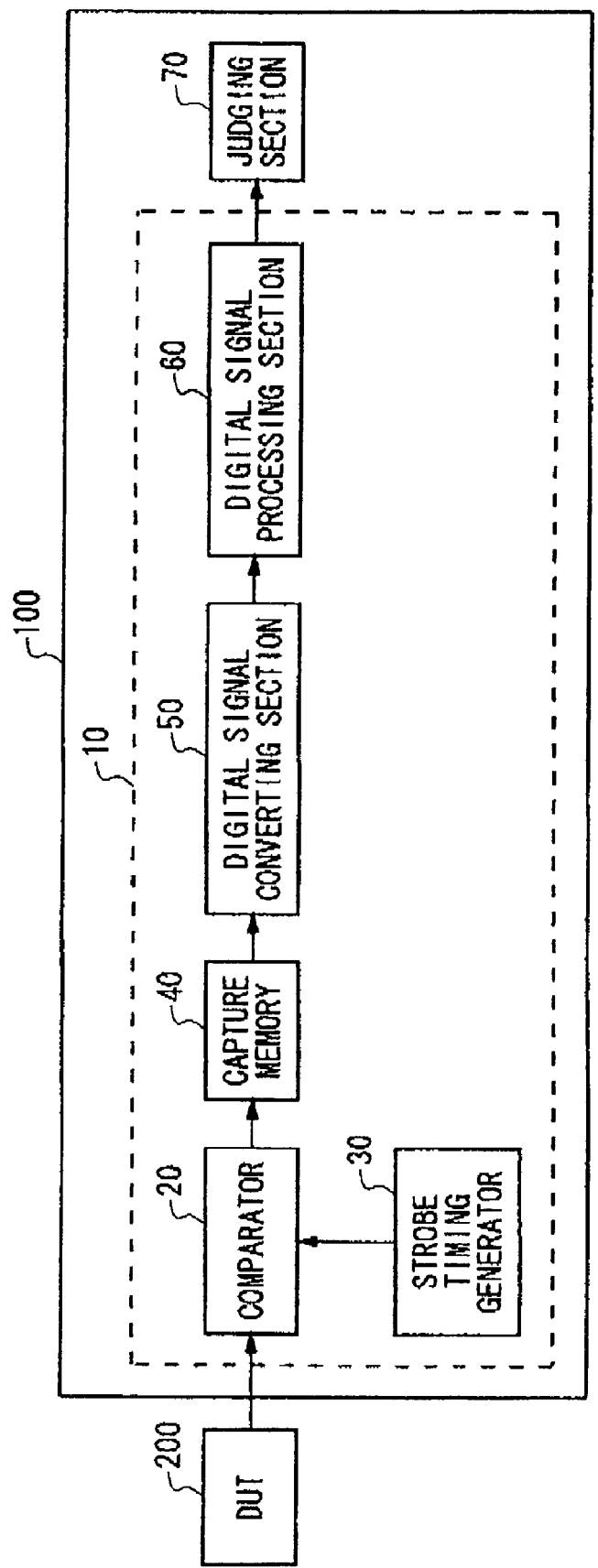
FIG. 1 is a diagram showing one exemplary configuration of a testing apparatus according one embodiment of the invention.

FIG. 1 shows an example of configuration of a testing apparatus 100 according to an embodiment of the present invention. The testing apparatus 100 tests a device under test 200 such as a semiconductor circuit and includes a measuring apparatus 10 and a judging section 70. The measuring apparatus 10 measures jitter in a signal-under-test outputted from the device under test 200. Here, the signal-under-test has a predetermined period. For example, the signal-under-test may be a clock signal and also may be a data signal. Additionally, the measuring apparatus 10 may measure timing jitter of the signal-under-test.

The judging section 70 judges the pass/fail result for the device under test based on the jitter value in the signal-under-test measured by the measuring apparatus 10. For example, the judging section 70 may judge the pass/fail result for the device under test 200 based on whether the value of timing jitter in the signal-under-test is more than a predetermined threshold value. The threshold value may be defined by the specifications of the required device under test 200.

The measuring apparatus 10 includes a comparator 20, a strobe timing generator 30, a capture memory 40, a digital signal converting section 50 and a digital signal processing section 60. The comparator 20 sequentially compares the voltage value of the signal-under-test with a given threshold voltage value at a timing at which each strobe is sequentially provided.

The strobe timing generator 30 sequentially generates strobes at substantially even time intervals. The strobe timing generator 30 may sequentially generates strobes in synchronism with the period of the signal-under-test.

Additionally, the strobe timing generator 30 may generate strobes independent of the period of the signal-under-test. The strobe timing generator 30 may sequentially generates strobes in synchronism with a period different from the period of the signal-under-test.

The capture memory 40 stores a comparison result outputted from the comparator 20. For example, the capture memory 40 aligns and stores the comparison results sequentially outputted from the comparator 20 with respect to the associated strobe phase.

The digital signal processing section 60 calculates jitter in the signal-under-test based on the comparison result stored in the capture memory 40. The digital signal processing section 60 may calculate jitter in the signal-under-test by a method described later with reference to FIG. 5A and FIG. 5B. Additionally, the digital signal processing section 60 may calculate jitter in the signal-under-test by the other known technique.

It is preferred that the data according to a signal processing method of the digital signal processing section 60 is inputted to the digital signal processing section 60. For example, when the digital signal processing section 60 calculates jitter in the signal-under-test based on such as the zero crossing point of the signal-under-test, it is preferred that a signal indicative of a discrete value whose magnitude presents a discrete value in a range smaller than n (where, n is a real number).

The measuring apparatus 10 according to the present embodiment converts the comparison result stored in the capture memory 40 to a digital signal to be inputted to the digital signal processing section 60. For example, the digital signal converting section 50 generates a digital signal obtained by converting the voltage value for each signal-under-test to a digital value in a range in which their magnitudes are smaller than n (where n is a real number). For example, the digital signal converting section 50 may convert the comparison result to a digital value within 1 to −1.

Now, a case that comparator 20 compares the voltage value of the signal-under-test at each strobe timing with a threshold voltage and outputs logical value H or logical value L as a comparison result will be explained as an example. In this case, the digital signal converting section 50 outputs a digital signal obtained by converting the logical value H to the digital value 1 and also converting the logical value L to the digital value −1. Additionally, when the comparator 20 outputs the result by comparing three values, the digital signal converting section 50 converts each comparison result to the digital values 1, 0, −1 corresponding to the logical value for each comparison result.

By such signal conversion, a signal processing by the digital signal processing section 60 can be easily performed.

FIG. 2 sows an example of strobe generated by a strobe timing generator 30. The period of the signal-under-test is referred as T in the present embodiment. As described above, the strobe timing generator 30 sequentially generates strobes at substantially even time intervals in synchronism with or asynchronism with the period T of the signal-under-test.

Generally, the testing apparatus 100 operates for each period (T0, T1, T2 . . . ) corresponding to the operating period (test rate) in synchronism with the period T of the signal-under-test. The strobe timing generator 30 may generate a single strobe or plurality of strobes for each cycle in accordance with each test rate as shown in (1) and (2) of FIG. 2. Additionally, the strobe timing generator 30 may generate strobes in asynchronism with the test rate as shown in (3) of FIG. 2. At this time, the number of strobes generated for each cycle is defined based on the period for which the strobe timing generator 30 generates a strobe and the test rate. For example, the strobe timing generator 30 may be an oscillator circuit that operates independent of the operating period of the testing apparatus 100.

The period T of the signal-under-test may be corresponding to the test rate of the testing apparatus 100 or may not be corresponding to that. Additionally, when the testing apparatus 100 performs a functional test described later, it is preferred that the period T of the signal-under-test is corresponding to the test rate.

Thus, the interval Ts for each strobe generated by the strobe timing generator 30 is set, so that strobes of which phases are gradually shifted with respect to the phase of the signal-under-test can be sequentially generated. Additionally, the strobe timing generator 30 may generate as strobes arranged at substantially even intervals (1) strobes including a single strobe is arranged for each test rate, (2) strobes including a plurality of strobes for each test rate and (3) strobes arranged in dependent of the test mate.

Hereinbefore, the case that the test rate of the testing apparatus 100 is equal to the period T of the signal-under-test is described as an example. However, it is not necessary that the test rate is equal to the period T of the signal-under-test in the present embodiment, but it can be set independent of the period T.

Figure 3A:
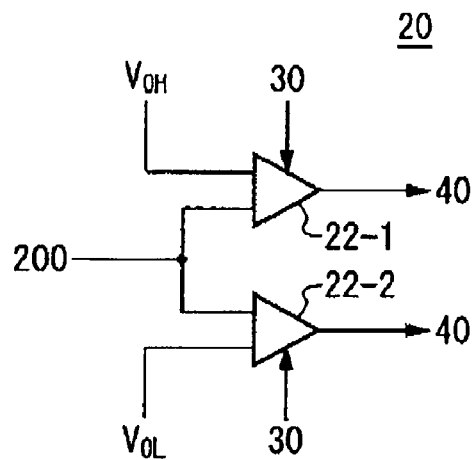
FIGS. 3A, 3B and 3C are diagrams showing exemplary configurations of a comparator.
Figure 3B:
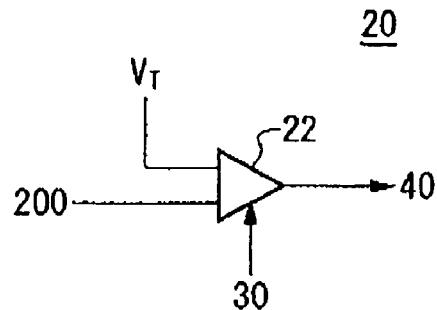
Figure 3C:
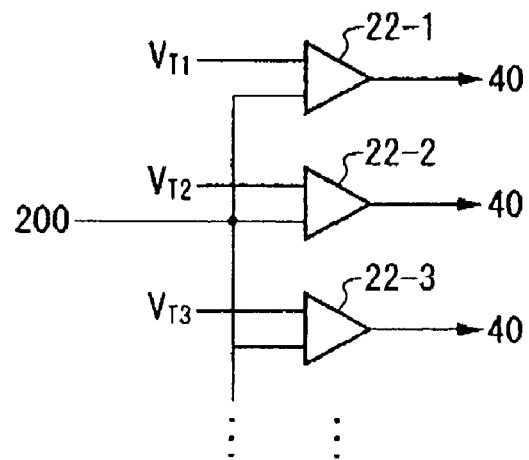

FIGS. 3A, 3B and 3C show a configuration example of comparator 20, respectively. The comparator 20 shown in FIG. 3A is supplied with a first threshold voltage VOH and a second threshold voltage VOL and outputs the result by comparing three values. A case that the second threshold voltage VOL is less than the first threshold voltage VOH will be described in the present embodiment. For example, the comparator 20 outputs different comparison results dependent on each of a case that the voltage value of the signal-under-test is more than the first threshold voltage VOH, a case that the voltage value of the signal-under-test is less than the first threshold voltage and more than the second threshold voltage VOL and a case that the voltage value of the signal-under-test is less than the threshold voltage VOL.

The comparator 20 includes a first comparator 22-1 and a second comparator 22-2. The signal-under-test is split and provided to the first comparator 22-1 and the second comparator 22-2. The Additionally, the strobe timing generator 30 feeds the strobe signals representing almost same timing to the comparators 22-1 and 22-2.

The first comparator 22-1 compares the voltage value of the signal-under-test with the first threshold voltage VOH for each strobe provided. For example, the first comparator 22-1 outputs the logical value indicative of "High" level when the voltage value of the signal-under-test is more than the first threshold voltage VOH and outputs the logical value indicative of "Low" level when the voltage value of the signal-under-test is less than the first threshold voltage VOH.

The second comparator 22-2 compares the voltage value of the signal-under-test with the second threshold voltage VOL for each strobe provided. For example, the second comparator 22-2 outputs the logical value indicative of "High" level when the voltage value of the signal-under-test is more than the second threshold voltage VOL and outputs the logical value indicative of "Low" level when the voltage value of the signal-under-test is less than the second threshold voltage VOL.

The comparator 20 outputs a combination of the logical value outputted by the first comparator 22-1 and the logical value outputted by the second comparator 22-2 as a comparison result. That is, the comparator 20 outputs the result by comparing three values which are (M,N)=High, High), (Low, High) and (Low, Low) in accordance with the voltage value of the signal-under-test provided that the logical value outputted by the first comparator 22-1 is M, and the logical value outputted by the second comparator 22-2 is N.

In this case, the digital signal convert section 50 converts each of the comparison results (High, High), (Low, High) and (Low, Low) to digital values 1, 0 and −1, respectively.

The comparator 20 shown in FIG. 3B outputs different comparison results depending on whether or not the voltage value of the signal-under-test is greater than a threshold voltage value VT fed thereto. That is, the comparator 20 according to the present embodiment outputs the result by comparing two values. The comparator 20 includes a comparator 22 to which a threshold voltage value VT and the signal-under-test are inputted. The comparator 22 compares the voltage value of the signal-under-test with the threshold voltage value VT in response to a strobe provided from the strobe timing generator 30. For example, when the voltage value of the signal-under-test is more than the threshold voltage value VT, the comparator 22 outputs the logical value indicative of High level. Meanwhile, when the voltage value of the signal-under-test is less than the threshold voltage value VT, the comparator 22 outputs the logical value indicative of Low level. The comparator 20 outputs the logical value outputted by the comparator 22 as a comparison result.

In this case, the digital signal converting section 50 converts each of the comparison results High and Low to digital values 1 and −1, respectively.

The comparator 20 shown in FIG. 3C includes a plurality of comparators 22. Threshold voltages VT1, VT2, . . . which are different from each other are provided to each of the comparators 22. Additionally, a signal-and-test is split and inputted to each of the comparators 22. Moreover, strobes having substantially the same timing are provided from the strobe timing generator 30 to each of the comparators 22.

Each of the comparators 22 compares the threshold voltage VTx with the voltage value of the signal-under-test corresponding thereto in accordance with the given strobe. The operation of each comparator 22 is the same as the comparator 22 shown in FIG. 3B. The comparator 20 outputs the combination of the logical value outputted from each of the comparator 22 as a comparison result.

That is, the comparator 20 according to the present embodiment receives three or more kinds of threshold voltages different from each other, and outputs comparison results different from each other dependent on that the voltage value of the signal-under-test belongs to either the voltage ranges defined by two adjacent threshold voltages.

For example, the digital signal converting section 50 converts the comparison result that the logical values outputted by all the comparators 22 indicate High level to a digital value "1", and also converts the comparison result that the logical values outputted by all the comparators 22 indicate Low level to a digital value "−1" Additionally, the digital signal converting section 50 converts the other comparison results to certain digital values within 1 to −1 in accordance with the logical values.

It is preferred that each threshold voltage provided to the comparators 20 described in FIGS. 3A-3C is variable. For example, the measuring apparatus 10 may control each threshold voltage based on information on the amplitude level of the signal-under-test to be measured.

Figure 4:
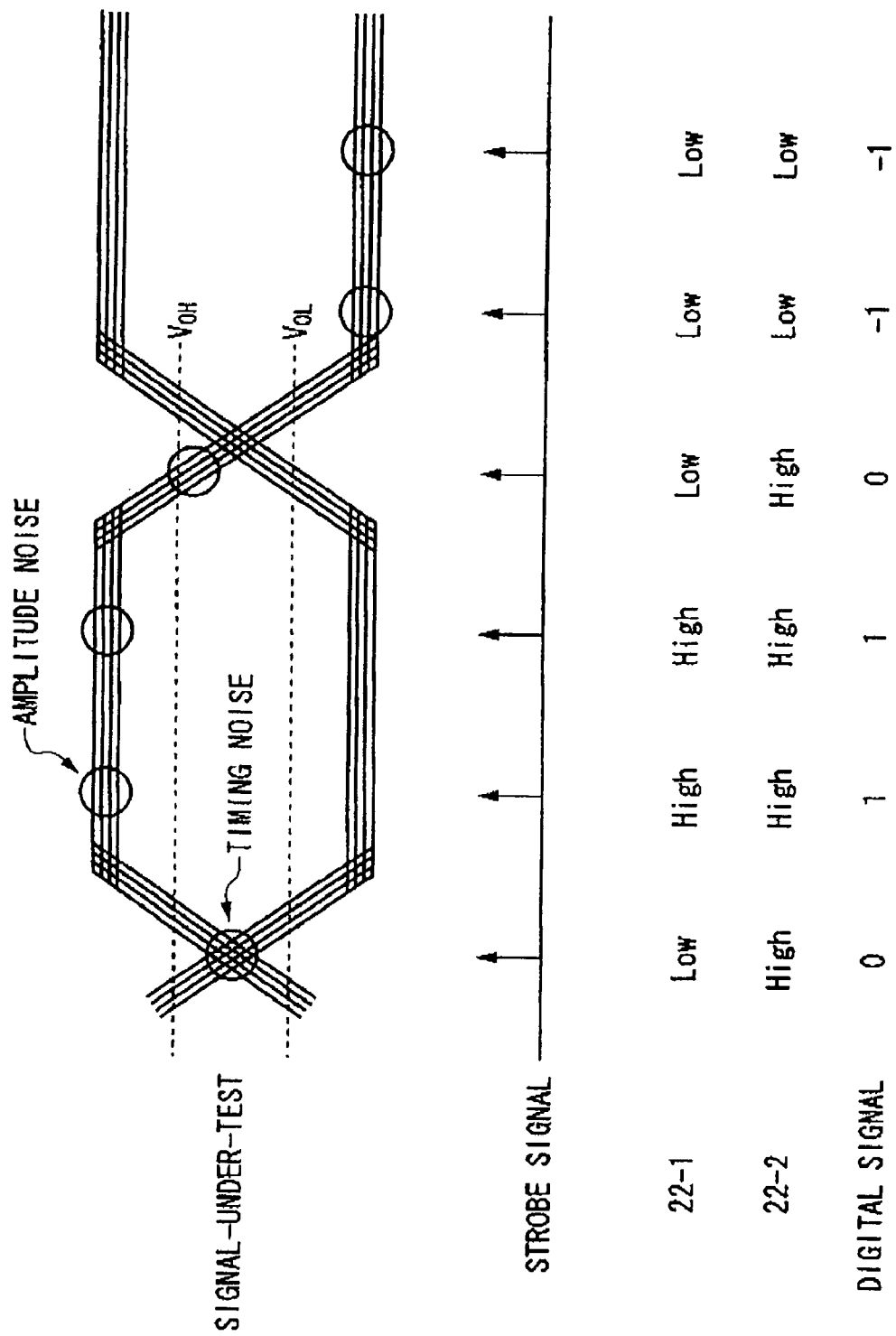
FIG. 4 shows one exemplary operation of the measuring apparatus when the comparator shown in FIG. 3A is used.

FIG. 4 shows an example of operation of the measuring apparatus 10 using the comparator 20 shown in FIG. 3A. A signal-under-test illustrated in FIG. 4 is inputted to the measuring apparatus 10. The input signal includes timing noise which is jitter along the time axis, and amplitude jitter along the amplitude axis. For example, the edge portion of the signal-under-test is mainly dominated by jitter due to the timing noise, alternatively, the steady portion of the signal-under-test is mainly dominated by jitter due to the amplitude noise.

As shown in FIG. 4, the vertical eye opening of the signal-under-test decreases due to the amplitude noise and the horizontal eye opening thereof decreases due to the timing noise. Ideally, the horizontal eye opening of the signal-under-test is affected only by the timing noise. However, the amplitude noise also affects the horizontal eye opening due to a kind of AM-to-PM conversion. Consequently, the amplitude noise has a relatively high probability of being converted into noise.

Now therefore, it is desired that timing jitter is measured without suffering any influence from the amplitude noise.

Meanwhile, the measuring apparatus according to the present embodiment 10 converts the voltage value of the signal-under-test more than a first threshold voltage VOH to the digital value "1", and also converts the voltage value of the signal-under-test less than a second threshold voltage VOL to the digital value "−1". Thereby the influence of the amplitude noise can be automatically rejected. Then, the measuring apparatus 10 converts the voltage value of the signal-under-test which is less than the first threshold voltage VOH and more than the second threshold voltage VOL to the digital value "0". The timing when those digital values are detected may be determined only by the timing noise. Therefore, the influence of the amplitude noise is rejected based on the comparison result of the comparator 20, so that the timing noise can be accurately measured.

Moreover, strobes inputted to the comparator 20 are arranged at substantially even intervals independent of the stationary period of the signal-under-test. Therefore, it enables the measurement to be carried out by excluding the time dependency of the timing noise. It is preferred that the frequency at which strobes are inputted to the comparator 20 is more than Nyquist frequency. For example, four or more strobes may be provided for each period of the signal-under-test.

FIGS. 5A and 5B show a configuration example of the digital signal processing section 60. The digital signal processing section shown in FIG. 5A includes a band limiting section 62 and a phase distortion estimating section 64. The band limiting section 62 passes therethrough an appropriate frequency component of a digital signal to be measured. Additionally, the band limiting section 62 according to the present embodiment converts a digital signal to an analytic signal. The band limiting section 62 may generate the analytic signal by generating Hilbert Transform Pair.

As described above, the digital signal converting section 50 converts the comparison result outputted by the comparator 20 to the digital signal indicative of such as "1", "0" and "−1". Therefore, the digital signal converting section 50 can generate a signal corresponding to the digital signal, and also can generate such as an analytic signal $\cos(2\pi ft)+j\sin(2\pi ft)$. As described above, the analytic signal rejects any influence of the amplitude noise of the signal-under-test.

The phase distortion section 64 calculates the phase noise of a digital signal outputted by the band limiting section 62. The phase distortion section 64 according to the present embodiment includes an instantaneous phase estimating section 66 and a linear phase removing section 68.

The instantaneous phase estimating section 66 generates an instantaneous phase signal indicative of the instantaneous phase of a digital signal. The instantaneous phase of the digital signal can be derived form the inverse tangent (arctangent) of the ratio between the real part and the imaginary part of the analytic signal.

The linear phase removing section 68 removes a linear component of an instantaneous phase signal (instantaneous linear phase) and calculates the phase noise of a signal-under-test. For example, the linear phase removing section 68 may calculate the linear component of the instantaneous phase signal based on the period of the signal-under-test, and also may calculate a linear component obtained by approximating the instantaneous phase signal by a linear line. The linear component is the instantaneous phase of the jitter-free signal-under-test. Additionally, the linear phase removing section 68 may measure the average period of the signal-under-test and calculates the linear component based on the period. The difference between the linear component and the instantaneous phase signal indicates the phase noise in the signal-under-test at each timing.

The digital signal processing section 60 shown in FIG. 5B includes the band limiting section 62 and the phase distortion section 64. The band limiting section 62 passes therethrough an appropriate frequency component of the digital signal to be measured.

The phase distortion estimating section 64 includes a zero-crossing timing estimating section 72 and the linear phase removing section 68. The zero-crossing timing estimating section 72 estimates a zero-crossing timing series of the signal-under-test based on the digital signal outputted by the band limiting section 62. The zero-crossing timing series is data sequentially indicating each timing at which the digital signal indicates the digital value "0".

The linear phase removing section 68 removes the linear component of the zero-crossing timing series and calculates the phase noise of the signal-under-test. The linear component can be calculated by the same method as the method implemented by the linear phase removing section 68 shown in FIG. 5A.

Figure 6A:
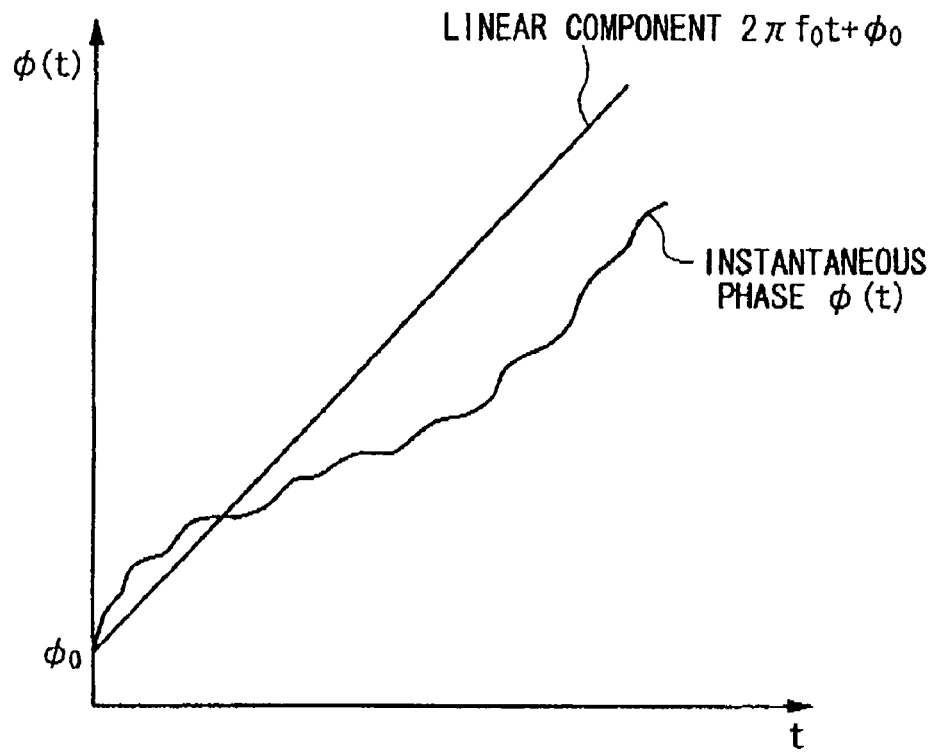
FIGS. 6A and 6B are graphs showing exemplary operations of a linear phase removing section.
Figure 6B:
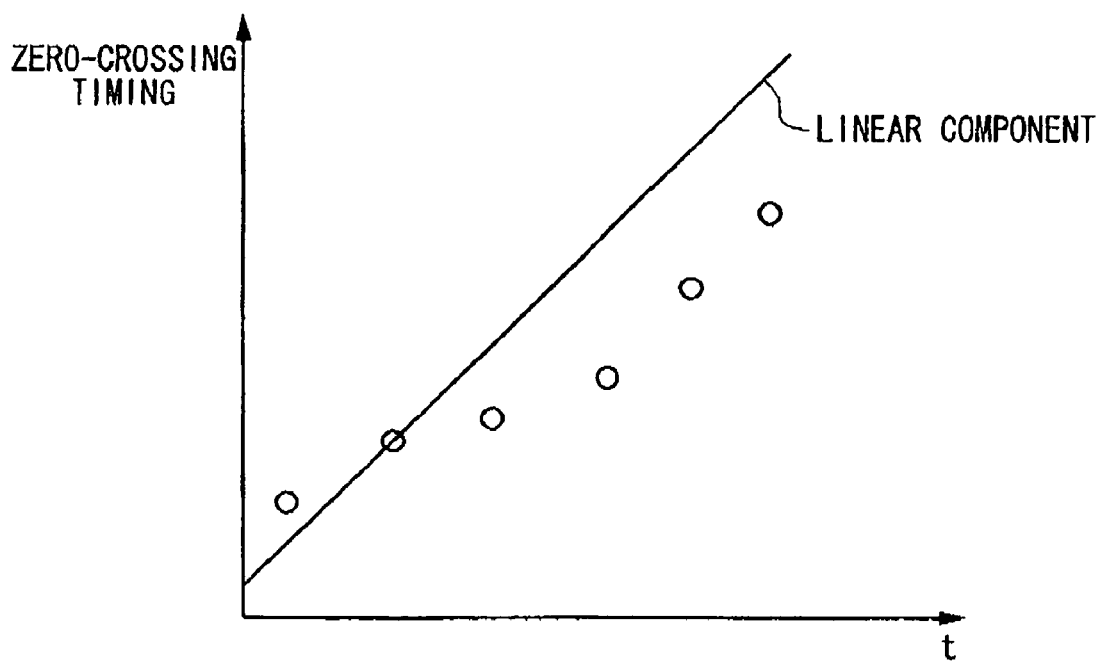

FIG. 6A and FIG. 6B show an example of operation of the linear phase removing section 68. FIG. 6A shows the instantaneous phase of the digital signal when the horizontal axis is a time, t, and the vertical axis is instantaneous phase $\phi(t)$. As described above, the phase error of the digital signal can be derived by calculating the difference between the instantaneous phase and the linear component thereof.

FIG. 6B is a diagram on which each zero-crossing timing is plotted when the horizontal axis is a time t, and the vertical axis is a zero-crossing timing. As described above, the phase error at each zero-crossing point, i.e. the phase error of the edge of the signal-under-test can be derived by calculating the difference between the instantaneous phase and the linear component at each zero-crossing point.

FIG. 7 shows a comparison between an actual measurement value of jitter by a conventional jitter measurement method and an actual measurement value by the testing apparatus 100. The conventional jitter measurement method shown in FIG. 7 converts a signal-under-test to a digital signal with an 8-bit ADC and measures jitter by the same method as the method used by the digital signal processing section 60.

Additionally, the testing apparatus 10 measures jitter by using the comparator 20 that outputs a digital signals with three values.

As shown in FIG. 7, the test apparatus 10 can perform a measurement having the measurement error of less than 4% from the conventional one on both of the signal-under-test having low noise and the signal-under-test having high noise with more simple configuration than the conventional one.

Figure 8A:
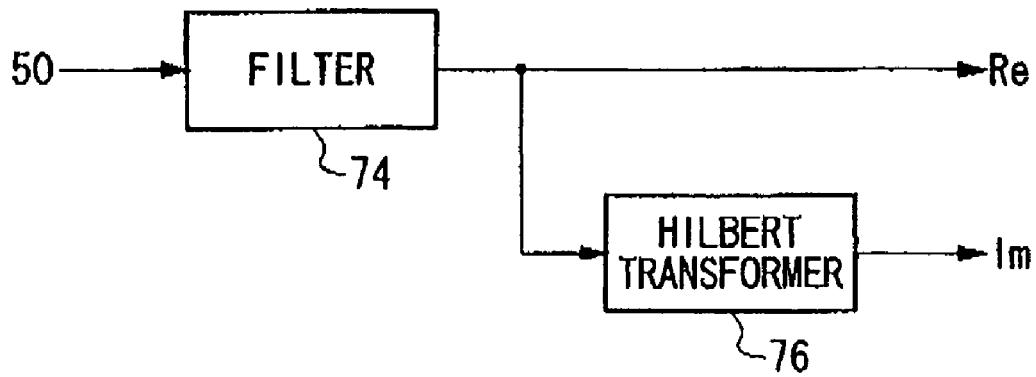
FIGS. 8A and 8B show exemplary configurations of a band limiting section.
Figure 8B:
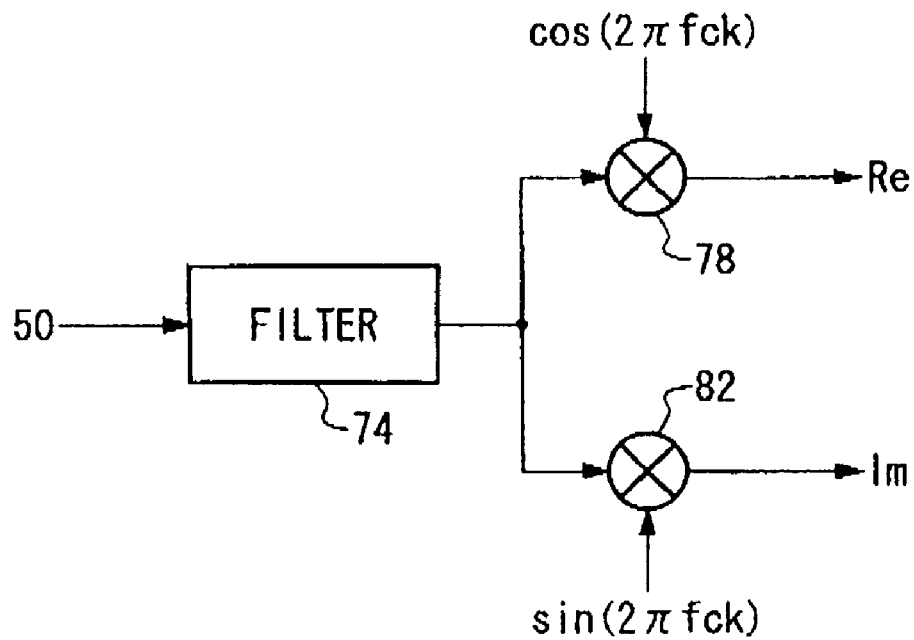

FIG. 8A and FIG. 8B show a configuration example of the band limiting section 62. The band limiting section 62 according to the present embodiment is used for the digital signal processing section 60 shown in FIG. 5A. The band limiting section 62 shown in FIG. 8A includes a filter 74 and a Hilbert transformer 76. The filter 74 receives a digital signal outputted by the digital signal converting section 50 and passes therethough an appropriate frequency component to be measured. The Hilbert transformer 76 performs Hilbert-transform on the digital signal outputted by the filter 74. For example, the Hilbert transformer 76 generates a signal by delaying the phase of the digital signal by 90 degree. The band liming section 62 outputs an analytic signal having the real part being a digital signal outputted by the filter 74 and the imaginary part being a signal outputted by the Hilbert transformer 76.

The band limiting section 62 shown in FIG. 8B includes a filter 74, a mixer 78 and a mixer 82. The filter 74 is the same as the filter 74 shown in FIG. 8A. Each of the mixer 78 and the mixer 82 splits a digital signal outputted by the filter 74 and receives the same, and then, quadrature modulates and outputs the same. For example, carrier signals of which phases are different by 90 degree from each other are inputted to the mixer 78 and the mixer 82, and the digital signal and the carrier signal are multiplied and outputted. The band limiting section 62 outputs an analytic signal having the real part being the digital signal outputted by the mixer 78 and the imaginary part being the digital signal outputted by the mixer 82.

Thus, an analytic signal having an appropriate frequency components of the signal-under-test to be measured can be generated.

The filter 74 may pass therethrough the frequency components around the carrier frequency of the signal-under-test among the frequency components of the signal-under-test and also may pass therethrough the frequency components in the frequency band without the carrier frequency of the signal-under-test.

Figure 9:
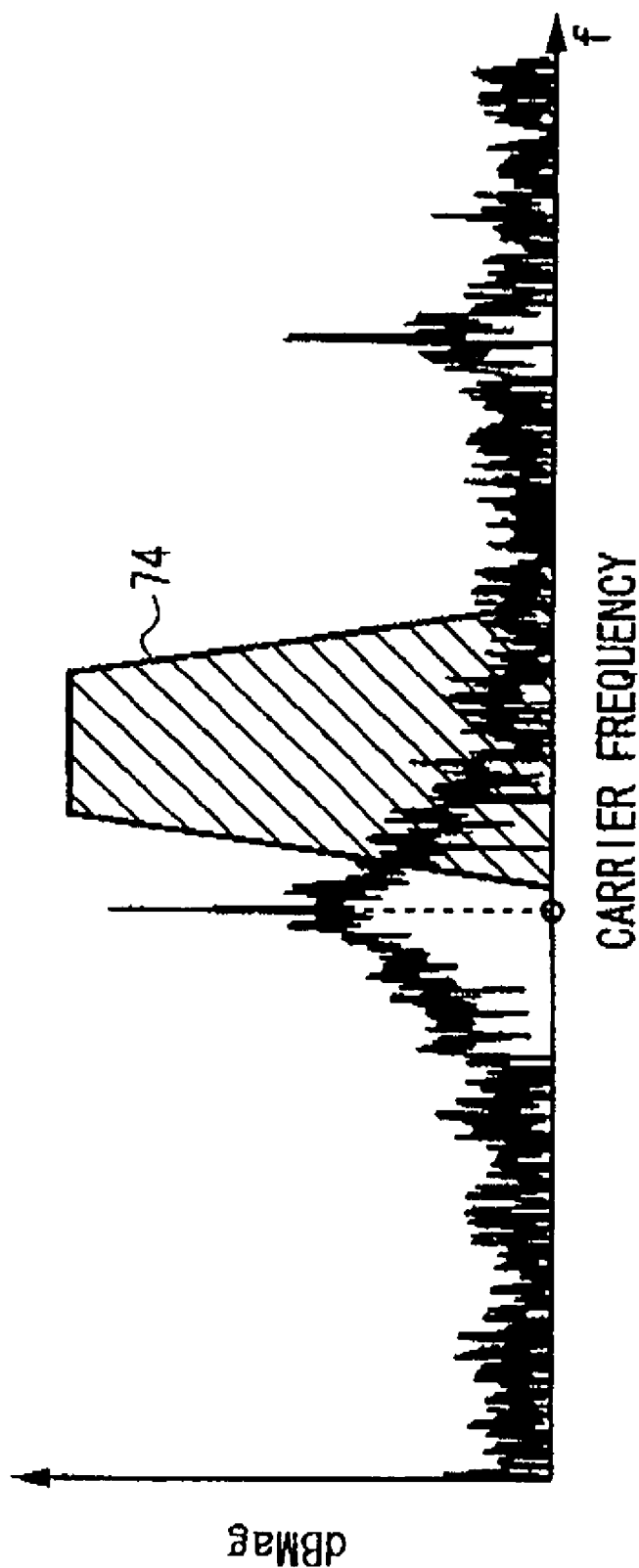
FIG. 9 is a graph showing one exemplary fluency band passed through a filter.

FIG. 9 shows an example of frequency band passing through a filter 74. As described above, the filter 74 passes therethrough the band without the carrier frequency among the frequency component of the signal-under-test. The carrier frequency component of the signal-under-test is not noise component and has energy larger than that of the other frequency component. Therefore, when the component of the carrier frequency is not removed, it will be required for the apparatus to provide a measuring range and an arithmetic operation range in which the energy of the carrier frequency may be dominant even though it is an unnecessary component in the measurement of noise. Therefore, it is unable to maintain sufficient resolution in the arithmetic operation and others for noise components that have very small energy as compared to the components of the carrier frequency and hence it is unable to accurately measure the noise component.

Meanwhile, the measuring apparatus 10 according to the present embodiment removes the carrier frequency component of the signal-under-test and extracts the noise component to be measured, so that the noise component can be accurately measured. Moreover, it is preferred that the filter 74 also removes the high frequency component of the carrier frequency component.

Figure 10:
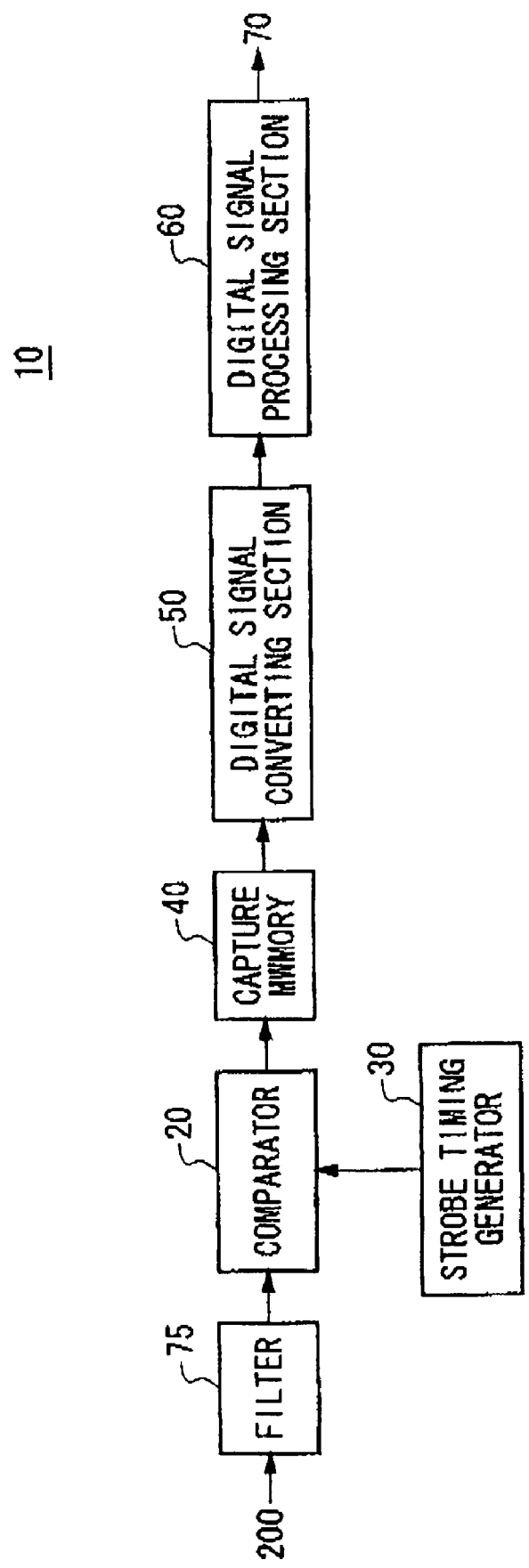
FIG. 10 shows another exemplary configuration of the measuring apparatus.

FIG. 10 shows another example of configuration of the measuring apparatus 10. The measuring apparatus 10 further includes a filter 75 in addition to the components of the measuring apparatus 10 described with reference to FIG. 1. The filter 79 shown in FIG. 10 may have the function the same as that of the filter 74 shown in FIG. 8. The other components have the functions and the configurations the same as those having the same reference numerals described in FIG. 1.

The filter 75 according to the present embodiment receives a signal-under-test outputted by the device under test 200, passes therethough an appropriate frequency components to be measured and inputs the same to the comparator 20.

Figure 11:
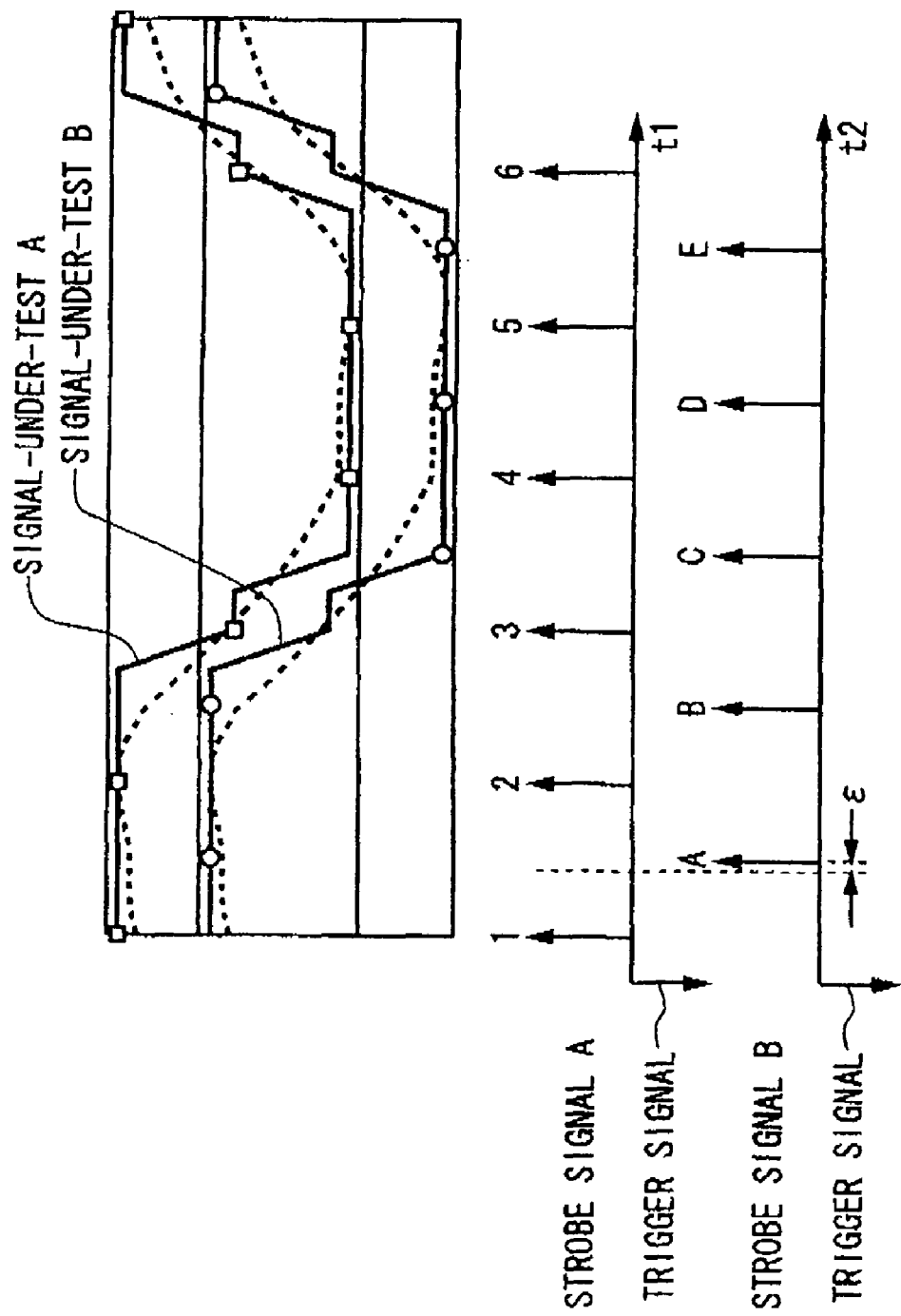
FIG. 11 is a chart showing one exemplary operation of the comparator and the strobe timing generator.

FIG. 11 shows an example of operation of the comparator 20 and the strobe timing generator 30. The measuring apparatus 10 according to the present embodiment samples the signal-under-test at the frequency of integer multiple of the generated-strobe frequency using the equivalent-time sampling approach by sequentially receiving the signal-under-tests and by shifting the phase of the strobe with respect to the signal-under-test. In the present embodiment, a case that the measuring apparatus 10 receives the sequential repetitions of the same signal-under-tests (a signal-under-test A and a signal-under-test B) twice will be described.

Firstly, the strobe timing generator 30 generates a strobe A in which strobe signals are arranged at even time intervals for the signal-under-test A in synchronism with (or asynchronism with) in the period of the signal-under-test or the test rate.

Here, the strobe timing generator 30 generates a strobe to be inputted to the comparator 20 on the basis of the phase of a trigger signal in synchronism with the signal-under-test. For example, the strobe timing generator 30 starts to output the strobe A on the basis of the trigger signal having a predetermined phase for the signal-under-test after a predetermined offset time lapses.

Then, the strobe timing generator 30 starts to output a strobe B for the signal-under-test B which is received following the signal-under-test A also on the basis of the trigger signal after a predetermined offset time lapses. In the strobe B, strobe signals are arranged at the time intervals the same as those of the strobe A.

Here, the phase of the trigger signal being the basis of the signal-under-test A is substantially the same as the phase of the trigger signal being the basis of the signal-under-test B, and each strobe interval of the strobe A is also the same as that of the strobe B. Additionally, the offset of the strobe signal A from the trigger signal and the offset of the strobe signal B may be different by substantially half of a strobe interval. That is, when the strobe A and the strobe B are overlapped, the strobe signals A and the strobe signals B are alternately arranged at substantially even intervals.

By generating such strobe A and strobe B, one comparator 20 can equivalently sample with the frequency twice as high as the frequency at which the strobes are generated. The strobe timing generator 30 may include an oscillator circuit that generates strobes arranged at a predetermined time intervals and a delay circuit that delays an output from the oscillator circuit. In this case, the oscillator circuit sequentially generate the strobe A and the strobe B. Then, the delay circuit sequentially delay each strobe in accordance with an appropriate offset for each strobe.

Hereinbefore, it has been described by means of the strobe A and strobe B, however, the strobe timing generator 30 may sequentially generate further more strobes in another embodiment. By sequentially changing the offsets of those strobes, the an equivalent time measurement can be performed with high frequency.

Figure 12:
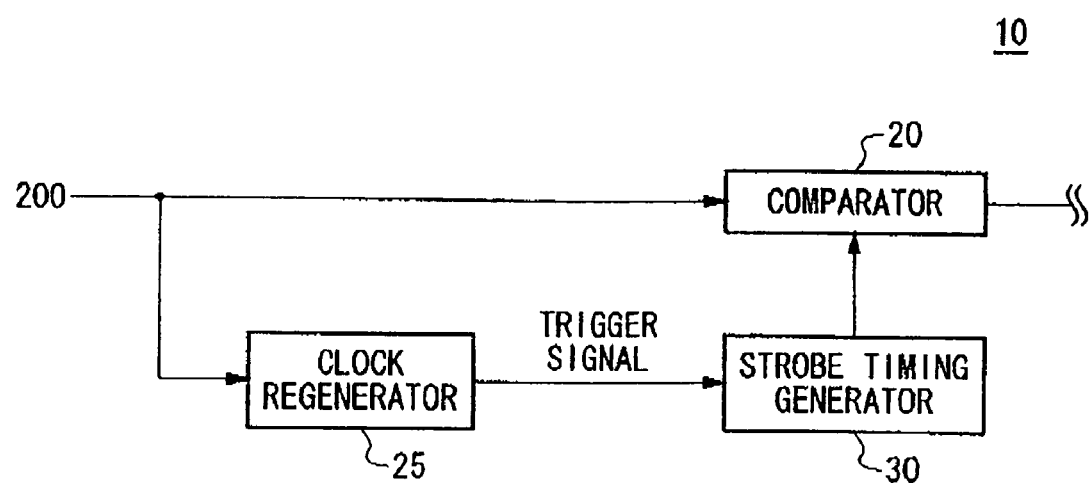
FIG. 12 is a diagram showing another exemplary configuration of the measuring apparatus.

FIG. 12 shows another example of the measuring apparatus 10. The measuring apparatus 10 according to the present embodiment further includes a clock regenerator 25 in addition to the components of the measuring apparatus 10 described with reference to FIG. 1. The other components are the same as those of the measuring apparatus 10 described with reference to FIG. 1-FIG. 11, so that the description is omitted. The clock regenerator 25 generates a recovered clock in synchronism with a signal-under-test based on the signal-under-test and inputs the recovered clock to the strobe timing generator 30 as a trigger signal. Thus, the timing at starting to generate the strobe A and the strobe B described in FIG. 11 can be controlled, so that the strobe A and the strobe B having a predetermined phase difference therebetween can be generated.

Figure 13:
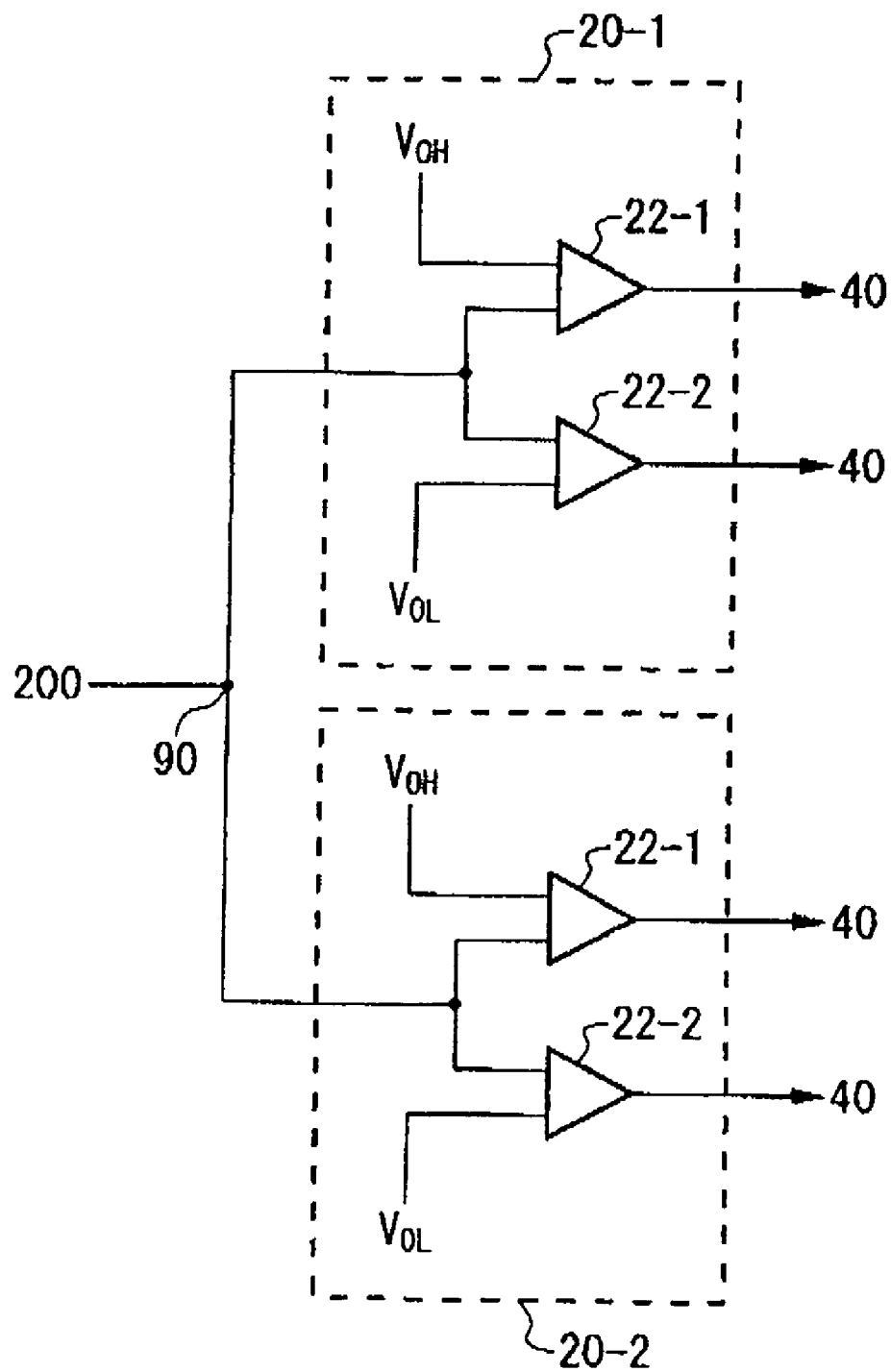
FIG. 13 is a diagram showing another exemplary configuration of the comparator.

FIG. 13 is a diagram showing another exemplary configuration of the comparator. The measuring apparatus 10 according to the present embodiment includes two comparators 20-1 and 20-2 (hereinafter generically referred to as comparators 20). Each comparator 20 is the same as the comparator 20 described in FIG. 3A. Additionally, each comparator 20 receives a first threshold voltage VOH and a second threshold voltage VOL which are the same. Moreover, a signal-under-test is split and inputted to each comparator 20. The measuring apparatus 10 may further include an input section 90 that splits a signal-under-test and inputs the same to each comparator 20 in parallel. In this case, the strobe timing generator 30 inputs strobes with the phases different from each other to each comparator. For example, the strobe timing generator 30 inputs the strobe A shown in FIG. 11 to the comparator 20-1 and also inputs the strobe B shown in FIG. 11 to the comparator 20-2. Thereby an interleaved-sampling can be performed by using two comparators 20, so that a signal-under-test can be measured with the frequency twice as high as the frequency at which the strobes are generated.

Figure 14:
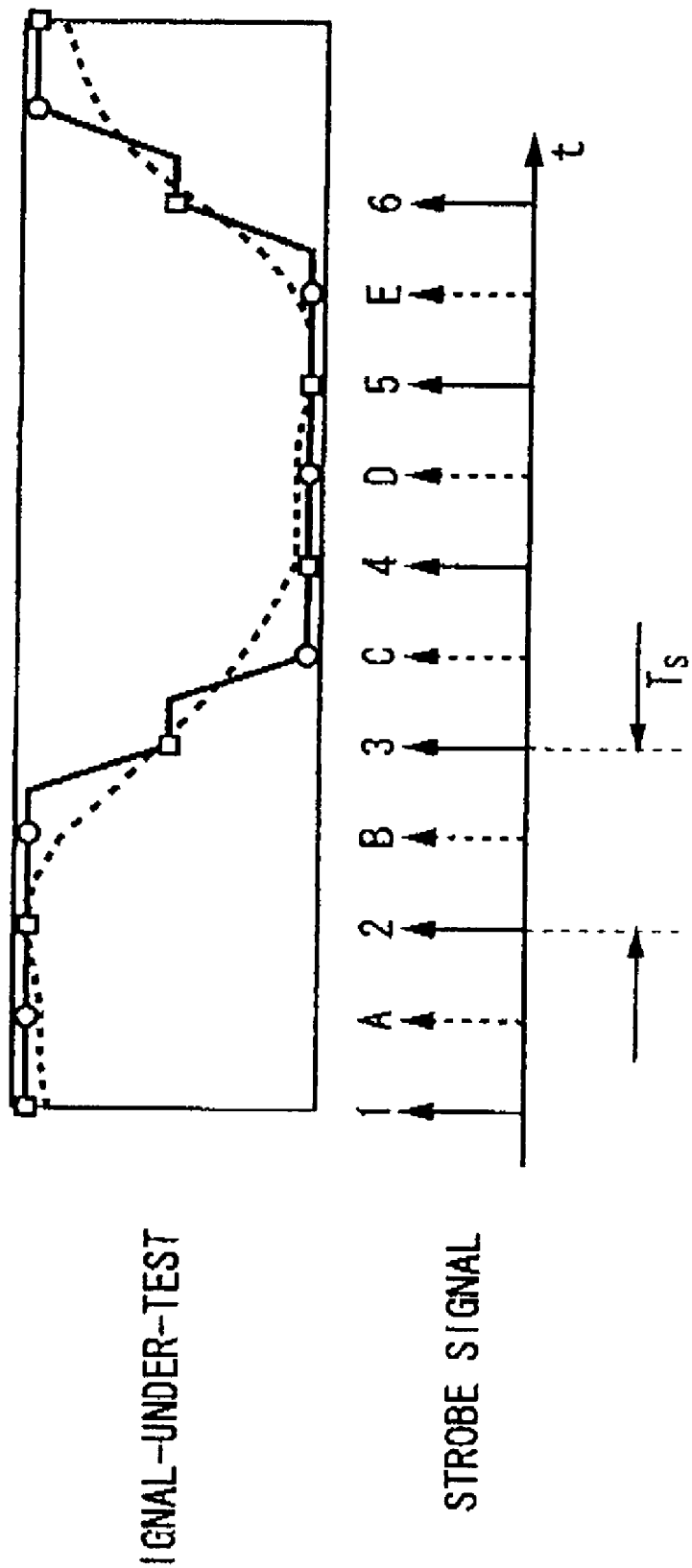
FIG. 14 is a chart showing one exemplary operation of the comparator and the strobe timing generator shown in FIG. 13.

FIG. 14 shows an example of operation of the comparator 20 and the strobe timing generator 30 shown in FIG. 13. As described above, the strobe timing generator 30 generates strobe A (1, 2, 3 . . . ) and the strobe B (A, B, C . . . ) and inputs the same to each comparator 20.

The capture memory 40 aligns comparison results of two comparators 20 in accordance with the phases of the corresponding strobes and stores therein the same. For example, the capture memory 40 sequentially aligns the comparison result corresponding to each of the strobe signal 1, the strobe signal A, the strobe signal 2, the strobe signal B . . . shown in FIG. 14 and stores therein the same. In this case, since the strobe signal A and the strobe signal B are generated at a time, it is not necessary to separately generate the strobe signal on the basis of the trigger signal. It is preferred that a group of strobes obtained by overlapping the strobe A and the strobe B are arranged at substantially even time intervals. For example, the strobe timing generator 30 may have a circuit that generates the strobe A and a circuit that generates the strobe B by delaying the strobe A.

Hereinbefore, an case that the measuring apparatus 10 includes two comparators 20 has been described in the present embodiment, however, the measuring apparatus 10 may further more comparators 20 in another embodiment. In this case, a measurement with higher frequency can be performed by changing the offset of the strobe inputted to each comparator 20.

However, with resect to the sampling method described with reference to FIG. 11-FIG. 14, if there is any error between the phase of any strobe and a predetermined phase, the error could be shown in the measurement result. Therefore, it is preferred that any measurement error due to the error of the phase of the strobe, i.e. the error of the sampling timing is corrected.

Figure 15:
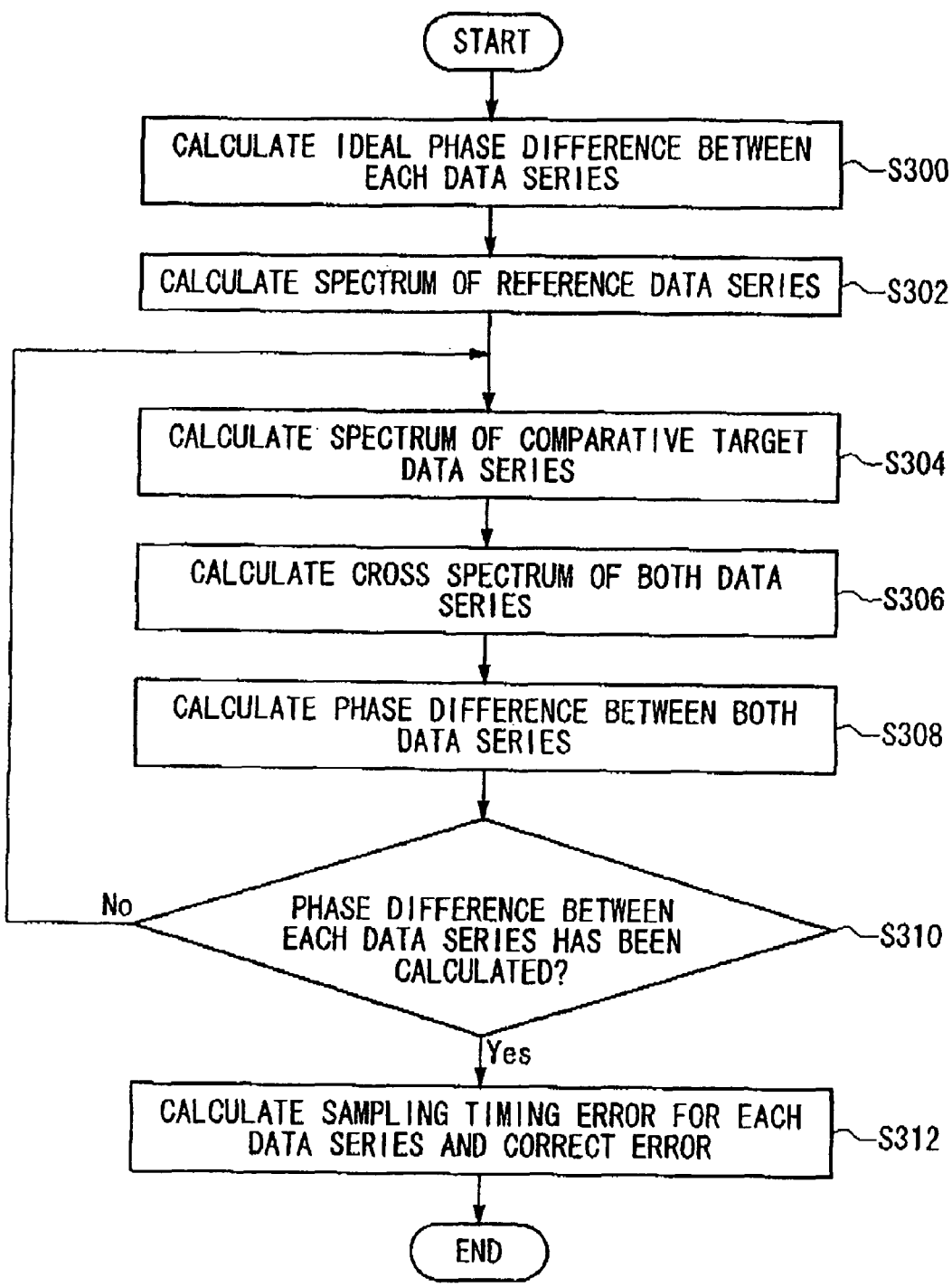
FIGS. 15 and 16 are flowcharts showing one exemplary method for correcting errors of sampling timing.
Figure 16:
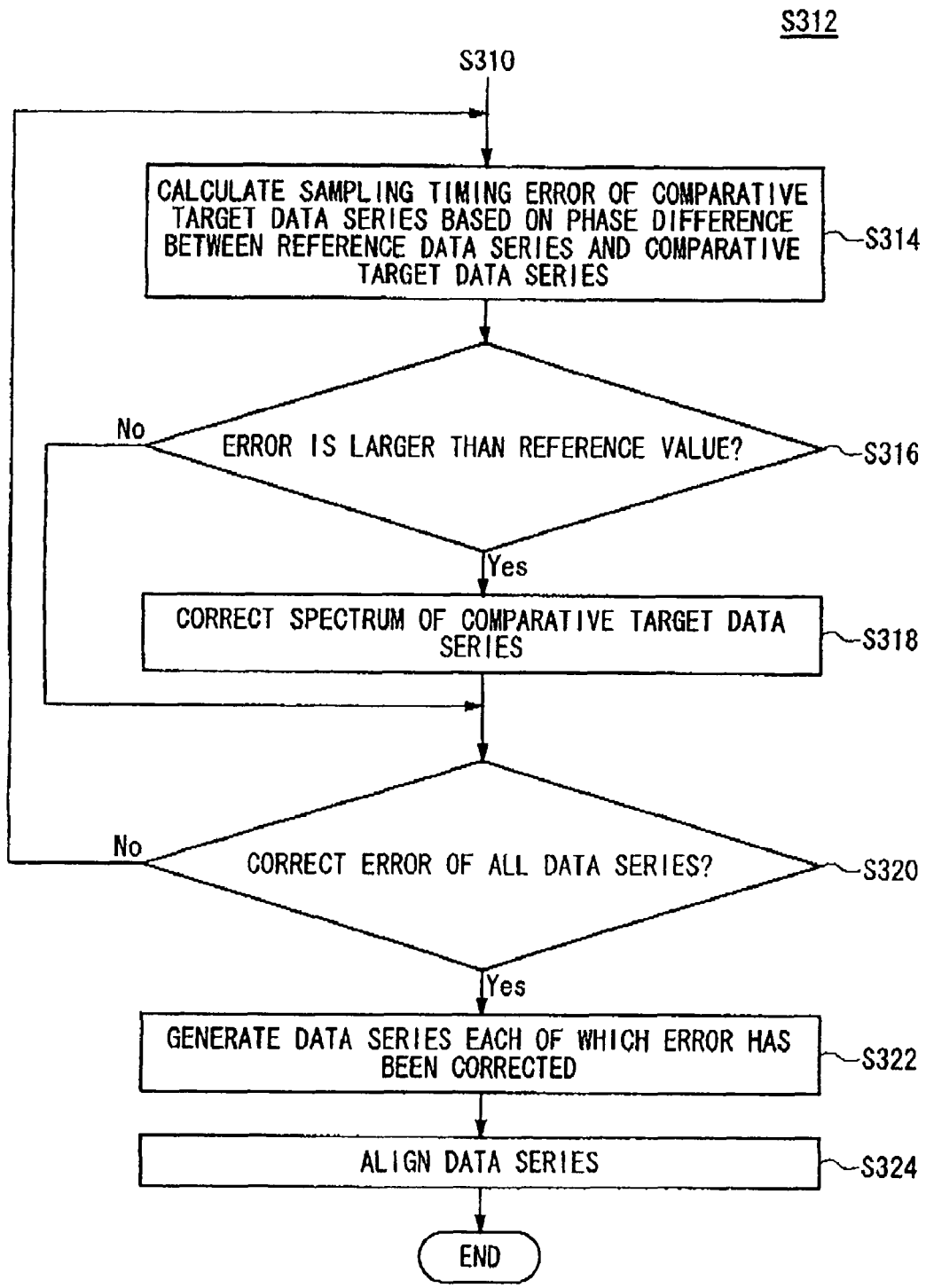

FIG. 15 and FIG. 16 are flowcharts show an example of method of correcting error of a sampling timing, respectively. The correction may be performed by the digital signal processing section 60. Firstly, an ideal value of the phase difference between the sampling timing for each data series sampled in accordance with each strobe signal is calculated in ideal phase difference calculating step S300. For example, the phase difference is calculated as $2\pi(\Delta t/T)$, where, $\Delta t$ is the ideal value of the difference between the offset for each strobe, and T is the average period of the signal-under-test.

Next, in reference the spectrum calculating step S302, any data series among a plurality of data series is selected as a reference and calculates the spectrum of the data series. The spectrum can be calculated by performing fast-Fourier-transform on the data series.

Next, in comparison spectrum calculating step S304, a data series different from the reference data series is selected and the spectrum of the data series is calculated. The spectrum can be calculated by fast-Fourier-transforming the data series.

Next, in cross spectrum calculating step S306, the cross-spectrum of the spectrum of the reference data series and the spectrum of the data series to be compared. The cross-spectrum can be calculated by complex-number multiplying the complex conjugate spectrum of the reference data series by the spectrum of the data series to be compared.

Next, in phase difference calculating step S306, the phase difference between the reference data series and the data series to be compared is calculated. The phase difference can be calculated based on the cross-spectrum calculated in S306. That is, the phase component of the cross-spectrum indicates the phase difference between the reference data series and the data series to be compared.

Here, the phase difference is calculated by means of the cross-spectrums of two data series in the S304 and the S306, however, the phase difference may be calculated by means of the other method. For example, the phase difference may be calculated based on the cross-correlation between the spectrums of two data series.

Next, it judges whether the phase difference is calculated for each of the data series to be compared in S310. If there is any data series of which phase difference from the reference data series has not been calculated, the processing from S304 to 306 is performed again on the data series.

Meanwhile, if the phase difference is calculated for each data series to be compared, the measurement error is corrected based on the phase difference between each data series to be compared in error correction step S312. For example, each data series is corrected based on the difference between the phase difference among each data series to be compared and the ideal phase difference calculated in S300.

FIG. 16 is flowchart shows an example of processing in the error connection step S312. Firstly, a sampling timing error of the data series to be compared is calculated based on the phase difference between the reference data series and the data series to be compared in timing error calculating step S314. The timing error can be calculated based on the ideal phase difference.

Next, in comparison step S316, it judges whether the timing error is more than a predetermined threshold value. When the timing error is less than the threshold value, the corresponding data series is not corrected but shift to S320. Meanwhile, when the timing error is more than the threshold value, the corresponding data series is corrected in correction step S318. For example, the data series may be corrected by shifting the phase of the spectrum of the data series based on the timing error.

Next, it judges whether the timing error is corrected for each of the data series. When there is any data series of which timing error has not been corrected, the processing from the S314 to the S318 are performed again on the data series. Meanwhile, when the trimming error for each of the data series is corrected, data series each of which timing error is corrected is generated in data series generating step S322. For example, a data series of which timing error is corrected can be acquired by performing an inverse fast Fourier-transform on the spectrum for each data series of which timing error is corrected.

Then, in alignment step S324, each data series is aligned. For example, each data is aligned in response to the sampling timing for each data.

By the above-described processing, any measurement error due to the sampling timing error can be corrected. Therefore, jitter can be accurately measured.

Figure 17:
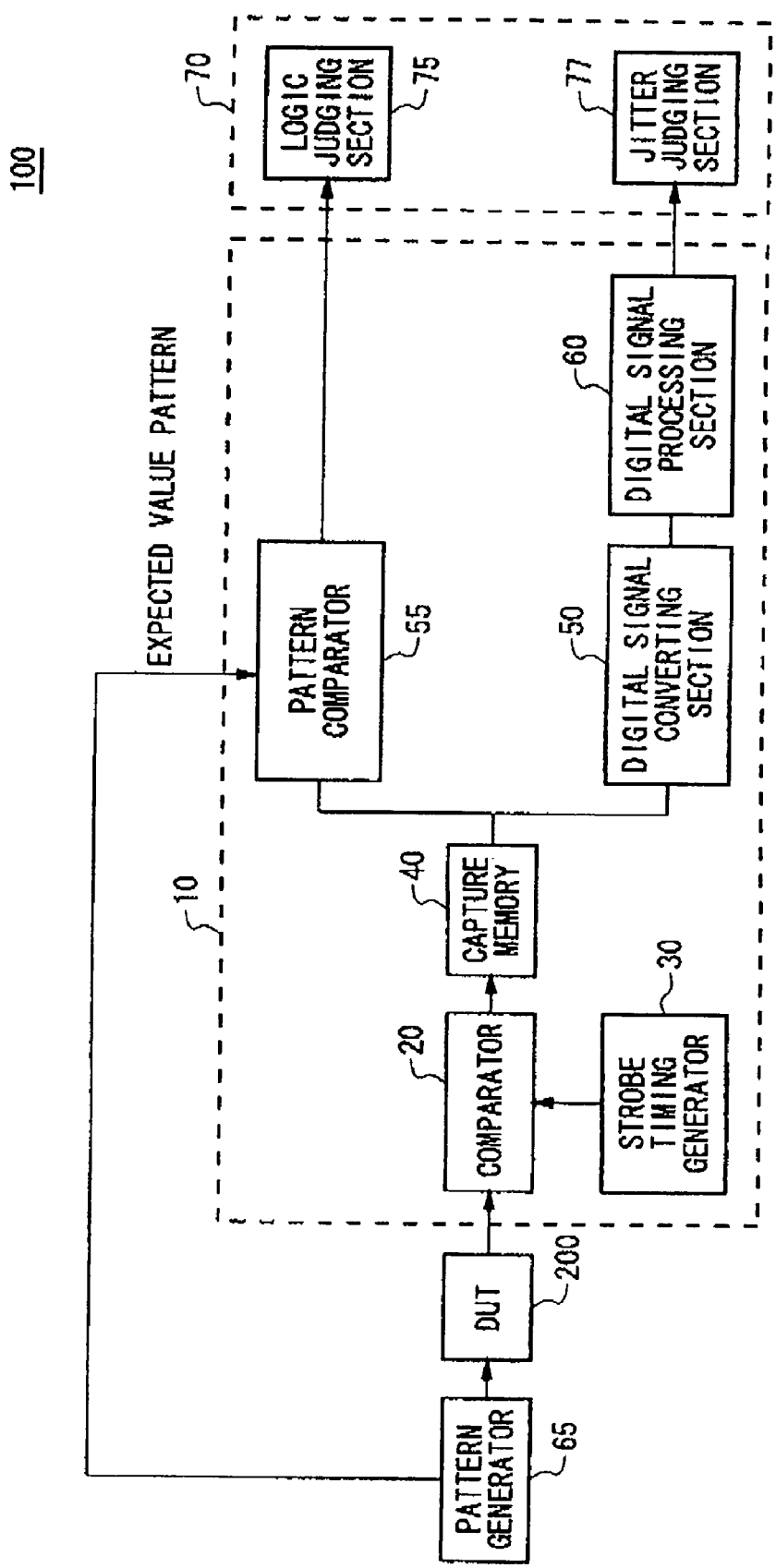
FIG. 17 is a diagram showing another exemplary configuration of the testing apparatus.

FIG. 17 shows another example of configuration of the testing apparatus 100. The testing apparatus 100 according to the present embodiment further has a function to perform a function test on the device under test 200 in addition to the function to perform the jitter test performed by the testing apparatus 100 described with reference to FIG. 1-FIG. 16.

Additionally, the testing apparatus 100 according to the present embodiment further include a pattern generator 65 and a pattern comparison section 55 in addition to the components of the testing apparatus 100 described with reference to FIG. 1-FIG. 16. The judging section 70 includes a logic judging section 75 and a jitter judging section 77. Each of the other components has the function and the configuration of the components with the reference numerals the same as those of the components described with reference to FIG. 1-FIG. 16.

Performing a functional test on the device under test, the pattern generator 65 inputs a test signal having a predetermined logic level to the device under test 200. The comparator 20 compares the voltage value of the signal-under-test outputted by the device under test 200 with a predetermined threshold voltage at the provided strobe timing to detect the logic level of the signal-under-test.

At this time, the strobe timing generator 30 generates a strobe. When the functional test is performed, the strobe timing generator 30 generates the strobe in accordance with a test rate synchronized with the period of the signal-under-test. For example, the strobe timing generator 30 generates one strobe signal at almost-center timing of each test rate. Thereby the comparator 20 detects the logic level for each period of the signal-under-test.

As described above, when a jitter test is performed, the strobe tiring generator 30 may generate a strobe independent of the test rate. The strobe timing generator 30, for example has an oscillator circuit that generates a strobe. Performing the functional test, the strobe timing generator 30 may control the operation of the oscillator circuit according to the test rate, and may not control the operation of the oscillator circuit according to the test rate in performing the jitter test. Additionally, the strobe timing generator 30 may include a first oscillator circuit that generates strobes for performing the functional test, and a second oscillator circuit that generates strobes for performing the jitter test. In this case, the operation of the first oscillator circuit is controlled by the test rate, and the second oscillator circuit operates independent of the test rate.

When the functional test is performed, the pattern comparator 55 compares whether the logic level of the signal-under-test given by the comparison result stored in the capture memory 40 is coincident with a predetermined expected value pattern. The expected value pattern may be generated by the pattern generator 65 based on the logic level pattern of the test signal.

The logic judging section 75 judges the pass/fail result for the device under test 200 based on the comparison result by the pattern comparison section 55.

The digital signal converting section 50, the digital signal processing section and the judging section 70 may be computer with an embedded software. In this case, the testing apparatus 100 can perform a jitter test using a conventional testing apparatus for a functional test without adding the hardware. Therefore, the device under test 200 can be tested at low cost.

Here, the circuits, being connected to the capture memory 40 may post-process the signal-under-test in non-real time fashion. For example, after a set of signal-under-tests are completely applied to the device under test 200 and the logical values for a set of signal-under-tests are captured in the capture memory 40, the pattern comparison section 55, the digital signal converting section 50, the digital signal processing section 60 and the judging section 70 may process the data stored in the capture memory 40.

The testing apparatus 100 may input the subsequent set of signal-under-test to the device under test 200 while the pattern comparison section 55, the digital signal converting section 50, the digital signal processing section 60 and the judging section 70 process data.

Figure 18:
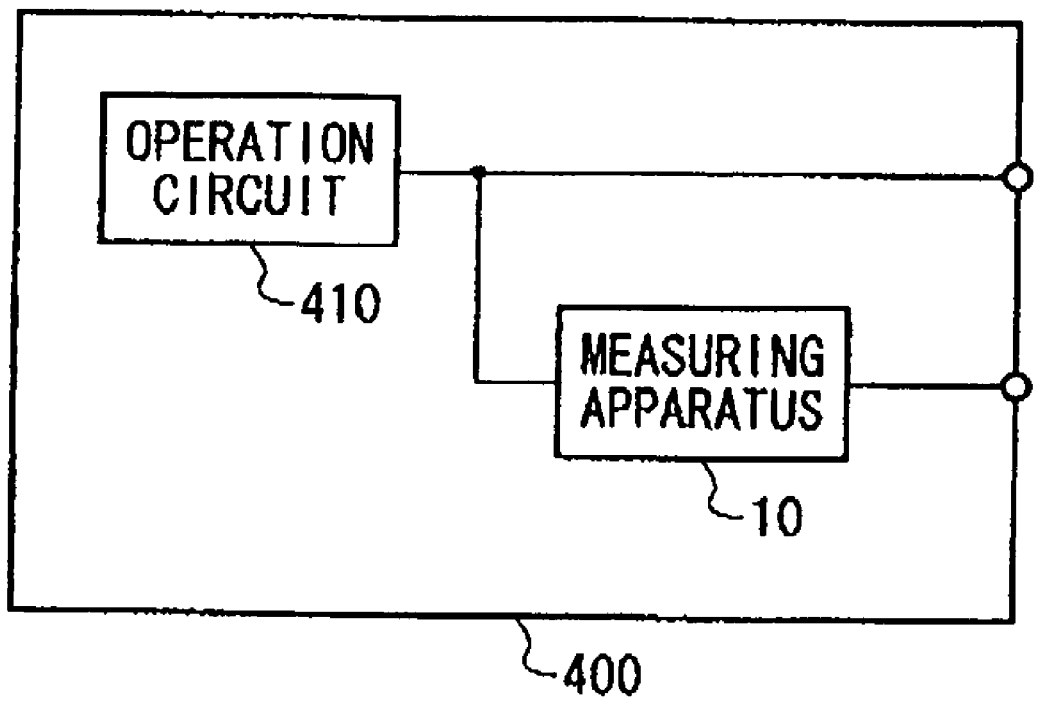
FIG. 18 is a diagram showing one exemplary configuration of an electronic device according to another embodiment of the invention.

FIG. 18 shows an example of configuration of an electronic device 400 according to an embodiment of the present invention. The electronic device 400 includes an operation circuit 410 that generates a signal-under-test and a measuring apparatus 10. For example, the electronic device 400 may have a part of the configuration of the operation circuit 410 and the measuring apparatus 10 within a package formed of such as resin and ceramic.

The operation circuit 410 operates in response to a signal inputted from external and outputs a signal-under-test to off-chip. The measuring apparatus 10 measures the signal-under-test outputted by the operation circuit 410.

The measuring apparatus 10 may have the same configuration as that of the measuring apparatus 10 described with reference to FIG. 1-FIG. 16. Additionally, the measuring apparatus 10 may have the same configuration as that of the measuring apparatus 10 which will be described with reference to FIG. 19-FIG. 45. For example, the measuring apparatus 10 may include the comparator(s) 20 and the capture memory 40. In this case, the comparators(s) 20 receive(s) strobes described with reference to FIG. 1-FIG. 16. The strobe may be provided from the outside, and also may be generated within the electronic device 400.

When a strobe is generated within the electronic device 400, it is preferred that the electronic device 400 further include a strobe timing generator 30. As described with reference to FIG. 1-16, the capture memory 40 stores the measurement result obtained by equivalently sampling the signal-under-test at high frequency.

Therefore, jitter in the electronic device 400 can be accurately measured by accessing the comparison result stored in the capture memory 40. In this case, it is not necessary for an external device to measure the high-speed, signal-under-test, so that the cost of the external equipment can be reduced.

Figure 19:
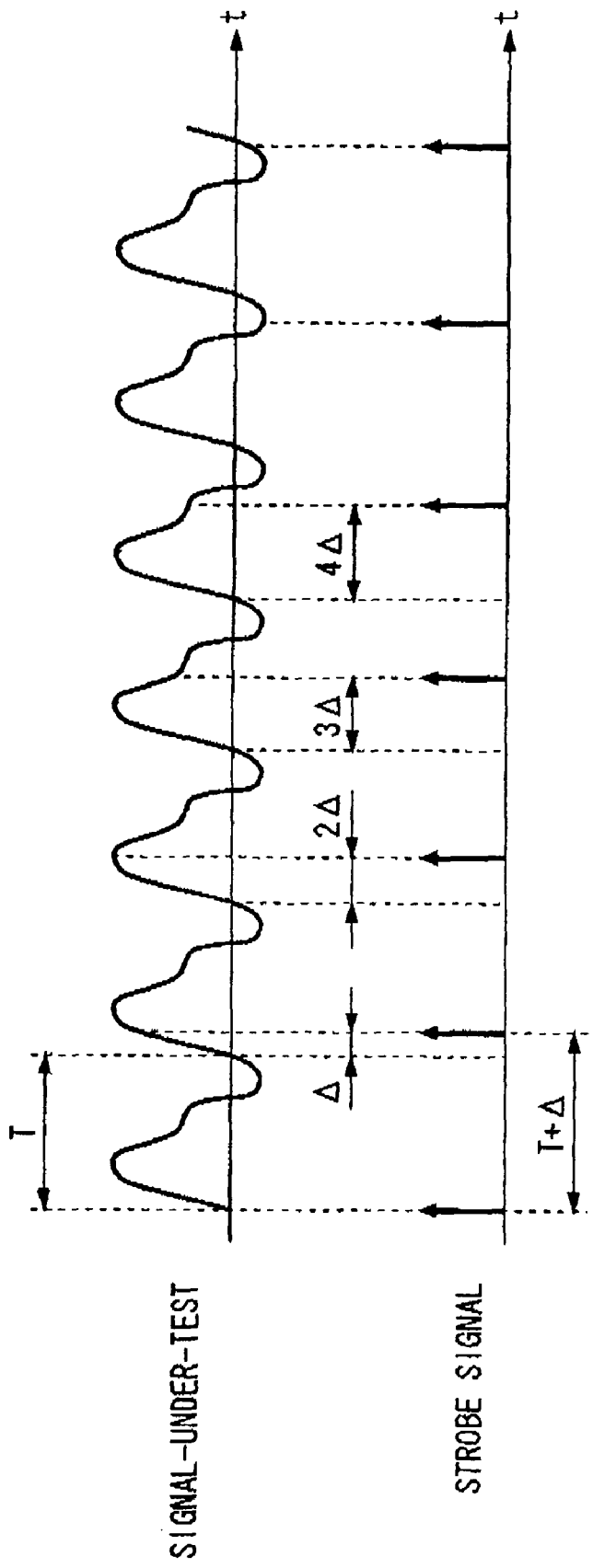
FIG. 19 is a diagram showing a strobe signal generated by the strobe timing generator 30.

FIG. 19 shows an example of strobe generated by the strobe timing generator 30. The strobe timing generator 30 according to the present embodiment may be used for any of the measuring apparatuses 10 in FIG. 1-FIG. 10. The strobe timing generator 30 according to the present embodiment sequentially generates strobes at a period (T+Δ) different from the period (T) of the signal-under-test by a predetermined value (Δ). That is, the strobe timing generator 30 generates strobes of which phase relative to the phase of the signal-under-test is gradually changed. The signal-under-test in the present embodiment is a signal having substantially the same waveform for the period T.

Additionally, the strobe timing generator 30 according to the present embodiment may generate a strobe signal at a cycle which does not satisfy Nyquist theorem for the signal-under-test That is, the strobe timing generator 30 according to the present embodiment undersamples the signal-under-test. For example, the strobe timing generator 30 generates a strobe signal at a cycle larger than half of that of the signal-under-test. In the present embodiment, the strobe generator 30 generates strobe signals at a cycle larger than that of the signal-under-test at even intervals as shown in FIG. 19.

As described above, by gradually changing the relative phase between the strobe and the repetitive signal-under-test, the signal-under-test can be equivalently sampled with the fine time resolution.

For example, in a case that the period of the signal-under-test is 400 ps and the period of the strobe signal is 405 ps, the phase of the strobe signal relative to that of the signal-under-test is changed by 5 ps for each period. The waveform is substantially the same for each period of the signal-under-test, so that the signal-under-test can be equivalently sampled at the period 5 ps.

The capture memory 40 may store therein the comparison results outputted by the comparator 20 in accordance with the strobes in chronological order. The digital signal converting section 50 may retrieve the comparison result with the predetermined number of points, converts the same to a digital signal and inputs the same to the digital signal processing section 60.

For example, from the capture memory 40, the digital signal converting section 50 may retrieve the comparison results with the total number of samples, which is determined by satisfying the restriction of corresponding to the integer number of cycles of the signal-under-test. That is, the digital signal converting section 50 may obtain the division result by calculating (the period of the signal-under-test)/(the difference between the period of the strobe and the period of the signal-under-test), and retrieve data with the integer multiple of the division result from the comparison results being continuously stored in the capture memory 40.

As described in the embodiment in the case that the period of the signal-under-test is 400 ps and the period of the strobe is 405 ps, the number of points of the comparison result corresponding to one cycle of the signal-under-test is 160 point. In this case, the signal transforming section 50 may retrieve from the capture memory 40 the comparison result with the number of points being integer multiple of 160 as a discrete waveform. Therefore, a processing such as a Fourier Transform can be performed without multiplying the discrete waveform by a window function such as a Hanning window. Accordingly, a measurement with a high frequency resolution can be achieved in comparison with the case that the window function is used. Additionally, the measurement time can be minimized. The digital signal converting section 50 may retrieve the maximum number of points of the comparison result corresponding to multiple number of cycles of the signal-under-test within the number of points of the comparison result stored in the capture memory.

Figure 20A:
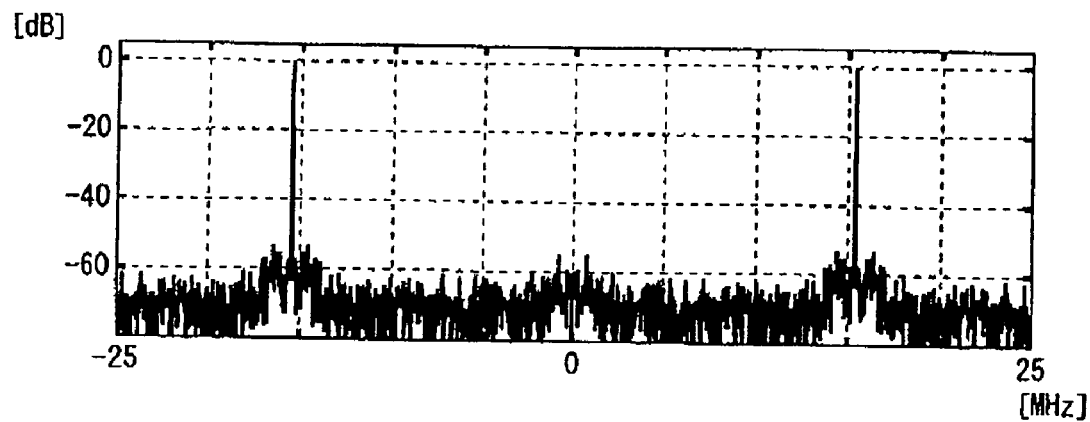
FIG. 20 is a diagram explaining an example of operation of the digital signal processing section 60.

FIG. 20 and FIG. 21 are diagrams explaining an example of operation of the digital signal processing section 60, respectively. The digital signal processing section 60 performs a Fourier-transform on the digital signal inputted from the digital signal converting section 50 and converts the same to a signal in the frequency domain. FIG. 20A shows an example of digital signal in the frequency domain.

At this time, when the number of points of data inputted from the digital signal converting section 50 is power-of-two, the digital signal processing section 60 may perform a Fast-Fourier Transform on the retrieved data. Alternatively, when the number of points of data inputted from the digital signal converting section 50 is not power-of-two, the digital signal processing section 60 may perform a Fourier Transform on the retrieved data with the mixed-radix algorithm. For example, when the number of points of data is power-of-two, i.e. the radix is only two, the digital signal processing section 60 may perform a Fast Fourier Transform. Additionally, when the number of points of data is indicated by the product of a plurality of radixes or the mixed radix, the digital signal processing section 60 may calculate by performing the mixed-radix FFT, the prime factor FFT or the split-radix FFT dependent on the number of points of the radix. Moreover, discrete Fourier Transform corresponding to a single frequency may be repeatedly performed by the number of lines required.

Figure 20B:
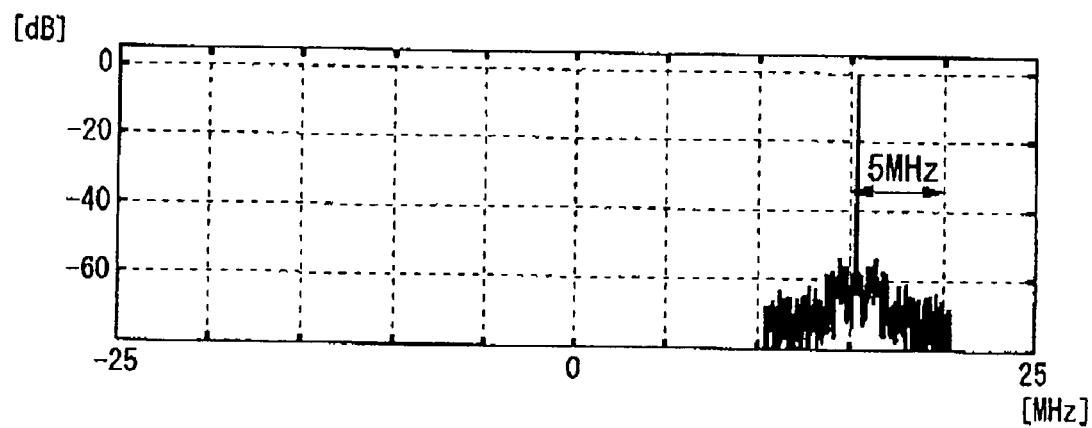

Next the digital signal processing section 60 extracts the frequency component around the carrier frequency of the signal-under-test FIG. 20B shows an example of extracted frequency component FIG. 20B shows an example of frequency component extracted when the carrier frequency of the signal-under-test is about 16 MHz, and the cutoff frequency is about 15 MHz+−5 MHz.

Figure 21A:
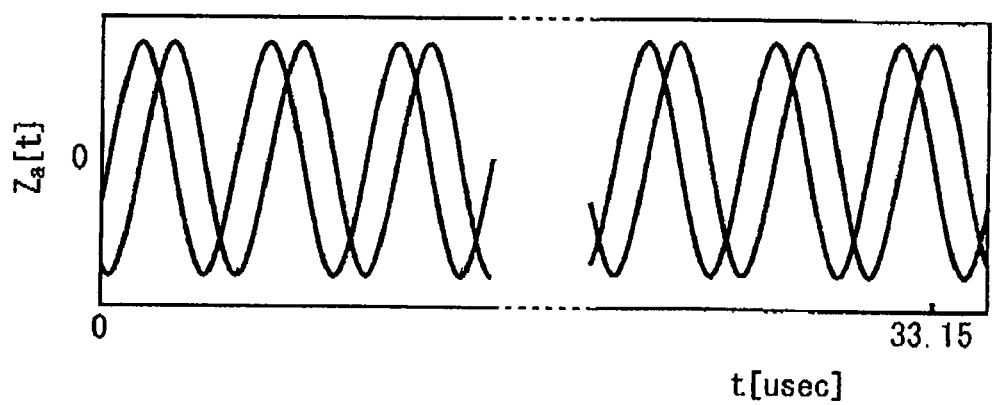
FIG. 21 is a diagram explaining an example of operation of the digital signal processing section 60.

Next, the digital signal processing section 60 performs inverse Fourier Transform on the extracted frequency components to convert the same to a signal in the time domain. FIG. 21A shows an example of signal in the time domain. By such processing, the analytic signal of the signal-under-test can be obtained.

Figure 21B:
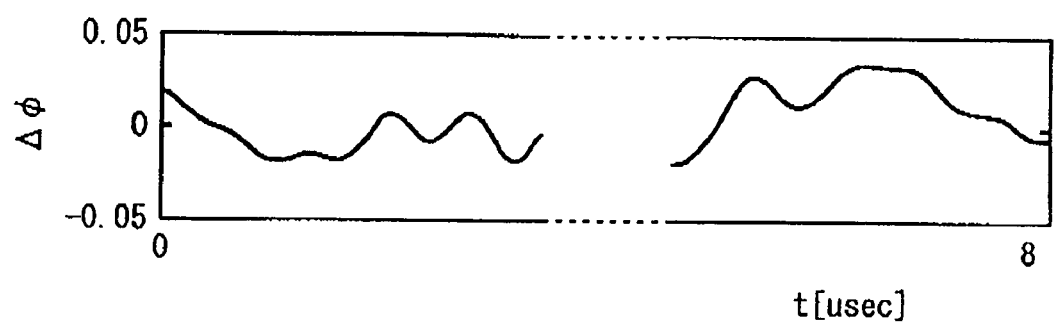

Next, the digital signal processing section 60 calculates the instantaneous phase $\phi(t)$ of the signal-under-test based on the analytic signal. Additionally, the digital signal processing section 60 calculates the instantaneous phase noise $\Delta\phi(t)$ of the signal-under-test by removing the linear component from the instantaneous phase. The method of calculating the instantaneous phase noise $\Delta\phi(t)$ from the instantaneous phase $\phi(t)$ is the same as the method shown in FIG. 6A. FIG. 21B shows an example of calculated instantaneous phase noise $\Delta\phi(t)$.

As described with reference to FIG. 6B, the digital signal processing section 60 can calculate jitter of the signal-under-test based on the calculated instantaneous phase noise $\Delta\phi(t)$. Here, the accuracy of the calculated instantaneous phase noise $\Delta\phi(t)$ is changed depending on the difference between the period of the signal-under-test and that of the strobe signal, i.e. the time resolution.

Figure 22:
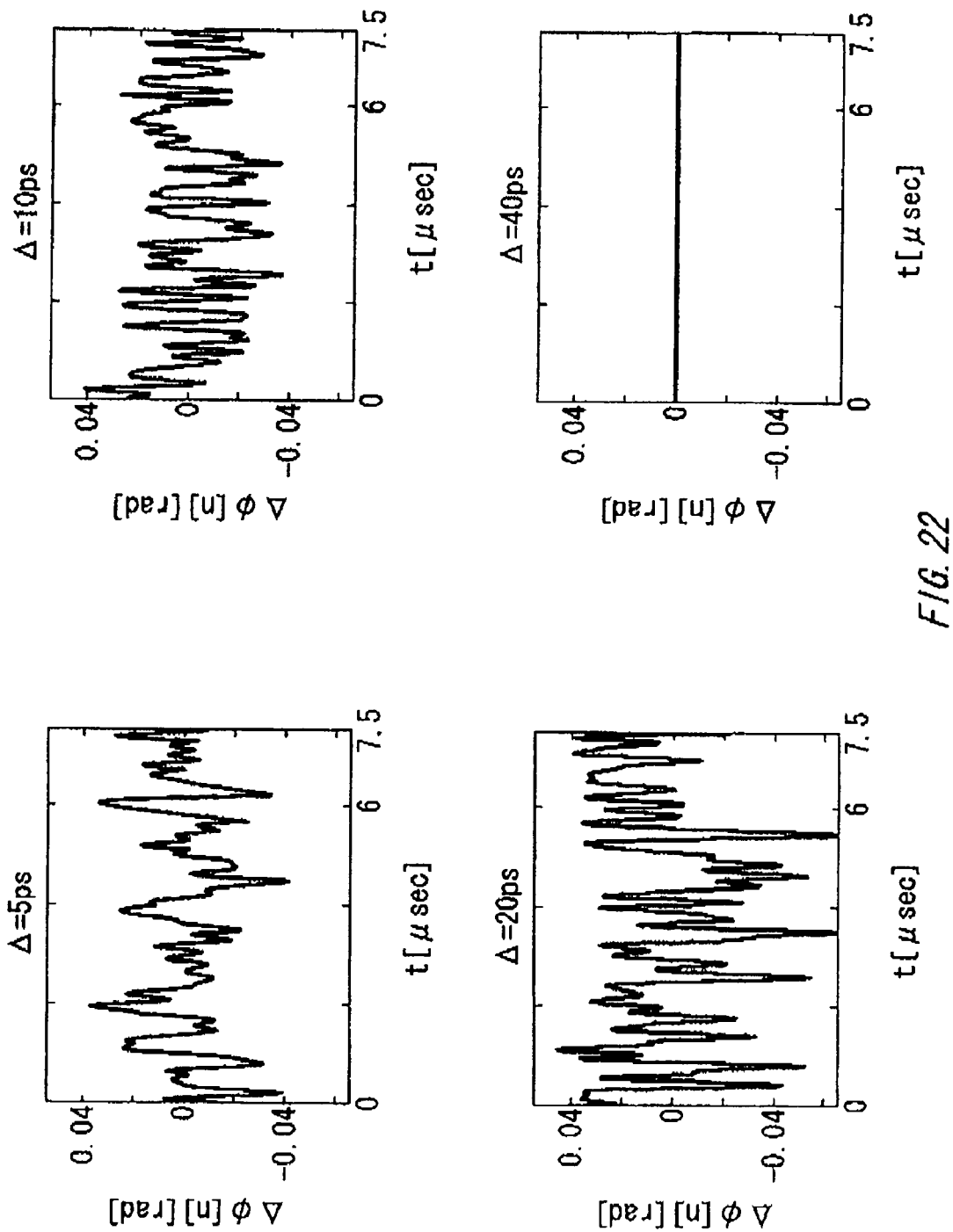
FIG. 22 is a diagram an example of instantaneous phase noise $\Delta\phi(t)$ obtained by sampling a signal-under-test with a strobe signal having a cycle resolution ($\Delta$) from the cycle of the signal-under-test.

FIG. 22 shows an example of instantaneous phase noise $\Delta\phi(t)$ calculated when the cycle resolution (hereinafter referred to as cycle resolution) between the period of the signal-under-test and that of the strobe signal is changed. In the present embodiment, the instantaneous phase noise for each of the cycle resolution (Δ) 5 ps, 10 ps, 20 ps, and 40 ps is indicated. When the cycle resolution (Δ) is changed as shown in FIG. 22, the waveform of the calculated instantaneous phase noise is changed. Therefore, it is preferred that the cycle resolution (Δ) is selected as a value smaller than the random jitter value of the signal-under-test, the standard deviation and the rms value.

Figure 23:
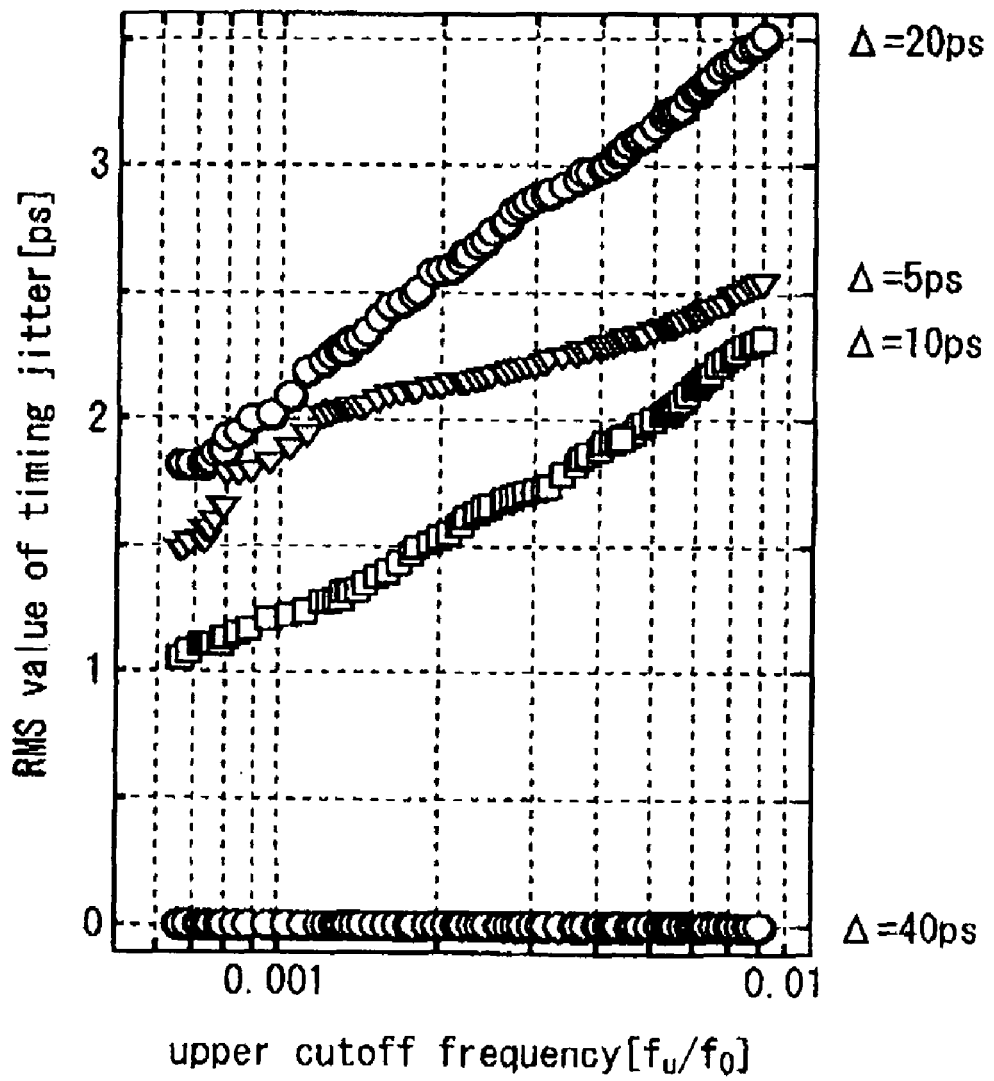
FIG. 23 is a diagram illustrating the measuring bandwidth dependency of the jitter value calculated for each cycle resolution ($\Delta$).

FIG. 23 is a diagram illustrating the measurement band width dependency of the jitter value calculated for the cycle resolution (Δ). The jitter value according to the present embodiment is calculated for each cycle resolution (Δ) when the rms value of the jitter variation included in the signal-under-test is 2 ps. Here, the horizontal axis in FIG. 23 is corresponding to the cutoff frequency shown in FIG. 23.

Figure 24:
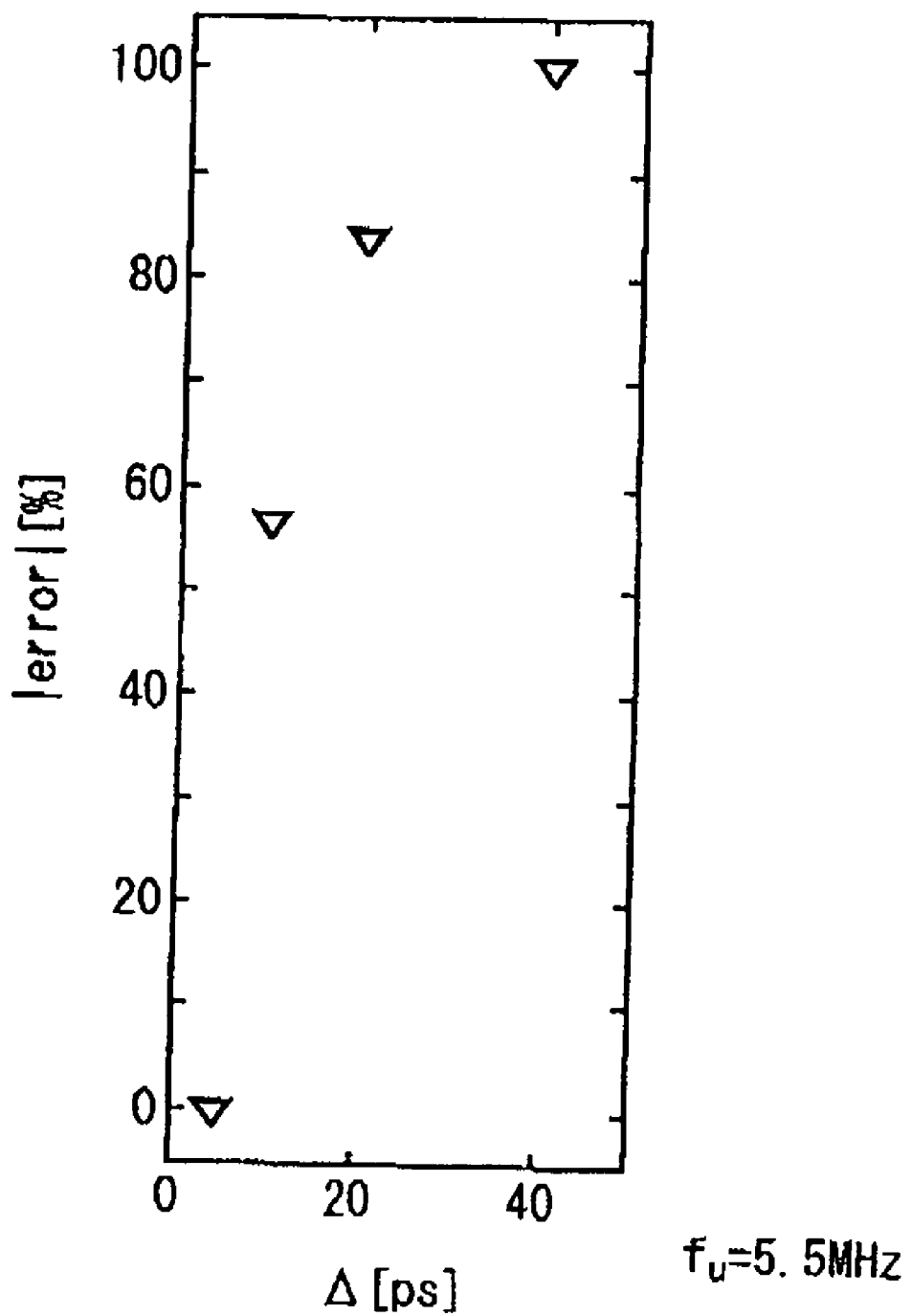
FIG. 24 is a diagram showing an example of measurement error of the jitter value calculated for the cycle resolution ($\Delta$) between each cycle.

FIG. 24 is a diagram showing an example of measurement error of the jitter value calculated for each cycle resolution (Δ). In the present example, the measurement value when the cycle resolution (Δ) is 5 ps is the true value.

As shown in FIG. 23 and FIG. 24, as the cycle resolution (Δ) is increased, the measurement error of the jitter value is rapidly increased.

The strobe timing generator 30 may set the period of the strobe so as to more reduce the cycle resolution (Δ). For example, when a plural kinds of periods can be selected as the period of the strobe in the strobe timing generator 30, the strobe timing generator 30 may select a period for which the cycle resolution (Δ) is more reduced.

Additionally, the strobe timing generator 30 may set the period of the strobe such that the value of the cycle resolution (Δ) is determined in accordance with the amplitude of jitter to be measured or the time resolution for calculating jitter. For example, if the amplitude value of the jitter to be measured or the jitter value to be calculated is provided, the strobe timing generator 30 may sequentially set the cycle resolution of the strobe signals as two times the rms value of jitter or less than the value of the required time resolution. Here, the jitter value to be measured may be the peak-to-peak value of the timing jitter. Additionally, it is preferred that the value of the period of the signal-under-test is provided to the strobe timing generator 30.

The maximum value of the difference between the timing for each edge of the signal-under-test and the ideal timing, i.e. timing jitter is determined by the value of timing jitter. That is, a probability for which each edge of the signal-under-test is deviated from the ideal timing changes in accordance with the value of jitter. Therefore, each edge of the signal-under-test may be deviated within two-three times of jitter value from the ideal timing. Alternatively, the cycle resolution (Δ) of being less than two times of the jitter value can be used to accurately detect the timing jitter (the difference between the timing of the signal-under-test and its ideal timing) in the signal-under-test Additionally, by setting the cycle resolution (Δ) be less than an appropriate time resolution for calculating the jitter value, the jitter value at the time resolution can be more accurately calculated.

Meanwhile, the cycle resolution (Δ) may be defined based on the standard deviation of the probability density function of jitter in the signal-under-test. Hereinafter, an example of procedure to define the cycle resolution (Δ), i.e. an equivalent sampling interval based on the standard deviation will be described.

Figure 25A:
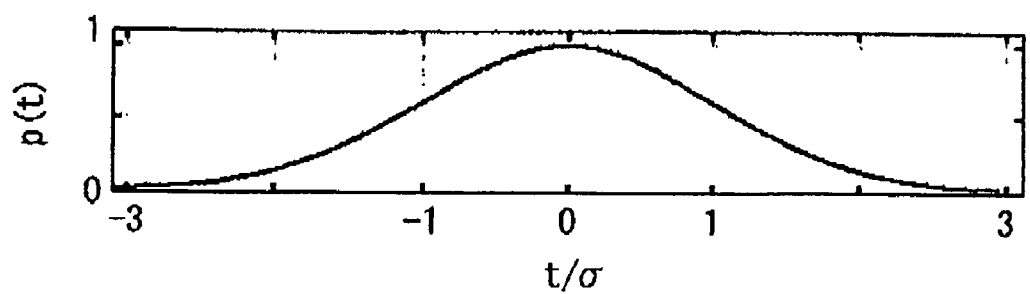
FIG. 25A shows an example of probability density function p(t) of jitter in the signal-under-test.

FIG. 25A shows an example of probability density function p(t) of jitter in a signal-under-test. Here, the horizontal axis indicates the time normalized by the standard deviation of the probability density function p(t) in FIG. 25A.

Normalized mean square error of the jitter measurement is given by the following expression.

$$\varepsilon^2[p(t)] = \frac{c^2}{2BTWp(t)} + \frac{W^4}{576}\left(\frac{p''(t)}{p(t)}\right)^2 \quad \text{expression (1)}$$

Here, the first term of the right-hand side of the expression (1) indicates a random error among the measurement error. Additionally, the second term of the right-hand side of the expression (1) indicates a bias error among the measurement errors. W is the interval for which the signal-under-test is observe d, i.e. is proportional to the cycle resolution. P″(t) indicates the second derivative of the probability density function p(t). Moreover, with rest to each constant of the random error of the first term of the right-hand side, refer to the following document: "Analysis and Measurement Procedure 3rd ed.", pp. 290, J. S. Bendat and A. G. Piersol.

As evidenced by the expression (1), jitter component in the signal-under-test can be accurately measured provided that the observation interval W, i.e. cycle resolution (Δ) is sufficiently reduced. That is, the second term of the right-hand side of the expression (1) is substantially zero and the measurement error due to the bias error is removed, so that jitter component can be accurately measured.

In theory, by sufficiently increasing the resolution for setting the period of the strobes, the cycle resolution (Δ) can be sufficiently reduced. However, it is difficult to realize any circuit being capable of such strobes.

Moreover, if such circuit is provided in the measuring apparatus 10, the cost of the measuring apparatus 10 could be increased. Additionally, when the value which can be set for the period of the strobes is limited, it is difficult to sufficiently reduce the cycle resolution.

Thus, hereinafter it will be described that jitter component in the signal-under-test can be accurately measured by appropriately selecting the period of the strobes even if the value to be set for the period of the strobes is limited and the resolution for setting the period is relatively coarse.

When the jitter in the signal-under-test follows Gaussian distribution, the probability density function p(t) is given by the following expression.

$$p(t) = (\sigma\sqrt{2\pi})^{-1}\exp\left[-\frac{t^2}{2\sigma^2}\right] \quad \text{expression (2)}$$

Here, σ indicates the standard deviation of the probability density function of the jitter in the signal-under-test.

Based on the expression (2), factor $(p''(t)/p(t))^2$ of the second term of the right-hand side of the expression (1) is given by the following expression.

$$\left(\frac{p''(t)}{p(t)}\right)^2 = \frac{1}{\sigma^4}(t+\sigma)^2(t-\sigma)^2 \quad \text{expression (3)}$$

Figure 25B:
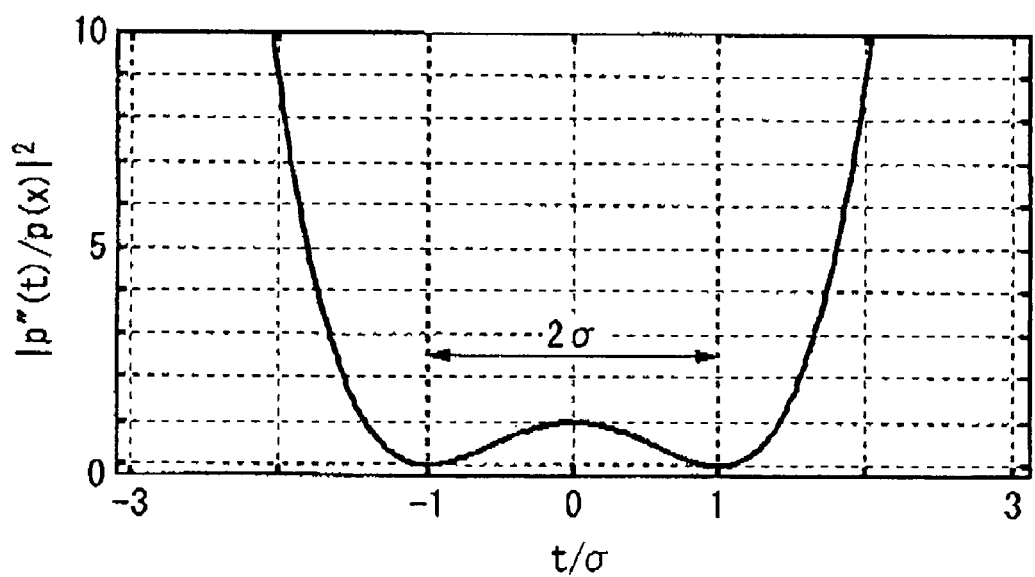
FIG. 25B shows an example of curve of a function indicated by Equation (3)

FIG. 25B shows an example of shape of the function of the expression (3). As shown in the expression (3) and FIG. 25B, when |t⊕=σ, the second team of the right-hand side of the expression (1) is substantially zero. That is when the cycle resolution (Δ) of the strobe signal and the signal-under-test i.e. the measurement interval is 2σ, the second term of the right-hand side of the expression (1) is substantially zero, so that the bias error among the measurement errors can be removed and jitter component can be accurately measured.

Meanwhile, the random error of the measurement error indicated by the first term of the right-hand side of the expression (1) can be reduced by sufficiently increasing the number of measurement data.

Figure 26:
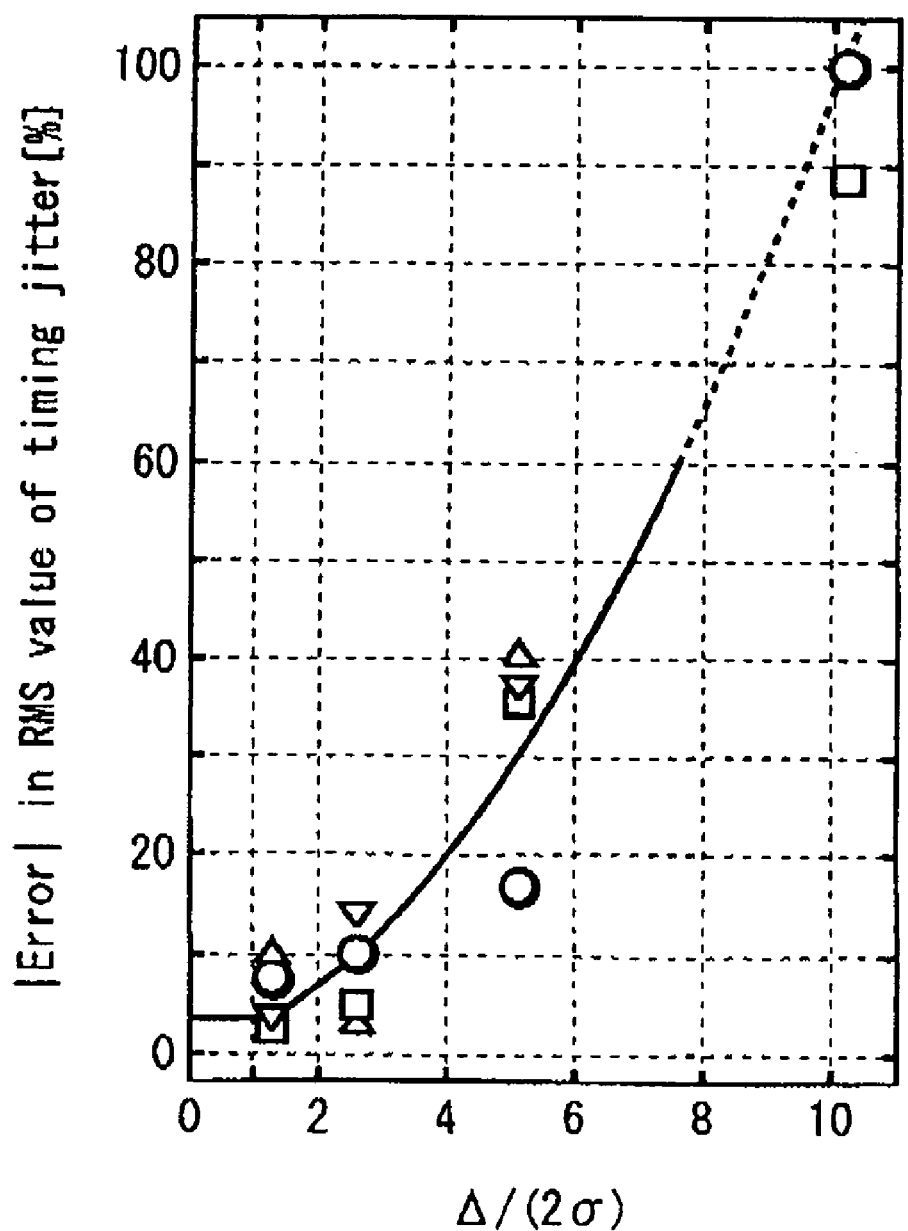
FIG. 26 shows an example of relationship between the cycle resolution ($\Delta$) and the measurement error.

FIG. 26 shows a relationship between the cycle resolution ($\Delta$) and the measurement error. The horizontal axis indicates the cycle resolution ($\Delta$) normalized by 2σ in FIG. 26. Meanwhile, the vertical axis indicates the measurement error corresponding to the above-described bias error. Additionally, measurements are performed four times as shown by circles and squares, and the measurement results are approximated by a curved line in the present embodiment.

As shown in FIG. 26, it can be observed that the measurement error is sufficiently reduced around a point where ($\Delta$) is 2σ, that is, $\Delta/2\sigma = 1$.

The strobe timing generator 30 of the measuring apparatus 10 according to the present embodiment may set or select the period of the strobes based on the standard deviation of the probability density function of jitter in the signal-under-test. For example, the strobe timing generator 30 may set the period of the strobes such that the standard deviation σ of the jitter to be measured and the period of the signal-under-test are previously provided and the cycle resolution ($\Delta$) is substantially equal to twice as large as the standard deviation σ. The strobe timing generator 30 may set the period of the strobes such that the measurement error due to bias component is fallen within allowance. In this case, it is preferred that the strobe timing generator 30 sets the period of the strobes such that the cycle resolution ($\Delta$) is around twice as large as the standard deviation σ.

Additionally, when a plural kinds of periods which can be selected as the period of the strobes is previously set, the strobe timing generator 30 may select the period of the strobe such that the cycle resolution ($\Delta$) is maximally close to a value twice as large as the standard deviation σ.

Hereinbefore, a case that the probability density function of jitter in the signal-under-test is Gaussian distribution has been described, however, the jitter to be measured is not limited to the jitter having Gaussian distribution. Even if the jitter has the other distribution, the period of the strobes can be appropriately set based on the standard deviation of jitter by the process the same as the process described with reference to FIG. 25 and FIG. 26.

Hereinbefore, it was theoretically derived that the optimum cycle resolution ($\Delta$) is 2σ and the theory was experimentally validated shown in FIG. 26. Here, in the expression (1) and the expression (3), the parameter for the sampling is only the observation interval W, so that the expression (1) and the expression (3) are effected independent of any sampling method. That is, the expression (1) and the expression (3) can be effectively used not only by an equivalent sampling (undersampling) but also a real time-sampling (over-sampling). FIG. 7 experimentally validates that the optimum cycle resolution ($\Delta$) is 2σ also for the real time sampling.

Figure 27:
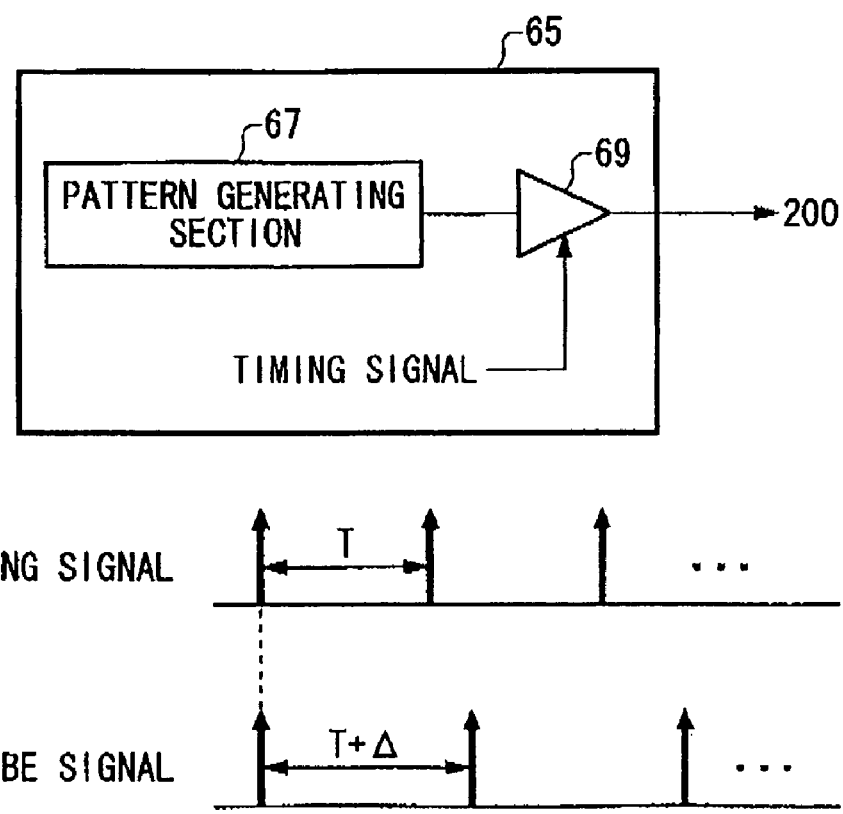
FIG. 27 shows an example of configuration of a pattern generator 65 included in the testing apparatus 100 shown in FIG. 17.

FIG. 27 shows an example of configuration of the pattern generator 65 included in the testing apparatus 100 shown in FIG. 17. The pattern generator 65 includes a pattern generating section 67 that generates a signal pattern of a test signal and a driver 69 that outputs the test signal based on the signal pattern. The driver 69 operates according to a predetermined test rate and causes the device under test 200 to output a signal-under-test with a period corresponding to the test rate or the integral multiple of the test rate. The driver 69 receives a timing signal with a period corresponding to the test rate T and causes the device under test 200 to output a signal-under-test corresponding to the period in the present embodiment.

Meanwhile, the strobe timing generating section 30 generates a strobe at a period T+Δ, which is grater than the test rate T by a predetermined value. By such operation, a high-speed signal-under-test can be accurately measured with lower operation frequency. It is preferred that plural kinds of differences Δ are prepared for the period of the strobe which can be selected for the test rate T. For example, plural sets of timings which can be set for the strobe timing generating section 30 are prepared, and the cycle resolution Δ between the test rate and the strobe when each timing set is set may be previously measured.

The strobe timing generator 30 may select the timing set in which the cycle resolution Δ of the period is minimum among the timing sets, and also may select the timing set in which the cycle resolution Δ of the period is less than the value twice as large as the jitter value to be measured.

Figure 28:
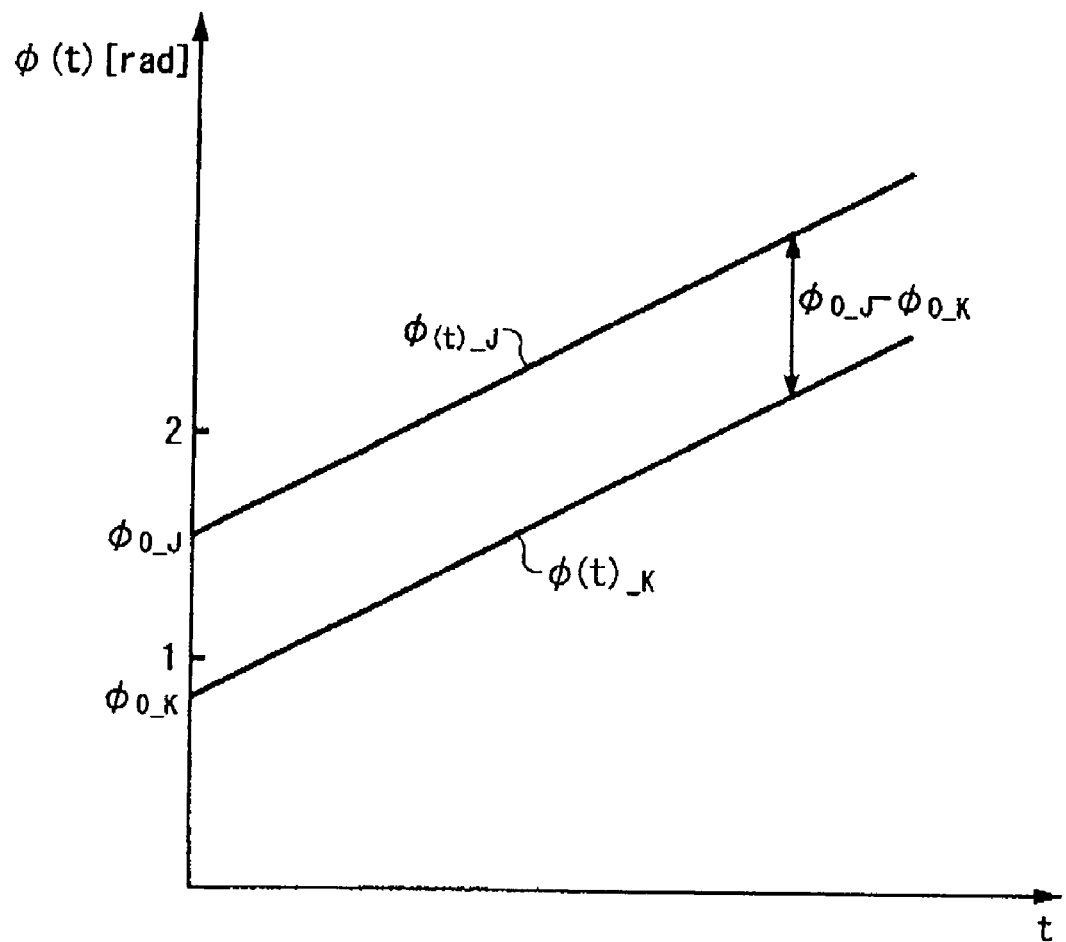
FIG. 28 shows an example of instantaneous linear phase $\phi_J(t)$ and $\phi_K(t)$ of a signal-under-test J and a signal-under-test K.

FIG. 28 shows an example of instantaneous phase φ of a signal-under-test K and a signal-under-test J. The testing apparatus 100 may calculate a deterministic skew between two signals based on the offset values $\phi_{0\_K}$ and $\phi_{0\_J}$. Here, the deterministic skew is the different between electrical lengths of the paths through which two signals are propagated.

For example, the discrete signal converting section 50 and the digital signal processing section 60 may calculate $\phi_{0\_K}$ and $\phi_{0\_J}$ which are the values of the instantaneous phase φ(t) for each signal-under-test and calculate the difference between $\phi_{0\_K}$ and $\phi_{0\_J}$ as the deterministic skew. Additionally, the discrete signal converting section 50 and the digital signal processing section 60 may calculate the deterministic skew in time unit by dividing the deterministic skew calculated in radian unit by $2\pi f_0$. Meanwhile, the discrete signal converting section 50 and the digital signal processing section 60 may convert the instantaneous phase noise φ (t) in radian unit to the instantaneous phase noise (t) in time unit and calculate the deterministic skew in time unit based on the difference between the initial value for each instantaneous phase φ(t).

Additionally, the discrete signal converting section 50 and the digital signal processing section 60 may calculate the random skew between two signal-under-tests based on instantaneous phase noise Δφ(t) for each of two signal-under-tests.

Figure 29A:
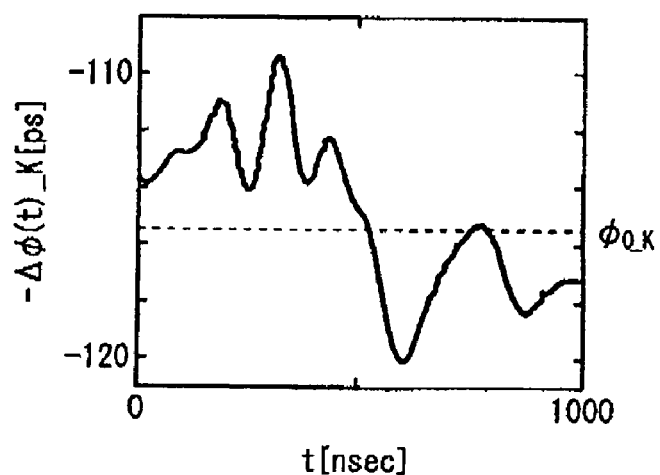
FIG. 29 is explanatory diagram of a method of measuring random skew between the signal-under-test K and the signal-under-test J.
Figure 29B:
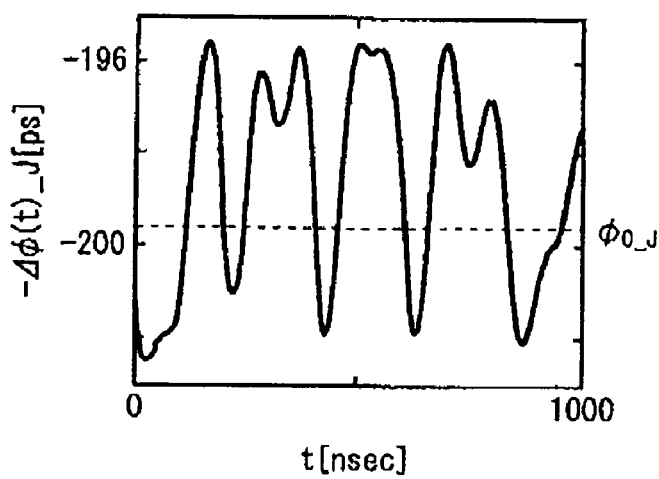
Figure 29C:
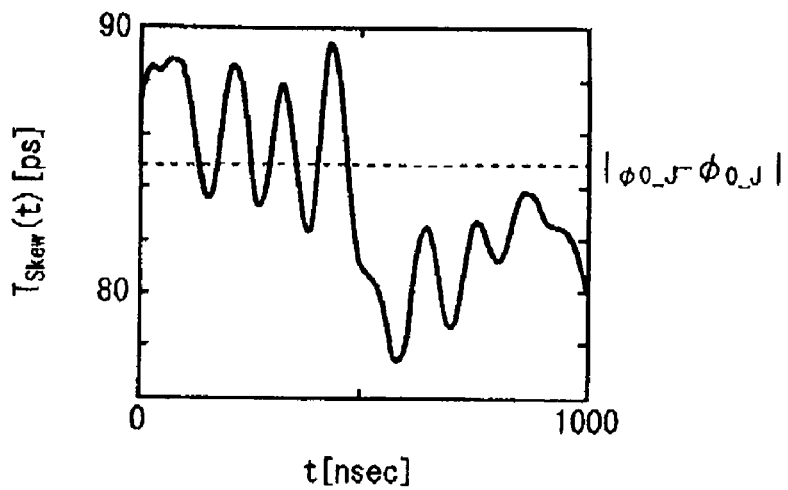

FIG. 29 is explanatory diagram of a method of measuring random skew between the signal-under-test K and the signal-under-test J. FIG. 29B shows an example of instantaneous phase noise $\Delta\phi(t)\_K$ of the signal-under-test K. FIG. 29B shows an example of instantaneous phase noise $\Delta\phi(t)\_J$ of the signal-under-test J. FIG. 29C shows an example of random skew between the signal-under-test K and the signal-under-test J. Here, the instantaneous phase noise Δφ(t) is a value obtained by subtracting a linear component $2\pi f_{beat}$ from the instantaneous phase φ(t) in FIG. 29. Here, the $f_{beat}$ is a frequency for equivalently sampling the signal-under-test with the cycle resolution (Δ) For example, the $f_{best}$ may be indicated by the following expression:

$$f_{beat} = \frac{1}{2T} - \frac{1}{2(T+\Delta)}$$

The random skew is corresponding to the difference between the instantaneous phase Δφ(t) of the signal-under-test K and the instantaneous phase Δ (t) of the signal-under-test J, so that the random skew $T_{skew}(t)$ shown in FIG. 29C can be derived by calculating the difference between the instantaneous phase Δφ(t) shown in FIG. 29A and the instantaneous phase Δφ(t) shown in FIG. 29B. For example, the discrete signal converting section 50 and the digital signal processing section 60 may calculate the random skew.

Additionally, when the testing apparatus 100 measures the deterministic skew or the random skew described in FIG. 28 and FIG. 29, it is preferred that the testing apparatus 100 has two comparators 20 at the same time. Additionally, the same strobes are provided to the comparators 20. That is, the testing apparatus 100 under-samples two signal-under-tests inputted to the comparators 20 at a time.

Then, as described above, the instantaneous phase φ(t) for each signal is calculated, and then, the offset value at a predetermined time (e.g. T=0) for each instantaneous phase φ(t) is calculated. The difference between the calculate values indicates the deterministic skew. Such processing may be performed by the discrete signal converting section 50 and the digital signal processing section 60. Additionally, the testing apparatus 100 may have two capture memories 40 corresponding to two comparators 20. The discrete signal converting section 50 and the digital signal processing section 60 receive data from two capture memories 40 and calculate the above-described deterministic skew and random skew.

Figure 30:
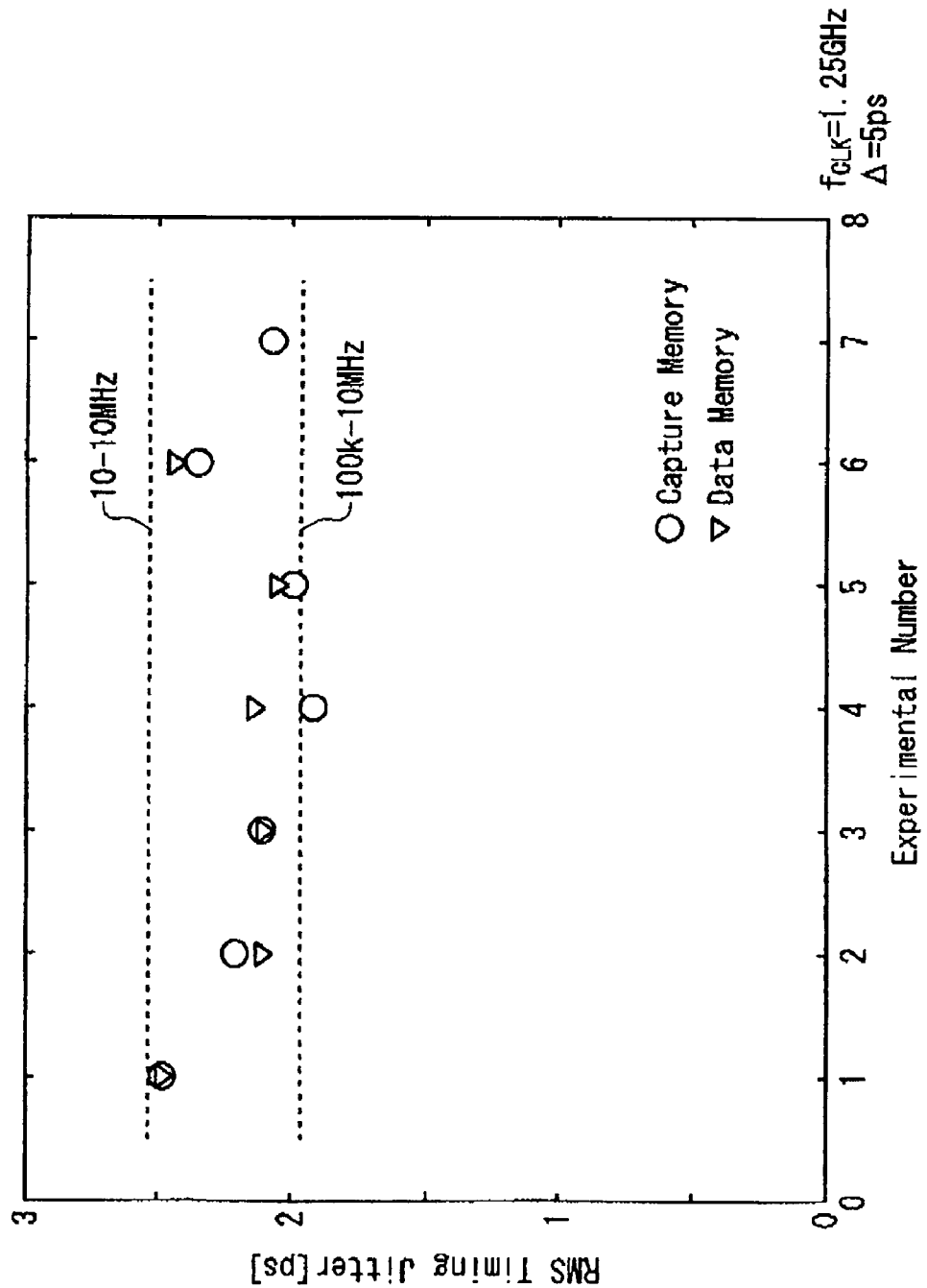
FIG. 30 is a diagram showing a comparison between the jitter measurement result of the testing apparatus 100 and the jitter measurement result of the conventional jitter measuring apparatus.

FIG. 30 shows a comparison between a jitter measurement result by the testing apparatus 100 and a jitter measurement result by using a signal source analyzer E5052A. The range of the result of jitter measurement by using the signal source analyzer is indicated by dotted lines in FIG. 30. The signal source analyzer may be a general measuring apparatus having a function to measure jitter.

Additionally, the results of jitter measurement are plotted by circles and triangles in the measurement result used in order to measure jitter. That is, FIG. 30 shows that jitter can be accurately measured by using the testing apparatus 100.

Figure 31:
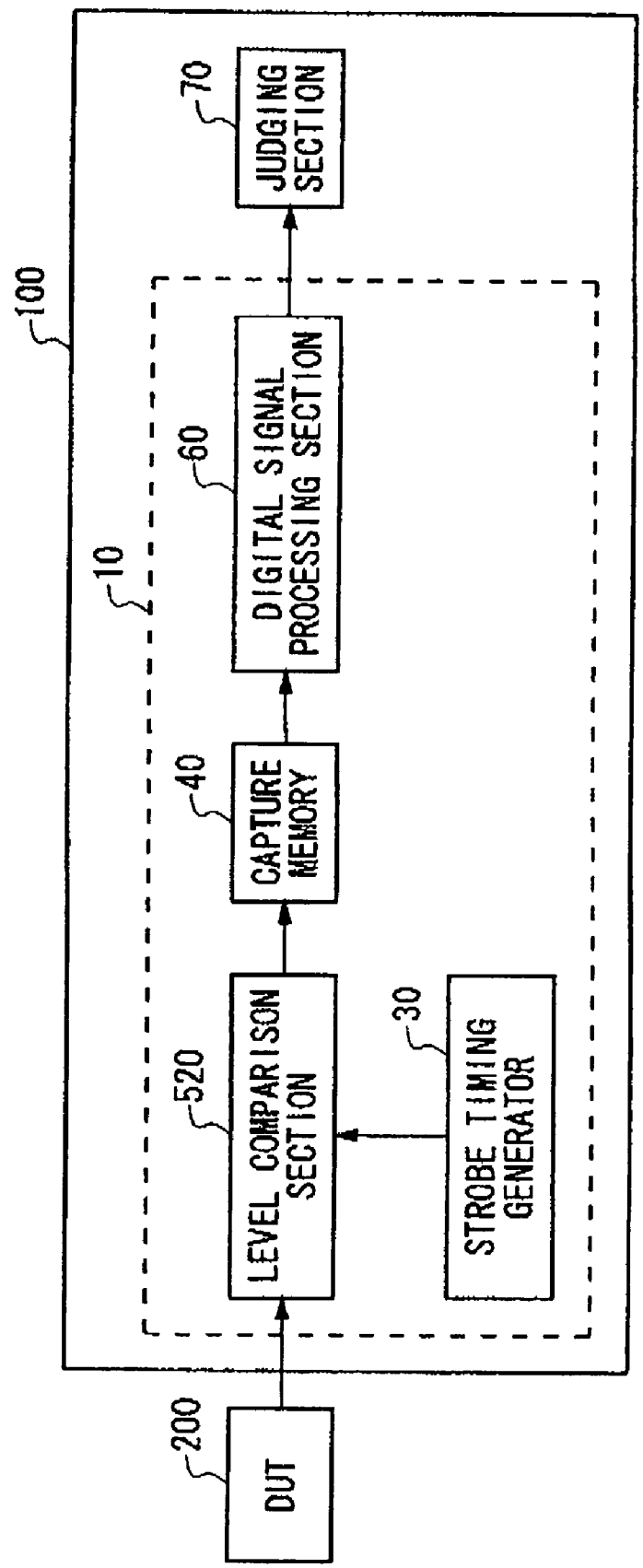
FIG. 31 shows another configuration of the testing apparatus 100.

FIG. 31 shows another example of configuration of the testing apparatus 100. The testing apparatus 10 according to the present embodiment includes a measuring apparatus 10 and a judging section 70. Additionally, the measuring apparatus 10 includes a level comparison section 520, a strobe timing generator 30, a capture memory 40 and digital signal processing section 60.

The strobe timing generator 30 sequentially generates strobes which are arranged at substantially even time intervals and each of which interval is larger than a bit time interval of the level of the signal-under-test is changed. Additionally, the signal-under test may be a signal of which signal level is alternatively changed to/from H level/L level for each bit time interval.

The level comparison section 520 detects the signal level of the signal-under-test at a timing at which each strobe is sequentially provided. The level comparison section 520 may detect the signal level of the signal-under-test by using the comparator 20 described with reference to FIG. 1. The voltage comparator 520 may sequentially compare the voltage value of the signal-under-test and the given threshold voltage value at a timing at which each strobe is sequentially provided. For example, the level comparison section 520 may output logical value 1 when the voltage value of the signal-under-test is greater than the threshold voltage value, and output a logical value −1 when the comparison section 520 may compare a plurality of threshold voltage value different from each other with the voltage value of the signal-under-test. In this case, the level comparison section 520 outputs plural kinds of logical values corresponding to plural kinds of comparison results.

The captures memory 40 stores therein the signal level outputted by the level signal comparison section 40. The capture memory 40 may store the logical values sequentially outputted by the level comparison section 40 in chronological order.

The digital signal processing section 60 calculates the measurement result of the signal-under-test based on the data series stored in the capture memory 40. The data series may be the time-series logical values described above, for example. Additionally, the digital signal processing section 60 may measure such as the waveform, the spectrum, the jitter, the instantaneous phase and the instantaneous phase noise of the signal-under-test based on the data series, for example. Moreover, the digital signal processing section 60 may calculate the skew between two signal-under-tests. Further, the digital signal processing section 60 may calculate the gain of the jitter transfer function between the input and the output of the device under test 200. Further, the digital signal processing section 60 may calculate the bit error rate (BER) of the device under test 200. The operation of the measuring apparatus 10 for each measuring object will be described later with reference to FIG. 32-FIG. 45.

Figure 32:
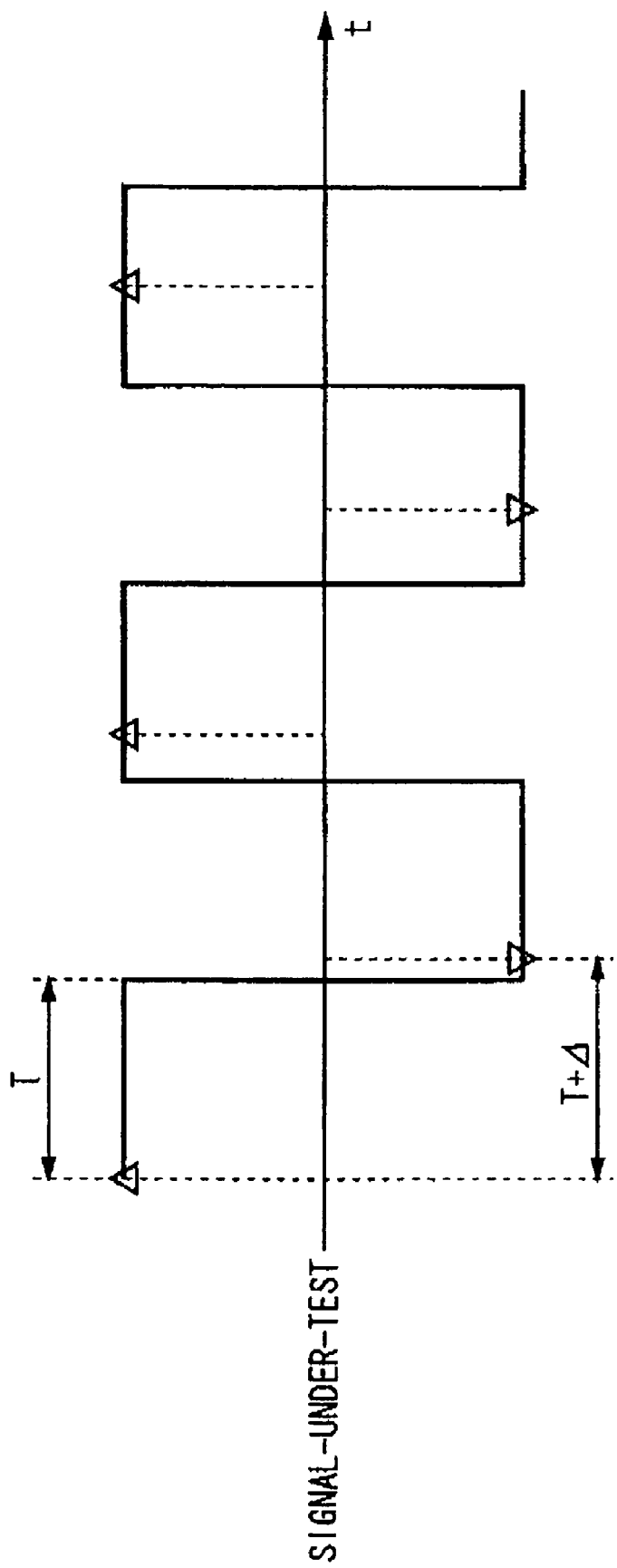
FIG. 32 shows an example of strobe generated by the strobe timing generator 30.

FIG. 32 shows an example of strobe generated by the strobe timing generator 30. The bit time interval of the signal-under-test is described as T in the present embodiment. The testing apparatus 100 according to the present embodiment operates at a test rate substantially equal to the bit time interval of the signal-under-test. The strobe timing generator 30 generates equal to or less than one strobe for each test rate.

Additionally, the strobe timing generator 30 sequentially generates strobes at a period (T+Δ) different from the test rate (T) of the signal-under-test by a predetermined value (Δ). Moreover, the strobe timing generator 30 may output strobes for the signal-under-test for a period which does not satisfy Nyquist sampling theorem. For example, when the logical value of the signal-under-test is changed alternatively to H level or L level for each bit time interval, Nyquist sampling theorem is satisfied provided that the period of the strobe is less than the bit time interval (T). The strobe timing generator 30 may sequentially output strobes at a period slightly larger than the bit time interval. In this case, the level comparison section 520 detects H level and L level of the signal-under-test substantially in turn.

FIG. 33 shows an example of operation of the digital signal processing section 60. A case that a signal-under-test of which logical value is alternately changes to H level or L level for each bit time interval is measured will be described in the present embodiment. Here, the signal-under-test according to the present embodiment is a jitter free signal. Additionally, the operation of the strobe timing generator 30 is the same as that of the strobe timing generator 30 described in FIG. 32.

FIG. 33A shows an example of data series inputted to the digital signal processing section 60. As described in FIG. 32, the level comparison section 520 detects the signal-under-test over a bit interval for which the signal-under-test is in H level and a bit interval for which the signal-under-test is in L level substantially in turn.

Each of FIG. 33B and FIG. 33C shows an example of data processing by the digital signal processing section 60. Firstly, the digital signal processing section 60 compresses the data series inputted thereto into an equivalent time waveform as shown in the left figure of FIG. 33B. That is, the digital signal processing section 60 can process the data series samples at the period T+Δ as the data series equivalently sampled at the period Δ. Meanwhile, the right figure of FIG. 33B shows an example of the spectrum obtained by performing the Fourier transform on the data series shown in the left figure of FIG. 33B.

Next, as shown in the left figure of FIG. 33C, the digital signal processing section 60 inverts the data value corresponding to the odd-numbered series or the even-numbered series among the data of the data series shown in the right figure of FIG. 33B on the basis of the intermediate level of the signal-under-test.

For example, the digital signal processing section holds the original value of $1^{st}$, $3^{rd}$, $5^{th}$, $7^{th}$ $9^{th}$ . . . of data 60 among the data shown in FIG. 33A and FIG. 33B. Additionally, the digital signal processing section 60 inverts $2^{nd}$, $4^{th}$, $6^{th}$, $8^{th}$, $10^{th}$ . . . of data value on the basis of the intermediate level (=0 level in the present embodiment) of the signal-under-test. That is, the data value being logical value 1 is converted to the logical value −1, and the value being logical value −1 is converted to the logical value 1 in the present embodiment.

That is, the waveform equivalent to that obtained by sampling the signal-under-test at the sampling period Δ can be obtained by inverting the data value of either the odd-numbered data series or the even-numbered data series as shown in FIG. 33, therefore, the waveform of the signal-under-test can be more accurately reproduced.

Here, the right figure of FIG. 33C is an example of spectrum obtained by performing the Fourier transform on the data series shown in the left figure of FIG. 33C. By performing the Fourier-transform on the data series shown in the left figure of FIG. 33C, the digital signal processing section 60 can calculate the spectrum of the signal-under-test.

Additionally, the digital signal processing section 60 may multiply each data value by cos(πk) as the above-described processing to invert the data value. Here, k indicates the data number in the data series. The processing to invert the data value on the time axis is equivalent to multiplying by cos(πk), therefore, the processing to invert the data value on the frequency axis is equivalent to shifting the frequency by π.

That is, the spectrum shown in FIG. 32C can be calculated by shifting the frequency components of the spectrum shown in FIG. 33B by π. The digital signal processing section 60 may calculate the spectrum of the signal-under-test (as shown in the right figure of FIG. 33C) by shifting by π the frequency of the spectrum (the right figure of FIG. 33B) obtained by Fourier-transforming the data series (the left figure of FIG. 33B) which has not been processed to invert the data value. Further, the digital signal processing section 60 may calculate the waveform (as shown in the left figure of FIG. 33C) of the signal-under-test by performing inverse Fourier transform on the such calculated spectrum of the signal-under-test.

FIG. 34 is a diagram showing a case that a processing the same as the processing described in FIG. 33 is performed on the signal-under-test to which jitter is injected. FIG. 34A shows an example of data series inputted to the digital signal processing section 60 when the jitter is injected into the signal-under-test. FIG. 34B and 34C shows an example of data processing by the digital signal processing section 60 when the jitter is injected into the signal-under-test.

As shown in FIG. 34B and FIG. 34C, if jitter is applied to the signal-under-test, the jitter component appears in the data series. Then, jitter component corresponding to the jitter frequency also appears around the carrier frequency of the spectrum obtained by performing Fourier transform on the data series. The digital signal processing section 60 may calculate the jitter in the signal-under-test based on the spectrum.

Hereinbefore, the case that the signal-under-test is sampled at the frequency slightly larger than the bit time interval of the signal-under-test has been described in the present embodiment. In this case, the data value of the sampled signal-under-test is alternately inverted for each time interval on the bases of the intermediate level of the signal-under-test as described above. That is, the odd-numbered or the even-numbered data value is inverted. For example, the data values of the sampled signal-under-test are inverted one by one.

In the same way, the logical values of the sampled signal-under-test may be alternately inverted for each bit time interval. That is, the logical values of the samples signal-under-test may be inverted one by one.

The inversion of the logical value may be a processing to convert the logic value H to the logic value L and convert the logic value L to the logic value H. Meanwhile, the inversion of the data value may be a processing to invert the level of the signal-under-test, such as the voltage value on the basis of the intermediate level of the signal-under-test, such as zero voltage.

FIG. 35 shows an example of configuration of the digital signal processing section 60. The digital signal processing section 60 may perform at least a part of function of each component shown in FIG. 35. For example, the digital signal processing section 60 may be an electric computer. In this case, a program that causes the electronic computer to function as the digital signal processing section 60 described later in FIG. 35 is loaded onto the electronic computer.

The digital signal processing section 60 includes a code control section 610, an waveform calculating section 622, a spectrum calculating section 624, and analytic signal calculating section 626, an instantaneous phase calculating section 628, and instantaneous phase noise calculating section 630 and a jitter calculating section 632.

The code control section 610 inverts the data value of either the odd-numbered data series or the even-numbered data series among the data series of the signal-under-test stored in the capture memory 40. The code control section 610 may multiply the data series stored in the capture memory 40 by cos (πk).

The waveform calculating section 622 calculates the waveform of the signal-under-test based on the data series outputted by the code control section 610. The spectrum calculating section 624 Fourier-transforms the data value outputted by the code control section 610 and calculates the spectrum of the signal-under-test.

As described above, the spectrum calculating section 624 may calculate the spectrum of the signal-under-test by performing the Fourier transforms on the data value of the data series stored in the capture memory 40 without inverting the same. The waveform calculating section 622 may shift by π the frequency of the spectrum obtained by performing the Fourier-transform on the same. At this time, the digital signal processing section 60 may have the code control section 610. When the digital signal processing section 60 does not have the code control section 610, the waveform calculating section 622 may calculate the waveform of the signal-under-test by performing the inverse Fourier transform on the spectrum calculated by the spectrum calculating section 624.

The analytic signal calculating section 626 calculates the analytic signal of the signal-under-test based on the frequency components around any peak included in the spectrum calculated by the spectrum calculating section 624. That is, the analytic signal calculating section 626 extracts the frequency components within a predetermined bandwidth including any peak of the spectrum and calculates the analytic signal of the signal-under-test. The bandwidth may be previously provided in accordance with jitter frequency to be measured. Additionally, and appropriate frequency range for which the spectrum is extracted may be previously provided by such as a user.

Then, the analytic signal generating section 626 may extract the frequency components around a peak having the maximum power among peaks included in the spectrum as shown in the circles of the right figures of FIG. 34B and FIG. 34C and calculate the analytic signal of the signal-under-test. Additionally, the analytic signal generating section 626 may calculate the analytic signal of the signal-under-test by performing the inverse Fourier transform on the extracted frequency components.

The instantaneous phase calculate section 628 calculates the instantaneous phase of the signal-under-test based on the analytic signal calculated by the analytic signal calculating section 626. The instantaneous phase calculating section 628 may calculate the instantaneous phase of the signal-under-test by a method the same as the method by the instantaneous phase estimating section 66 described with reference to FIG. 5A.

The instantaneous phase noise calculating section 630 calculating the instantaneous phase noise of the signal-under-test based on the instantaneous phase of the signal-under-test calculated by the instantaneous phase calculated section 628. The instantaneous phase noise calculating section 630 may calculate the instantaneous phase noise by a method the same as that shown in FIG. 6A.

The jitter calculating section 632 calculates jitter in the signal-under-test based on the instantaneous phase noise calculated by the instantaneous phase noise calculating section 630. For example, the jitter calculating section 632 may calculate timing jitter for each edge of the signal-under-test by resampling the instantaneous phase noise at an edge timing of the signal-under-test. Here, the edge timing of the signal-under-test may be a timing at which the waveform of the signal-under-test crosses the zero level. The jitter calculating section 632 may include a zero-crossing sampler that resamples the instantaneous phase noise. Additionally, the jitter calculating section 632 may calculate periodic jitter in the signal-under-test based on the timing jitter and also may calculate peak-to-peak jitter in the signal-under-test.

For example, the jitter calculating section 632 may calculate periodic jitter in the signal-under-test by calculating the difference between adjacent cycles of the signal-under-test for timing jitter for each leading edge of ht signal-under-test. Additionally, the jitter calculating section 632 may calculate peak-to-peak jitter by calculating the difference between the maximum value and the minimum value for the timing jitter for each leading edge of the signal-under-test.

The judging section 70 may judge the pass/fail result for the device under test 200 based on at least one of the waveform, the spectrum, the instantaneous phase, the instantaneous phase noise and the jitter of the signal-under-test calculated by the digital processing section 60. For example, the judging section 70 may judges the pass/fail result for the device under test 200 based on whether the jitter value of the signal-under-test is fallen within a predetermined range.

FIG. 36 is a flowchart showing an operation from the spectrum calculating section 624 to the instantaneous phase noise calculating section 630. Firstly, average frequency $f_0$ of the signal-under-test is calculated in S1002. The average frequency $f_0$ of the signal-under-test may be calculated by any block from the spectrum calculating section 624 to the instantaneous phase noise calculating section 630. Additionally, the average frequency $f_0$ of the signal-under-test may calculate from the reciprocal number of a value twice as large as the average period Tb of the signal-under-test. The average period Tb may be the period T of a timing signal provided to such as the driver 69 shown in FIG. 27.

Next, the spectrum calculating section 624 calculates the spectrum $S_a(f)$ of the signal-under-test by performing the Fourier-transform on the data $x_a(t)$ of the signal-under-test stored in the capture memory 40 in S1004. Here, the spectrum calculating section 624 may perform the Fourier transform on the data $x_a(t)$ corresponding to integral multiple of the period of the signal-under-test, for example. That is, the spectrum calculating section 624 may retrieve data from the capture memory 40 such that the data $x_a(t)$ is wrapped around at the both ends of the capture memory. In this case, data equivalent to the data obtained by multiplying the data stored in the capture memory 40 by windowing function Rect(t) of a rectangular having a duration being integral multiple of the period of the signal-under-test. By such processing, such as the spectrum as shown in FIG. 20A can be obtained.

Next, the analytic signal calculating section 626 calculates analytic signal $z_a(t)$ of the signal-under-test from the spectrum $S_a(f)$ of the signal-under-test in S1006. For example, the analytic signal calculating section 626 obtains the analytic signal $z_a(t)$ as shown in FIG. 21A by extracting a predetermined frequency components of the spectrum Sa(f) of the signal-under-test $z_a(t)$ and perform the inverse Fourier transform on the same as shown in FIG. 20B.

Next, the instantaneous phase calculating section 628 calculates instantaneous phase $\phi(t)$ of the signal-under-test from the analytic signal $z_a(t)$ of the signal-under-test. For example the instantaneous phase calculating section 628 calculates arc tangent ARG($z_a(t)$) of the real part component and the imaginary part component of the analytic signal $z_a(t)$ as described in FIG. 21B. Here, since ARG($z_a(t)$) is defined over the range from $-\pi$ to $\pi$, a value $\pi$ is followed by $-90$ , therefore, the waveform has discontinuous points. Thus, the instantaneous phase calculating section 628 obtains a continuous linear phase by removing the discontinuous phases from ARG($z_a(t)$) by means of a phase unwrapping by sequentially adding $2\pi$ to the discontinuous phases ARG($z_a(t)$).

Next, the instantaneous phase noise calculating section 630 calculates instantaneous phase noise $\Delta\phi(t)$ of the signal-under-test from instantaneous phase $\phi(t)$ of the signal-under-test in S1010. For example, the instantaneous phase noise calculating section 630 calculates the instantaneous phase noise $\Delta\phi(t)$ by subtracting linear component $2\pi f_{beat}+\phi_0$ from the instantaneous phase $\phi(t)$ as described in FIG. 21B. Here, the $f_{beat}$ is a frequency for equivalently sampling the signal-under-test with the cycle resolution ($\Delta$). For example, the $f_{beat}$ may be indicated by the following expression.

$$f_{beat} = \frac{1}{T} - \frac{1}{2(T+\Delta)}$$

Here, $\phi_0$ is the initial angle of the instantaneous phase $\phi(t)$.

The instantaneous phase noise calculating section 630 may calculate the $f_{beat}$ from the period T and the cycle resolution ($\Delta$) of the signal-under-test and subtract the linear component $2\pi f_{beat}+\phi_0$ from the instantaneous phase $\phi(t)$. Additionally, the instantaneous phase noise calculating section 630 may calculate an approximation straight line of the instantaneous phase $\phi(t)$ by a least squares method and subtract the approximation straight line from the instantaneous phase $\phi(t)$.

Next, the instantaneous phase noise calculating section 630 coverts the instantaneous phase noise $\Delta\phi(t)$ in radian unit to the instantaneous phase noise $\Delta\phi(t)$ in time unit in S1012. For example, the instantaneous phase noise calculating section 630 may calculate the instantaneous phase noise $\Delta 100$ (t) in time unit by dividing the instantaneous phase noise $\Delta\phi(t)$ in radian unit by $2\pi f_0$. Here, $f_0$ is the average frequency of the signal-under-test calculated in S1002.

By such processing, the instantaneous phase noise of the signal-under-test can be calculated.

FIG. 37 shows an example of operation of the testing apparatus 100 using the measuring apparatus 10 that measures the bit error rate of the signal-under-test. The measuring apparatus 10 according to the present embodiment generates a comparison result indicating whether the logical value for each bit of the signal-under-test is corresponding to a predetermined expected value.

The measuring apparatus 10 may set an expected value corresponding to either the odd-numbered data or the even numbered data of the data series of the signal-under-test by inverting the expected value corresponding to the adjacent data instead of the above-described processing to invert the data values of the data series of the signal-under-test. For example, when there may be two logical values as the expected value, the logical value different from the adjacent expected value may be set. By such processing, the result by comparing between the logical value for each bit of the signal-under-test and the predetermined expected value is corresponding to the data series shown in the left figures of FIG. 33C and FIG. 34C.

FIG. 38 shows and example of series of comparison results obtained by the processing described in FIG. 37. As shown in FIG. 38A, the measuring apparatus 10 alternately inverts the expected value (expected logical value) foe each bit time interval and compares the same with the logical value of the signal-under-test. For example, the measuring apparatus 10 inverts the expected values one by one.

Thus, as shown in FIG. 38B, a comparison result series the same as the data series shown in the left figure of FIG. 34C can be obtained. Here, the comparison result of a case that the logical value of the signal-under-test is corresponding to the expected value is indicated by logical value 1, alternatively the comparison result of a case that the logical value of the signal-under-test is not corresponding to the expected value is indicated by logical value −1 in the present embodiment.

The waveform, the spectrum and the jitter of the signal-under-test described in FIG. 35 can be calculated based on the comparison result series shown in FIG. 38B. Additionally, the measuring apparatus 10 may calculate the comparison result series shown in FIG. 38B. Additionally, the measuring apparatus 10 may calculate the comparison result series not by inverting the expected value but by fixing the expected value to the logical value H. At this time, the comparison result series is equivalent to the data series shown in the left figure of FIG. 34B. As described above, the measuring apparatus 10 may calculate the spectrum of the signal-under-test by shifting by π the frequency of the spectrum obtained by performing the Fourier transform on the comparison result series. Additionally, the measuring apparatus 10 may calculate jitter in the signal-under-test based on the frequency components around any peak of the spectrum obtained by performing the Fourier-transform on the comparison result series.

FIG. 39 shows an example of configuration of a code control section 610 when the measuring apparatus 10 that measures the bit error rate of the signal-under-test is used. As describe above, the code control section 610 obtains the comparison result series equivalent to the data series shown in the left figure of FIG. 34C by alternately inverting the expected values. The code control section 610 according to the present embodiment includes an expected value generating section 612 and a logical value comparison section 614.

The logical value comparison section 614 outputs a comparison result indicating whether each logical value of the signal-under-test detected by the level comparison section 520 is corresponding to a given expected value. The logical value comparison section 614 may include an exclusive OR circuit that outputs exclusive OR of the logical value of the signal-under-test and the expected value.

The expected value generating section 612 provides the expected value corresponding to odd-numbered or even-numbered data series among the data series of logical values of the signal-under-test by inverting the adjacent expected value.

Thus, the data series as shown in FIG. 34C which is obtained by sampling the signal-under-test with a high sampling rate by using the measuring apparatus 10 for measuring the bit error rate can be acquired.

The code control section 610 may further include a test result memory that stores therein the comparison result outputted by the logical comparison section 614. In this case, a circuit connected to the code control section 610 performs a signal processing based on the data series of the comparison result stored in the test result memory.

The testing apparatus 100 includes the capture memory 40 in FIG. 17, however, the testing apparatus 100 may not include the capture memory 40 in another embodiment. In this case, circuits directly or indirectly connected to the logical comparison section 614 operate on the signal-under-test in real time i.e. at the same rate as the receiving signal-under-test. Then, the comparison result by the logical comparison section 614 is stored in the test result memory. The circuits connected to the test result memory may operate on the signal-under-test in non-real time.

The testing apparatus 100 may split the logical value outputted by the comparator 20 and provide the same to the capture memory 40 and the logical comparison section 614. In this case, the output of the logical comparison section 614 is stored in the test result memory. Then, the discrete signal converting section 50 and the digital signal processing section 60 process the data stored in either the capture memory 40 or the test result memory. For example, processing the data stored in the test result memory, the discrete signal converting section 50 and the digital signal processing section 60 may perform the processing as described with reference to FIG. 37-FIG. 43.

FIG. 40 shows another configuration example of the level comparison section 520 and the code control section 610. FIG. 41 is a timing chart showing an example of operation of the level comparison section 520 and the code control section shown in FIG. 40. The expected value generating section 612 of the code control section 610 according to the present embodiment generates an expected value based on the signal-under-test.

As shown in FIG. 40, the level comparison section 520 includes a variable delay circuit 522, a flip flop 524 and a comparator 526. The comparator 526 outputs a result by comparing the signal-under-test with a present threshold value VOH. For example, the comparator 526 may output logic value H when the level of the signal-under-test is higher than the threshold value VOH and output logic value L when the level of the signal-under-test is lower than the threshold value VOH.

The variable delay circuit 522 adjusts the phase of the strobe outputted by the strobe timing generator 30. The variable delay circuit 522 may generated a constant delay in measuring. The flip flop 525 samples the logical value outputted by the comparator 526 in response to the strobe outputted by the variable delay circuit 522. Thereby the logical value of the signal-under-test can be sampled in accordance with the strobe.

Since the period of the strobe is larger than the period of the signal-under-test Tb by Δ, the flip flop 524 equivalently samples the signal-under-test at the sampling period Δ as shown in FIG. 41.

As shown in FIG. 40, the expected value generating section 612 includes a variable delay circuit 617, a flip flop 616 and a comparator 615. The comparator 615 output a result by comparing the signal-under test with the preset threshold value VOH. The threshold value set to the comparator 615 and threshold value set to the comparator 526 may be the same each other.

The flip flop 616 samples the output of the comparator 615 in accordance with the synchronizing signal provided through the variable delay circuit 617. The synchronizing signal has a period substantially the same as that of the signal-under-test.

The measuring apparatus 10 may have a circuit that generates a synchronizing signal. For example, the measuring apparatus 10 may have circuit that generate the synchronizing signal by using an oscillator circuit. Additionally, the measuring apparatus 10 may have a circuit that generate the synchronizing signal based on the signal-under-test. For example, the measuring apparatus 10 may have a clock recovering circuit that reproduce a clock synchronized with the signal-under-test by using such as a PLL circuit.

Additionally, as shown in FIG. 41, the variable delay circuit 617 delays the synchronizing signal such that the phase for each edge of the synchronizing signal is place at the substantially center of each bit time interval of the signal-under-test. That is, the flip flop 616 samples the logical value of the signal-under-test at the substantially center of the eye opening of the signal-under-test.

The logical comparison section 614 judges whether the logical value of the signal-under-test detected by the level comparison section 520 is corresponding to the logical value obtained by inverting the logical value of the signal-under-test detected by the expected value generating section 612 in the preceding cycle. That is, the logical comparison section 14 samples the state indicating whether the logical value is corresponding to the expected value by using the logical value of the signal-under-test detected by the expected value generating section 612 in the preceding cycle as the expected value.

As described above, the expected value generating section 612 sample the logical value of the signal-under-test at substantially the center of the eye opening of the signal-under-test. Therefore, even if relatively large jitter is injected into the signal-under-test, an appropriate logical value of the signal-under-test in the cycle can be accurately detected. Then, since the signal-under-test is a clock signal of which logical value is inverted for each cycle, the expected value generating section 612 inverts the logical value detected in the cycle, so that the inverted value can be used as the expected value for the succeeding cycle as shown in FIG. 41.

The logical comparison section 614 may invert the input from the expected value generating section 612 and receive the same. Additionally, as shown in FIG. 40, the exclusive OR of the output by the expected value generating section 612 and the output by the level comparison section 520 may be inverted and outputted.

Thus, the state of the signal-under-test can be measured with a simple configuration.

FIG. 42 is an example of the spectrum of the signal-under-test measured by using the measuring apparatus 10 for measuring the bit error rate. Here, the spectrum measured by changing the period difference Δ between the signal-under-test and the strobe in FIG. 42 to single, double, quadruple and octuple value. Additionally, the horizontal axis of FIG. 42 indicates an offset frequency from the carrier frequency. That is, the spectrum of FIG. 42 indicates the spectrum of the jitter components.

Even if the measuring apparatus for measuring the bit error rate is used, it can observe that jitter in the signal-under-test can be measured as shown in FIG. 42. Here, as described with reference to FIG. 23 and FIG. 24, if the period difference between the signal-under-test and the strobe is increased, the measurement resolution is increased, so that the measurement error is increased. If the period difference is octuple, and jitter is not detected in the present embodiment. Therefore, it is preferred that the period difference is more reduced.

FIG. 43 shows another example of operation of the testing apparatus 100 when the measuring apparatus 10 for measuring the bit error rate of the signal-under-test. The strobe timing generator 30 according to the present embodiment generates a strobe at a period 2T+Δ for the bit time interval T of the signal-under-test. For example, when the signal-under-test is a clock signal, the period of the signal-under-test is 2T. At this time, the strobe timing generator 30 generates the strobe at the period obtained by adding the predetermined cycle resolution Δ to the period of the signal-under-test.

The expected value generating section 612 may generating an expected value fixed to a predetermined logical value. As shown in FIG. 43A, the expected value generating section 612 may generate the expected value fixed to the logical value H, for example. By such processing, the comparison result series can be obtained as shown in FIG. 43B. The digital signal processing section 60 may calculate the waveform, the spectrum and the jitter of the signal-under-test based on the comparison result series as described with reference to FIG. 35.

Here, the above described period (2T+Δ) is twice as large as the bit time interval (T+Δ) described with reference to FIG. 38. In this case, the processing to invert the expected values for each bit time interval, i.e. one by one is performed twice for the period (2T+Δ). Therefore, in the case that the signal-under-test is sampled at the period (2T+Δ) as shown in FIG. 43, the processing without inverting the expected value is equivalent to the processing to invert the expected value described with reference to FIG. 38.

That is, when the signal-under-test is sampled at period ((2m−1)T+Δ), the above-described inverting is performed odd-numbered times for each sampling data, so that the processing to invert the expected values one by one is equivalent to the processing to invert the expected value described with reference to FIG. 38 (where, me is integer ≦1) Additionally, when the signal-under-test is sampled at period (2mT+Δ), the above-described inverting is performed even-numbered times, so that the processing without inverting the expected value is equivalent to the processing to invert the expected value described with reference to FIG. 38.

Here, it can say the same for the processing to invert the data values or the logical values of the sampled signal-under-test for each bit time interval described with reference to FIG. 33. That is, when the signal-under-test is sampled at the period ((2m−1)T+Δ), the above described inverting is performed on each sampling data odd-numbered times, so that the processing to invert the data values or the logical values one by one is equivalent to the processing to invert the data values or the logical values described with reference to FIG. 33 (where, m is integer≦1). Additionally, when the signal-under-test is sampled at the period (2mT+Δ), the above-described inverting is performed for each sampling data even numbered times, so that the processing without inverting the data values or the logical values is equivalent to the processing to invert the data values or the logical values described with reference to FIG. 33.

FIG. 44 shows another example of measuring apparatus 10. The measuring apparatus 10 according to the present embodiment further includes a function to measure the gain of the jitter transfer function between the input and the output of the device under test 200 in addition to the components of the measuring apparatus 10 described with reference to FIG. 31-FIG. 43.

The voltage comparator 520 according to the present embodiment measures a signal inputted to the device under test 200 and a signal corresponding to the input signal outputted from the device under test 200. The level comparison section 520 may measure the input signal and the output signal substantially at a time.

The strobe timing generator 30, the capture memory 40 and the digital signal processing section 60 may have the function and the configuration the same as those having the same reference numerals in FIG. 31-FIG. 43. Here, the capture memory 40 according to the present embodiment stores therein the data series of the input signal and the data series of the output signal, respectively.

Additionally, the digital signal processing section 60 calculates jitter for each of the input signal and the output signal base on the data series for each of the input signal and the output signal. The gain of the jitter transfer function between the input signal and the output signal of the device under test can be calculated based on the ratio between the jitter value of the input signal and the jitter value of the output signal.

FIG. 45 shows another example configuration of the digital signal processing section 60. The digital signal processing section 60 according to the present embodiment further include a gain calculating section 634 and a BER calculating section 636 in addition to the components of the digital signal processing section 60 described with reference to FIG. 35. The other components may have the functions the same as those having the same numeral reference shown in FIG. 35. Here, the digital signal processing section 60 according to the present embodiment may perform the processing described with reference to FIG. 35 on each of the data series of the input signal and the data series of the output signal of the device under test 200.

The gain calculating section 634 calculates the jitter gain of the device under test 200 based on the jitter in the input signal and jitter in the output signal calculated by the jitter calculating section 632, For example, the gain calculating section 634 may calculate the jitter gain of the device under test 200 based on the jitter ratio between the input signal and the output signal. Additionally, the gain calculating section 634 may calculate the jitter gain for each frequency component of sine wave jitter. In this case, the levels of the corresponding frequency components may be compared in the spectrum corresponding to jitter component for each of the input signal and the output signal calculated by the spectrum calculating section 624.

The BER calculating section 636 calculates the bit error rate of the device under test 200 based on the jitter gain calculated by the gain calculating section 634. The magnitude of jitter appeared in the output signal when a predetermined input signal is inputted to the signal-under-test is derived from the gain of the jitter transfer function, so that the bit error rate can be estimated. For example, the probability density function of the jitter amplitude of the input signal, and also jitter amplitude allowed by the receiving side of the output signal may be provided to the BER calculating section 636. The BER calculating section 636 may derive the probability density function of jitter in the output signal from the probability density function and the jitter gain of jitter in the input signal. Then, the BER calculating section 636 can calculate the bit error rate of the output signal by calculating the probability for which the jitter amplitude which is not allowed by the receiving side contained in the output signal.

Additionally, the digital signal processing section 60 may further include a deterministic skew calculating section that calculates the deterministic skew described with reference to FIG. 28 and FIG. 29. In this case, the level comparison section 520 includes a first comparator that detects the signal level of a first signal-under-test at the timing of a strobe in substantially synchronism with the first comparator as described above.

The analytic signal generating section 626 generates an analytic signal for each of the first signal-under-test and the second signal-under-test. The instantaneous phase calculating section 628 calculates the instantaneous phase for each of the first signal-under-test and the second signal-under-test.

The above-described deterministic skew calculating section calculates the deterministic skew between the first signal-under-test and the second signal-under-test based on the instantaneous phase for each of the signal-under-test calculated by the instantaneous phase calculating section 628.

The digital signal processing section 60 may further include the random skew described with reference to FIG. 28 and FIG. 29. In this case, the level comparison section 520, the analytic signal generating section 626 and the instantaneous phase calculating 628 perform processing the same as the processing to calculate the above-described deterministic skew.

The instantaneous phase noise calculating section 630 calculates the instantaneous phase noise for each of the first signal-under-test and the second signal-under-test. The above-described random skew calculating section calculates the random skew between the first signal-under-tests.

While the present invention has been described with the embodiment, the technical scope of the invention not limited to the above described embodiment. It is apparent to persons skilled in the art that various alternations and improvements can be added to the above-described embodiment. It is apparent from the scope of the claims that the embodiment added such alteration or improvement can be included in the technical scope of the invention.

For example, in the above embodiment, it has described that the strobe timing generator 30 sequentially generates strobes which are arranged at substantially even time intervals and each of which interval is larger than the bit time interval. However, the strobe timing generator 30 may sequentially generates strobes which are arranged at substantially even time intervals and each of which interval is smaller than the bit time interval. In this case, the digital signal processing section 60 may generate a data series including data which are arranged at substantially even time intervals and each of which interval is larger than the bit time interval by removing the sampled data or the result by comparing with the expected value. Thereby the processing the same as that described in the embodiment can be performed.

As evidenced by the above description, the jitter measurement of the device under test can be performed at low cost according to the present embodiment. Additionally, since the timing noise can be measured independent of the amplitude noise, the timing jitter can be accurately measured. Moreover, a measurement of jitter in a clock and data having the frequency higher than the maximum frequency of the strobe which can be generated by the strobe timing generator can be performed.

Particularly, the optimum period of a strobe (optimum cycle resolution) can be determined by the value twice as large as the standard deviation σ of jitter in the signal-under-test. Therefore, the jitter in the signal-under-test can be accurately measured without any signal having the same frequency as the frequency of the signal-under-test at the resolution of 1/1000.

Moreover, jitter can be measured without being limited to the edge type for jitter to be measured. For example, even if a plurality of adjacent impulses appear as shown in FIG. 34C, jitter can be measured. Additionally, jitter can be measured by not only probability density function PDF but also the time domain and the frequency domain.

Moreover, a jitter test can be performed by using the hardware configuration of the current testing apparatus. That is, jitter can be measured by comparing the sample value with the expected value without pattern-matching.

Moreover, jitter in the signal-under-test can be accurately measured without a calibration for matching the measurement value with the jitter. Further, jitter in the signal-under-test can be accurately measured without adjusting the offset time of the sampling timing.

What is claimed is:

1. A measuring apparatus that measures a signal-under-test having a signal level that changes at a predetermined bit time interval, comprising:
    a strobe timing generator that sequentially generates strobes arranged at substantially even time intervals;
    a level comparison section that detects the level of the signal-under-test at a timing at which each strobe is sequentially provided;
    a capture memory that stores therein the signal level outputted by the level comparison section; and
    a digital signal processing section that calculates a measurement result of the signal-under-test based on data series including data which have substantially even time intervals and each of which interval is larger than a bit time interval of the signal-under-test.

2. The measuring apparatus as set forth in claim 1, wherein the strobe timing generator sequentially generates strobes which are arranged at substantially even time intervals and each of which interval is larger than the bit time interval of the signal-under-test, and
    the digital signal processing section calculates the measurement result of the signal-under-test based on data stored in the capture memory.

3. The measuring apparatus as set forth in claim 2, wherein the digital signal processing section inverts a logical value of data corresponding to either the odd-numbered or the even-numbered data series among the data series stored in the capture memory.

4. The measuring apparatus as set forth in claim 2, wherein the digital signal processing section inverts a data value corresponding to either the odd-numbered or the even-numbered data series among the data series stored in the capture memory on the basis of the intermediate level of the signal-under-test.

5. The measuring apparatus as set forth in claim 2, wherein the digital signal processing section includes:
    a logical comparison section that outputs a comparison result indicating whether each logical value detected by the level comparison section is corresponding to an expected logical value ("expected value"); and
    an expected value generating section that inverts the expected value corresponding to the odd-numbered or the even-numbered series of the signal-under-tests and provides the same to the logical comparison section.

6. The measuring apparatus as set forth in claim 4, wherein the digital signal processing section further includes an waveform calculating section that calculates waveform of the signal-under-test based on the data series outputted by the code control section.

7. The measuring apparatus as set forth in claim 3, wherein the digital signal processing section further includes a spectrum calculating section that calculates the spectrum of the signal-under-test by perforating a Fourier transform on the data series outputted by the code control section.

8. The measuring apparatus as set forth in claim 7, wherein the digital signal processing section further includes an waveform calculating section that calculates waveform of the signal-under-test based on the spectrum of the signal-under-test calculated by the spectrum calculating section.

9. The measuring apparatus as set forth in claim 7, wherein the digital signal processing section further includes a jitter calculating section that calculates jitter in the signal-wader-test based on frequency components around any peak included in the spectrum calculated by the spectrum calculating section.

10. The measuring apparatus as set forth in claim 9, wherein the jitter calculating section calculates the jitter of the signal-under-test based on frequency components around a peak having the maximum power among peaks included in the spectrum.

11. The measuring apparatus as set forth in claim 9, wherein
    the jitter calculating section further calculates jitter in an input signal inputted to a device under test that outputs the signal-under-test in response to the input signal, and
    the digital signal processing section further includes a gain calculating section that calculates jitter gain of the device under test based on the jitter in the input signal and the jitter in the signal-under-test.

12. The measuring apparatus as set forth in claim 11, wherein the digital signal processing section further includes a BER calculating section that calculates bit error rate of the device under test.

13. The measuring apparatus as set forth in claim 7, wherein
    the digital signal processing section further includes:
    an analytic signal generating section that generates an analytic signal of the signal-under-test by converting the frequency components around any peak included in the spectrum calculated by the spectrum calculating section to a signal in the time domain; and
    an instantaneous phase calculating section that calculates an instantaneous phase of the signal-under-test based on the analytic signal.

14. The measuring apparatus as set forth in claim 13, wherein
    the digital signal processing section farther includes an instantaneous phase noise calculating section that calculates an instantaneous phase noise of the signal-under-test based on the instantaneous phase of the signal-under-test calculated by the instantaneous phase calculating section.

15. The measuring apparatus as set forth in claim 14, wherein
    the digital signal processing section further includes a jitter calculating section that calculates jitter in the signal-under-test based on the instantaneous phase noise calculated by the instantaneous phase noise calculating section.

16. The measuring apparatus as set forth in claim 13, wherein
the level comparison section includes:
a first comparator that detects the signal level of a first signal-under-test at a timing of the strobe; and
a second comparator that detects the signal level of a second signal-under-test at a tinning of the strobe in substantially synchronism with the fast comparator,
the analytic signal generating section generates the analytic signal for each of the first signal-under-test and the second signal-under-test,
the instantaneous phase calculating section calculates the instantaneous phase for each of the first signal-under-test and the second signal-under-test, and
the digital signal processing section further includes a deterministic skew calculating section that calculates a deterministic skew between the first signal-under-test and the second signal-under-test based on each instantaneous phase.

17. The measuring apparatus as set forth in claim 14, wherein
the level comparison section includes:
a first comparator that detects the signal level of a first signal-under-test at a timing of the strobe; and
a second comparator that detects the signal level of a second signal-under-test at a timing of the strobe in substantially synchronism with the first comparator,
the analytic signal generating section generates the analytic signal for each of the fast signal-under-test and the second signal-under-test,
the instantaneous phase calculating section calculates the instantaneous phase for each of the first signal-under-test and the second signal-under-test,
the instantaneous phase noise calculating section calculates the instantaneous phase noise for each of the first signal-under-test and the second signal-under-test, and
the digital signal processing section further includes a random skew calculating section that calculates a random skew between the first signal-under-test and the second signal-under-test based on each instantaneous phase noise.

18. The measuring apparatus as set forth in claim 4, wherein the digital signal processing section further includes a spawn calculating section that calculates the spectrum of the signal-under-test by performing the Fourier-transform on data series outputted by the code control section.

19. The measuring apparatus as set forth in claim 18, wherein the digital signal processing section further includes a jitter calculating section that calculates jitter in the signal-wider-test based on frequency components around any peak included in the spectrum calculated by the spectrum calculating section.

20. The measuring apparatus as set forth in claim 5, wherein the digital signal processing section further includes a spectrum calculating section that calculates the spectrum of the signal-under-test by performing the Fourier transform on a series of the comparison result outputted by the logical comparison section.

21. The measuring apparatus as set forth in claim 20, wherein the digital signal processing section further includes a jitter calculating section that calculates jitter in the signal-under-test based on frequency components around any peak included in the spectrum calculated by the spectrum calculating section.

22. The measuring apparatus as set forth in claim 2, wherein the strobe timing generator sequentially outputs the strobes such that the difference between the period of the strobe and the period of the signal-under-test (hereinafter referred to as a cycle resolution) is a value corresponding to a time resolution for measuring the signal-under-test.

23. The measuring apparatus as set forth in claim 2, wherein the strobe timing generator sequentially outputs the strobes such that the difference between the period of the strobe and the period of the signal-under-test ("cycle resolution") is a value corresponding to the standard deviation of the probability density function of jitter in the signal-under-test.

24. The measuring apparatus as set forth in claim 23, wherein the strobe tuning generator sequentially outputs the strobes such that the cycle resolution is equal to a value twice as large as the standard deviation.

25. The measuring apparatus as set forth in claim 22, wherein the strobe timing generator sequentially outputs the strobes such that any of various periods can be set as a period for which the strobes are outputted and the period is set so as to be less than the time resolution for measuring the signal-under-test.

26. A measuring apparatus that measures a signal-under-test having a signal level that changes at a predetermined bit time interval, comprising:
a strobe timing generator that sequentially generates strobes which ale arranged at substantially even time intervals and each of which interval is smaller than the bit time interval of the signal-under-test;
a level comparison section that detects the level of the signal-under-test at a timing at which each strobe is sequentially provided;
a capture memory that stores therein the signal level outputted by the level comparison section; and
a digital signal processing section that calculates a measurement result of the signal-under-test based on data series stored in the capture memory.

27. The measuring apparatus as set forth in claim 26, wherein the strobe timing generator sequentially outputs the strobes at substantially even time intervals such that the difference between the period of the strobe and the period of the signal-under-test ("cycle resolution") is a value corresponding to the standard deviation of the probability density function of jitter in the signal-under-test.

28. The measuring apparatus as set forth in claim 27, wherein the strobe timing generator sequentially outputs the strobes at substantially even time intervals such that the cycle resolution is equal to a value twice as large as the standard deviation.

29. A testing apparatus that tests a device under test, comprising:
a measuring apparatus that measures a signal-under-test outputted by the device under test; and
a judging section that judges the pass/fail result for the device under test based on the signal-under-test measured by the measuring apparatus,
the measuring apparatus including:
a strobe timing generator that sequentially generates strobes arranged at substantially even time intervals;
a level comparison section that detects the level of the signal-under-test at a timing at which each strobe is sequentially provided;
a capture memory that stores therein the signal level outputted by the level comparison section; and
a digital signal processing section that calculates a measurement result of the signal-under-test based on data series including data which have substantially even time intervals and each of which interval is larger than a bit time interval of the signal-under-test.

30. The testing apparatus as set forth in claim 29, wherein
the strobe timing generator sequentially generates strobes which are arranged at substantially even time intervals and each of which interval is larger than the bit time interval of the signal-under-test, and
the digital signal processing section calculates the measurement result of the signal-under-test based on the data stored in the capture memory.

31. A testing apparatus that tests a device under test, comprising:
a measuring apparatus that measures a signal-under-test outputted by the device under test; and
a judging section that judges the pass/fail result for the device under test based on the signal-under-test measured by the measuring apparatus,
the measuring apparatus including:
a strobe timing generator that sequentially generates strobes which are arranged at substantially even time intervals and each of which interval is smaller than the bit time interval of the signal-wader-test;
a level comparison section that detects the level of the signal-under-test at a timing at which each strobe is sequentially provided;
a capture memory that stores therein the signal level outputted by the level comparison section; and
a digital signal processing section that calculates a measurement result of the signal-under-test based on the data series stored in the capture memory.

32. An electronic device comprising:
an operating circuit that generates a signal-under-test; and
a measuring apparatus that measures the signal-under-test, the measuring apparatus including:
a strobe timing generator that sequentially generates strobes which are arranged at substantially even time intervals and each of which interval is larger than a bit time interval of the signal-under-test;
a level comparison section that detects the level of the signal-under-test at a timing at which each strobe is sequentially provided; and
a capture memory that stores therein the signal level outputted by the level comparison section.

33. The electronic device as set forth in claim 32, wherein
the measuring apparatus further includes a logical comparison section that outputs a comparison result indicating whether each logical value detected by the level comparison section is corresponding to an expected value, and
the capture memory stores the comparison result outputted by the logical comparison section instead of the signal level outputted by the level comparison section.

34. The electronic device as set forth in claim 33, wherein the measuring apparatus further includes an expected value generating section that inverts the expected logical value corresponding to either the odd-numbered or the even-numbered series of the signal-under-tests and provides the same to the logical comparison section.

35. The electronic device as set forth in claim 33, wherein the measuring apparatus further includes an expected value generating section that generates the expected value based on the signal-under-test.

36. The electronic device as set forth in claim 32, wherein the measuring apparatus further includes a digital signal processing section that calculates the measurement result of the signal-under-test based on the data series stored in the capture memory.

37. An electronic device comprising:
an operating circuit that generates a signal-under-test; and
a measuring apparatus that measures the signal-under-test the measuring apparatus including:
a strobe timing generator that sequentially generates strobes arranged at substantially even time intervals;
a level comparison section that detects the level of the signal-under-test at a timing at which each strobe is sequentially provided;
a capture memory that stores therein the signal level outputted by the level comparison section; and
a digital signal processing section that calculates a measurement result of the signal-under-test based on data series including data which have substantially even time intervals and each of which interval is larger than the bit time interval of the signal-under-test.

38. An electronic device comprising:
an operating circuit that generates a signal-under-test; and
a measuring apparatus that measures the signal-under-test, the measuring apparatus including:
a strobe timing generator that sequentially generates strobes which are arranged at substantially even time intervals and each of which interval is smaller than the bit time interval of the signal-under-test;
a level comparison section that detects the level of the signal-under-test at a timing at which each strobe is sequentially provided; and
a capture memory that stores therein the signal level outputted by the level comparison section.

39. A measuring apparatus that measures a signal-under-test having a signal level that changes at a predetermined bit time interval, comprising:
a strobe timing generator that sequentially generates strobes arranged at substantially even time intervals;
a level comparison section that detects the level of the signal-under-test at a timing at which each strobe is sequentially provided;
a logical comparison section that outputs a comparison result indicating whether each logical value detected by the level comparison section is corresponding to an expected logical value;
a memory that stores therein the comparison result outputted by the logical comparison section; and
a digital signal processing section that calculates a measurement result of the signal-under-test based on data series including data which have substantially even time intervals and each of which interval is larger than a bit time interval of the signal-under-test among the data stored in the memory.

40. The measuring apparatus as set forth in claim 39, wherein
the strobe timing generator sequentially generates strobes which are substantially even time intervals and each of which interval is larger than a bit time interval of the signal-under-test, and
the digital signal processing section calculates the measurement result of the signal-under-test based on the data stored in the capture memory.

41. The measuring apparatus as set forth in claim 40 further comprising a capture memory that stores therein the signal level outputted by the level comparison section.

42. The measuring apparatus as set forth in claim 41, wherein the logical comparison section compares the logical value stored in the capture memory with an expected logical value in asynchronous with the signal-under-test.

43. The measuring apparatus as set forth in claim 40 further comprising an expected value generating section that generates the expected logical value based on the signal-under-test and provides the same to the logical comparison section.

44. The measuring apparatus as set forth in claim 43, wherein
the expected value generating section detects the logical value of the signal-under-test for each cycle of the signal-under-test, and
the logical comparison section outputs the comparison result indicating whether the logical value detected by the level comparison section is corresponding to a logical value obtained by inventing the logical value detected by the expected value generating section for the preceding cycle.

45. The measuring apparatus as set forth in claim 44, wherein the expected value generating section detects the logical value at substantially the center of the bit time interval for each cycle of the signal-under-test.

46. An electronic device comprising:
an operating circuit that generates a signal-under-test; and
a measuring apparatus that measures the signal-under-test, the measuring apparatus including:
a strobe timing generator that sequentially generates strobes arranged at substantially even time intervals;
a level comparison section that detects the level of the signal-under-test at a timing at which each strobe is sequentially provided;
a logical comparison section that outputs a comparison result indicating whether each logical value detected by the level comparison section is corresponding to an expected logical value;
a memory that stores therein the comparison insult outputted by the logical comparison section; and
a digital signal processing section that calculates a measurement result of the signal-under-test based on data series including data which have substantially even time intervals and each of which interval is larger than a bit time interval of the signal-ruder-test among the data stored in the memory.

47. The electronic device as set forth in claim 46, wherein
the strobe timing generator sequentially generates strobes which are arranged at substantially even time intervals and each of which interval is larger than a bit time interval of the signal-under-test,
the digital signal processing section calculates the measurement result of the signal-under-test based on the data stored in the capture memory.

48. A measuring apparatus that measures a signal-under-test having a signal level that changes at a predetermined bit time interval, comprising:
a strobe timing generator that sequentially generates strobes arranged at substantially even time intervals;
a level comparison section that detects the level of the signal-under-test at a timing at which each strobe is sequentially provided;
a capture memory that stores therein the signal level outputted by the level comparison section; and
a digital signal processing section that calculates a comparison result indicating whether each logical value of data series including data which have substantially even time intervals and each of which interval is larger than a bit time interval of the signal-under-test is corresponding to an expected logical value and calculates a measurement result of the signal-under-test based on the comparison result.

49. The measuring apparatus as set forth in claim 48, wherein
the strobe timing generator sequentially generates strobes which are arranged at substantially even time intervals and each of which interval is larger than a bit time interval of the signal-under-test,
the digital signal processing section calculates the comparison result indicating whether the logical value for each data stored in the capture memory is corresponding to the expected logical value.

50. The measuring apparatus as set forth in claim 49, wherein the digital signal processing section includes a test result memory that stores therein the comparison result.

51. A testing apparatus that tests a device under test, comprising:
a measuring apparatus that measures a signal-under-test outputted by the device under test; and
a judging section that judges the pass/fail result for the device under test based on the signal-under-test measured by the measuring apparatus ,
the measuring apparatus including:
a strobe timing generator that sequentially generates strobes arranged at substantially even time intervals;
a level comparison section that detects the level of the signal-under-test at a timing at which each strobe is sequentially provided;
a capture memory that stores therein the signal level outputted by the level comparison section; and
a digital signal processing section that calculates a comparison result indicating whether each logical value of data series including data which have substantially even time intervals and each of which interval is larger than a bit time interval of the signal-under-test is corresponding to an expected logical value and calculates a measurement result of the signal-under-test based on the comparison result.

52. The testing apparatus as set forth in claim 51, wherein
the strobe timing generator sequentially generates strobes which are arranged at substantially even time intervals and each of which interval is larger than the bit time interval of the signal-under-test, and
the digital signal processing section calculates the comparison result indicating whether the logical value for each data stored in the capture memory is corresponding to the expected logical value.

53. An electronic device comprising:
an operating circuit that generates a signal-under-test; and
a measuring apparatus that measures the signal-under-test, the measuring apparatus including:
a strobe timing generator that sequentially generates strobes arranged at substantially even time intervals;
a level comparison section that detects the level of the signal-under-test at a timing at which each strobe is sequentially provided;
a capture memory that stores therein the signal level outputted by the level comparison section; and
a digital signal processing section that calculates a comparison result indicating whether each logical value of data series including data which have substantially even time intervals and each of which interval is larger than a bit time interval of the signal-under-test is corresponding to an expected logical value and calculates a measurement result of the signal-under-test based on the comparison result.

54. The electronic device as set forth in claim 53, wherein the strobe timing generator sequentially generates strobes which are arranged at substantially even time intervals and each of which interval is larger than the bit time interval of the signal-under-test, and the digital signal processing section calculates the comparison result indicating whether the logical value for each data stored in the capture memory is corresponding to the expected logical value.

* * * * *